United States Patent
Chen et al.

(10) Patent No.: US 11,159,126 B2
(45) Date of Patent: Oct. 26, 2021

(54) SUB-HARMONIC SWITCHING POWER AMPLIFIER

(71) Applicant: UNIVERSITY OF SOUTHERN CALIFORNIA, Los Angeles, CA (US)

(72) Inventors: Shuo-Wei Chen, Los Angeles, CA (US); Aoyang Zhang, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 64 days.

(21) Appl. No.: 16/793,412

(22) Filed: Feb. 18, 2020

(65) Prior Publication Data

US 2020/0266768 A1   Aug. 20, 2020

Related U.S. Application Data

(60) Provisional application No. 62/806,884, filed on Feb. 17, 2019.

(51) Int. Cl.
  *H03F 1/02* (2006.01)
  *H03F 3/193* (2006.01)
  *H03F 3/217* (2006.01)

(52) U.S. Cl.
  CPC ......... *H03F 1/0288* (2013.01); *H03F 1/0277* (2013.01); *H03F 3/193* (2013.01); *H03F 3/2171* (2013.01)

(58) Field of Classification Search
  CPC ...... H03F 1/0288; H03F 1/0277; H03F 3/193; H03F 3/2171
  USPC ........................................................ 330/277
  See application file for complete search history.

(56) References Cited

U.S. PATENT DOCUMENTS

| 2009/0189697 A1* | 7/2009 | Zafonte .................. H03L 7/099 330/305 |
| 2012/0154054 A1* | 6/2012 | Kaczman ................ H03F 3/211 330/295 |
| 2012/0235742 A1* | 9/2012 | Bostrom ................. H03F 3/217 330/207 A |

OTHER PUBLICATIONS

Zhang, A., "Silicon-Based RF/MM-Wave Power Amplifiers and Transmitters for Future Energy Efficient Communication Systems", Doctor of Philosophy Thesis (Electrical Engineering), Dec. 2020, University of Southern California. (Year: 2020).*
Zhang, A. et al., "A Sub-Harmonic Switching Digital Power Amplifier with Hybrid Class-G Operation for Enhancing Power Back-Off Efficiency," 2018 Symposium on VLSI Circuits Digest of Technical Papers, pp. 213-214.
Zhang, A. et al., "A Subharmonic Switching Digital Power Amplifier for Power Back-Off Efficiency Enhancement," IEEE. J. of Solid-State Circuits, v. 54, n. 4, (2019), pp. 1017-1028.

(Continued)

*Primary Examiner* — Hafizur Rahman
(74) *Attorney, Agent, or Firm* — Brooks Kushman P.C.

(57) ABSTRACT

A subharmonic switching digital power amplifier system includes a power amplifier core that includes at least one power amplifier operable in a power back-off region and a power supply providing at least one operating voltage to the power amplifier. Characteristically, the power amplifier is toggled at a subharmonic component of a carrier frequency (Fc) to achieve power back-off wherein the power amplifier is operated in a voltage mode or current mode driver. Multi-subharmonics can be used to further enhance the power back-off efficiency. A switching digital power amplifier system employing phase interleaving is also provided.

29 Claims, 49 Drawing Sheets

(56) References Cited

OTHER PUBLICATIONS

Zhang, A. et al., "A Watt-Level Phase-Interleaved Multi-Subharmonic Switching Digital Power Amplifier Achieving 31.4% Average Drain Efficiency," 2019 IEEE International Solid-State Circuits Conference, pp. 74-76.
Zhang, A. et al., "A Watt-Level Phase-Interleaved Multi-Subharmonic Switching Digital Power Amplifier," IEEE Journal of Solid-State Circuits, v. 54, n. 12, 2019, pp. 3452-3465.

* cited by examiner (a)

| | Freq. (GHz) | Max $P_{out}$ (dBm) | Peak DE(%) | -3.8dB DE(%) | -9.8dB DE(%) | -13dB DE(%) | PAPR (dB) | Average DE(%) | EVM (dB) | Tech (nm) | Matching Network | Technique |
|---|---|---|---|---|---|---|---|---|---|---|---|---|
| [3] | 2.15 | 24.3 | 43.5† | 38.5† | 24.5† | 15.5† | 7.5 | 33† | -30.8 | 65 | Off-Chip | Class-G |
| [10] | 3.71 | 26.7 | 40.2 | 32.5 | 31.5 | 24 | 5.4 | 28.8 | -24 | 65 | On-Chip | Doherty/Class-G |
| [11] | 2.48 | 30.5 | 34 | 28 | 17 | 10 | 9 | NA | -20 | 65 | On-Chip | Doherty |
| [13] | 2.4 | 27.7 | 45.1† | 39† | 24† | 20† | 7.5 | 27.6† | -31.4 | 65 | Off-Chip | AMO |
| [17] | 2.7 | 25.3 | 45† | 27† | 21† | 13.5† | 6.5 | 24.5† | -28 | 65 | On-Chip | Load Modulation |
| [2] | 3.5 | 25.1 | 30.4 | 26 | 19 | 16.5 | 6.1 | 24 | -35 | 45 | On-Chip | Class-G/Doherty |
| [27] | 2.45 | 28.2 | 39 | 33 | 18 | 12.5 | 5.7 | 30 | -25 | 28 | On-Chip | Polar/PWM |
| This PA | 2.25 | 26.8 | 49.3 | 44.2 | 29.1 | 27 | 7.2 | 38.7 | -26 | 65 | Off-Chip | SHS/Hybrid Class-G |

†Reported power added efficiency (PAE)

SUB-HARMONIC SWITCHING POWER AMPLIFIER

CROSS-REFERENCE TO RELATED APPLICATIONS

This application claims the benefit of U.S. provisional application Ser. No. 62/806,884 filed Feb. 17, 2019, the disclosure of which is hereby incorporated in its entirety by reference herein.

STATEMENT REGARDING FEDERALLY SPONSORED RESEARCH OR DEVELOPMENT

The invention was made with Government support under Contract No. ECCS-1824442 awarded by the National Science Foundation (NSF). The Government has certain rights to the invention.

TECHNICAL FIELD

In at least one aspect, the present invention relates to power amplifiers with high power efficiency in the power back-off region.

BACKGROUND

With the trend of increasing data throughput, modern wireless communication systems prefer high-spectral-efficiency modulations, often leading to high peak-to-average-power ratios (PAPRs) for transmitted signals [1]-[2][3]. To amplify the large PAPR signals, power amplifiers (PAs) thus need to operate in the power back-off (PBO) region most of the time. Conventionally, PAs yield the highest efficiency at peak power, although efficiency dramatically degrades as the PA output power is scaled back. Addressing PA PBO efficiency is critical for achieving a high average power efficiency. Because the PA is the most power-hungry block in RF transceivers, high average power efficiency will lead to longer battery life for wireless communication systems [4]-[5][6][7].

To improve the average efficiency of the PA or transmitter, there exist well-known architectures or techniques. One useful architecture is the envelope-tracking PA [8], [9], where the envelope detector takes the envelope of the modulated signal and controls the supply modulator, while the supply modulator simultaneously changes the PA supply. An envelope-tracking PA can achieve a very high efficiency within the deep PBO region, although supply modulators with large bandwidths and dynamic ranges remain a design challenge. Another approach is the Doherty PA [10]-[11][12], which can provide additional efficiency peaks in the PBO region. This type of PA has wide bandwidth but requires a large area for the power combiner to be implemented. Outphasing-based PA is another popular architecture for enhancing PBO efficiency [13]-[14][15][16]. This has a larger bandwidth than that in the case with polar architecture, but to achieve good linearity, the mismatch of the two PAs must be dealt with. Another technique is called load modulation [17], [18]. Theoretically, the technique can always provide maximum efficiency at different output power levels by tuning the matching network, but creating a wideband tunable matching network remains very challenging.

Accordingly, there is a need for improved methods and systems for operating power amplifiers.

SUMMARY

In at least one aspect, an alternative way to maintain high power efficiency in the PBO region for a digital switching PA [19] is provided. In this regard it is first noted that the harmonics of the switching waveform have decreasing power magnitudes. As a result, if the switching PA is toggled at the subharmonic component of the carrier frequency, the output power can be lowered while reducing the toggling frequency. This unique property can be used to reduce the PA power loss (and hence higher power efficiency) in the PBO. This method is referred to as subharmonic switching (SHS), because the digital PA switches at a certain subharmonic frequency, depending on PBO depth.

In another aspect, a subharmonic switching digital power amplifier system includes a frequency divider and a multiplexer (MUX) to select the intended toggling frequency at the input of the digital PA as well as adding a notch in the matching network. The added area and power overhead are relatively small within the entire PA system, as is the case in our proof-of-concept silicon prototype. The added circuitry also has the advantage of not preventing wideband operation for the PA core. Note that, since the notch frequency of the matching network is fixed via surface-mount devices in this prototype, the maximal bandwidth for achieving high PBO efficiency is determined by the bandwidth of the notch provided by the matching network. Finally, we demonstrate in the prototype that SHS can be combined with other PBO techniques, such as class-G operation.

In another aspect, a subharmonic switching (SHS) digital power amplifier (PA) architecture that enhances power efficiency in the power back-off (PBO) region is provided. The proposed technique can be combined with class-G operation. By using either SHS or dual-power supply switching, it can provide several peak efficiency points, located at 0, −3.5, −9.5, and, −13 dB PBO. By judiciously choosing the optimal operation mode between SHS and dual supplies for each PA cell at different output power levels, we can further improve the efficiency between peaks. The SHS PA prototype is implemented with a switched-capacitor PA (SCPA) architecture in 65-nm CMOS to validate the effectiveness of the proposed technique, which achieves a 26.8 dBm peak output power with a 49.3% peak drain efficiency (DE) at 2.25 GHz and a 27% DE at −13 dB PBO. Furthermore, a multi-subharmonic switching (SHS) digital power amplifier (PA) architecture for enhancing power back-off (PBO) efficiency while achieving watt-level output power. The proposed phase-interleaved architecture provides the inherent cancellation of the subharmonic components in the PBO region, alleviating the burden of the matching network. The proposed multi-SHS scheme can be further combined with a class-G operation to create a greater number of efficiency peaks in the PBO region. A transformer-based, three-way power combiner and a triple-stacking class-D driver are utilized to obtain watt-level output power. The proof-of-concept PA prototype is implemented with a switched-capacitor PA (SCPA) architecture in 65-nm CMOS and achieved 30-dBm peak power at 1.9 GHz, with 45.9%/41.3%/35.3%/32.2%/24.2% drain efficiency located at 0-, −3.5-, −7.0-, −9.5-, and −12-dB PBO, respectively. The average efficiency was 31.4% in real-time operation with a 7.2-dB peak-to-average power ratio (PAPR) modulated signal.

In another aspect, a subharmonic switching digital power amplifier system includes a power amplifier core that includes at least one power amplifier that receives an input signal and is operable in a power back-off region and a power supply providing at least one operating voltage to the power amplifier. Characteristically, the power amplifier is toggled at a subharmonic component of a carrier frequency (Fc) to achieve power back-off wherein the power amplifier is operated in a voltage mode or current mode driver.

In another aspect, each of the subharmonic switching digital power amplifier systems set forth herein include a power combiner to combine the power from the power amplifiers while canceling the subharmonics.

BRIEF DESCRIPTION OF THE DRAWINGS

FIG. 9. SHS SCPA with hybrid class-G operation.

FIG. 23. Table 1: Comparison with other PBO Efficiency-Enhanced CMOS Digital PAs.

FIG. 48. Table II: Performance comparison with other CMOS PAs

DETAILED DESCRIPTION

Figure 1A:
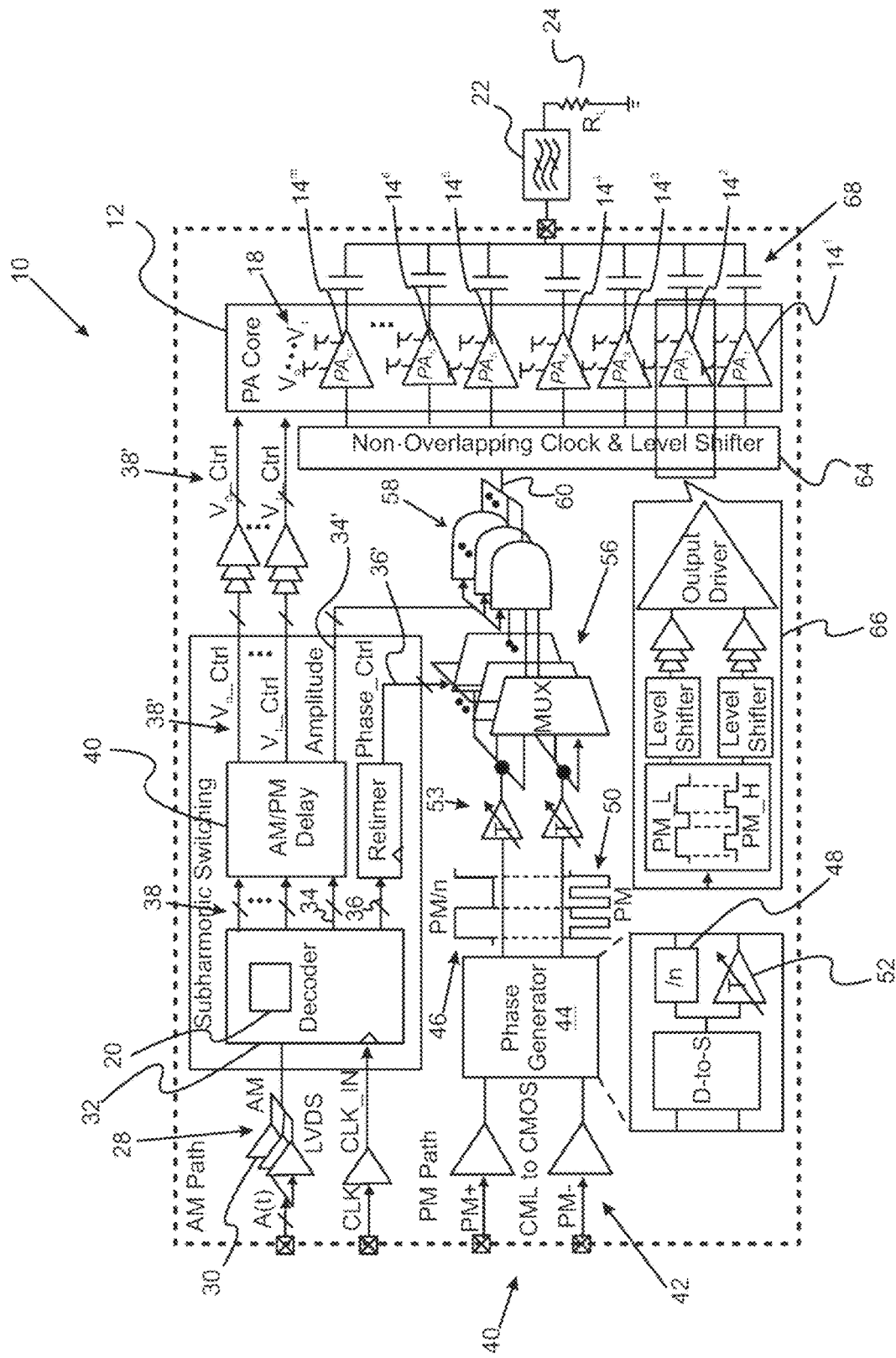
FIG. 1A. Schematic illustration of a subharmonic switching digital power amplifier system.

Reference will now be made in detail to presently preferred embodiments and methods of the present invention, which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

It should also be appreciated that integer ranges explicitly include all intervening integers. For example, the integer range 1-10 explicitly includes 1, 2, 3, 4, 5, 6, 7, 8, 9, and 10. Similarly, the range 1 to 100 includes 1, 2, 3, 4 . . . 97, 98, 99, 100. Similarly, when any range is called for, intervening numbers that are increments of the difference between the upper limit and the lower limit divided by 10 can be taken as alternative upper or lower limits. For example, if the range is 1.1. to 2.1 the following numbers 1.2, 1.3, 1.4, 1.5, 1.6, 1.7, 1.8, 1.9, and 2.0 can be selected as lower or upper limits.

In the examples set forth herein, concentrations, temperature, and reaction conditions (e.g., pressure, pH, flow rates, etc.) can be practiced with plus or minus 50 percent of the values indicated rounded to or truncated to two significant figures of the value provided in the examples. In a refinement, concentrations, temperature, and reaction conditions (e.g., pressure, pH, flow rates, etc.) can be practiced with plus or minus 30 percent of the values indicated rounded to or truncated to two significant figures of the value provided in the examples. In another refinement, concentrations, temperature, and reaction conditions (e.g., pressure, pH, flow rates, etc.) can be practiced with plus or minus 10 percent of the values indicated rounded to or truncated to two significant figures of the value provided in the examples.

For any device described herein, linear dimensions and angles can be constructed with plus or minus 50 percent of the values indicated rounded to or truncated to two significant figures of the value provided in the examples. In a refinement, linear dimensions and angles can be constructed with plus or minus 30 percent of the values indicated rounded to or truncated to two significant figures of the value provided in the examples. In another refinement, linear dimensions and angles can be constructed with plus or minus 10 percent of the values indicated rounded to or truncated to two significant figures of the value provided in the examples.

The term "connected to" means that the electrical components referred to as connected to are in electrical communication. In a refinement, "connected to" means that the electrical components referred to as connected to are directly wired to each other. In another refinement, "connected to" means that the electrical components communicate wirelessly or by a combination of wired and wirelessly connected components. In another refinement, "connected to" means that one or more additional electrical components are interposed between the electrical components referred to as connected to with an electrical signal from an originating component being processed (e.g., filtered, amplified, modulated, rectified, attenuated, summed, subtracted, etc.) before being received to the component connected thereto.

The term "electrical communication" means that an electrical signal is either directly or indirectly sent from an originating electronic device to a receiving electrical device. Indirect electrical communication can involve processing of the electrical signal, including but not limited to, filtering of the signal, amplification of the signal, rectification of the signal, modulation of the signal, attenuation of the signal, adding of the signal with another signal, subtracting the signal from another signal, subtracting another signal from the signal, and the like. Electrical communication can be accomplished with wired components, wirelessly connected components, or a combination thereof.

The term "electrical signal" refers to the electrical output from an electronic device or the electrical input to an electronic device. The electrical signal is characterized by voltage and/or current. The electrical signal can be stationary with respect to time (e.g., a DC signal) or it can vary with respect to time.

The terms "DC signal" refer to electrical signals that do not materially vary with time over a predefined time interval. In this regard, the signal is DC over the predefined interval. "DC signal" includes DC outputs from electrical devices and DC inputs to devices.

The terms "AC signal" refer to electrical signals that vary with time over the predefined time interval set forth above for the DC signal. In this regard, the signal is AC over the predefined interval. "AC signal" includes AC outputs from electrical devices and AC inputs to devices.

The term "electronic component" refers is any physical entity in an electronic device or system used to affect electron states, electron flow, or the electric fields associated with the electrons. Examples of electronic components include, but are not limited to, capacitors, inductors, resistors, thyristors, diodes, transistors, etc. Electronic components can be passive or active.

The term "electronic device" or "system" refers to a physical entity formed from one or more electronic components to perform a predetermined function on an electrical signal.

It should be appreciated that in any figures for electronic devices, a series of electronic components connected by lines (e.g., wires) indicates that such electronic components are in electrical communication with each other. Moreover, when lines directed connect one electronic component to another, these electronic components can be connected to each other as defined above.

The term "one or more" means "at least one" and the term "at least one" means "one or more." The terms "one or more" and "at least one" include "plurality" as a subset.

Throughout this application, where publications are referenced, the disclosures of these publications in their entireties are hereby incorporated by reference into this application to more fully describe the state of the art to which this invention pertains.

Abbreviations

"AM" means amplitude modulation.
"CML" means current-mode logic.
"MUX" means multiplexer.
"PA" means power amplifiers.
"PAPR" means peak-to-average-power ratio.
"PBO" means power back-off.
"PM" means phase modulation.
"SCPA" means switched-capacitor PA.
"SHS" means subharmonic switching.

With reference to FIG. 1, a schematic of a subharmonic switching digital power amplifier system (the SHS system) is provided. The SHS system 10 includes a power amplifier core 12 that includes at least one power amplifier $14^1$ that receives an input signal (e.g., a digital signal) operable in a power back-off region. In a refinement, power amplifier core 12 includes a plurality of power amplifier(s) $14^1$ to $14^m$ operable in the power back-off region where m is an integer providing the number of power amplifiers. The integer m is typically 1 to 64. In a refinement, power amplifier(s) $14^1$ to $14^m$ are switchable power amplifiers. In a further refinement, power amplifier(s) $14^1$ to $14^m$ are CMOS power amplifiers. In still a further refinement, the power amplifiers can be made by GaN, SOI CMOS, SiGe, InP and other technologies. In still another refinement, power amplifier(s) $14^1$ to $14^m$ can be switched-capacitor RF power amplifiers. The power amplifier can be a switching power amplifier selected from Class-D, current mode Class-D, Class-E, Class-E/F, and Class-G power amplifiers. The SHS system also includes a power supply 18 providing at least one operating voltage to the power amplifier. Power amplifier(s) $14^1$ to $14^m$ are toggled at a subharmonic component of a carrier frequency (Fc) to achieve power back-off. In a refinement, the subharmonic component has a frequency Fc/n where n is an integer (e.g., n is 2, 3, 4, 5 . . . 10). In another refinement, the subharmonic component has a frequency that is a fraction of the carrier frequency (e.g. x/y where x and y are integers). In further refinements, power amplifier(s) $14^1$ to $14^m$ can be operated in voltage mode or current mode driver. In a refinement, multiple subharmonic frequencies are used for creating more efficiency peaks at power back-off.

In some variations, the SHS system further includes matching 22 in electrical communication with power amplifier(s) $14^1$ to $14^m$. In a refinement, matching network 22 provides notch filtering of subharmonic components. Load 24 is in electrical communication having load impedance $R_L$ is in electrical communication with matching network 22 and therefore power amplifier core 12.

In a variation, power amplifier(s) $14^1$ to $14^m$ can be combined with modulation of power supply 18. In this regard, poser supply 18 can provide multiple supply voltages $V_1$ to $V_o$ wherein o is the number of different voltages that can be supplied. In a refinement, o is 1, 2, 3, 4, . . . 10. For example, power supply 18 is a dual power supply that provides a first voltage $V_1$ and a second voltage $V_2$ such that power amplifier(s) $14^1$ to $14^m$ can be operated at either the first voltage $V_1$ or the second voltage $V_2$. The choice of supply voltage that is used is accordance with a predetermined PBO operation table 26 as set forth below in more detail.

As set forth above, power amplifier core 12 can include a plurality of power amplifier(s) $14^1$ to $14^m$. Characteristically, each power amplifier is toggled at a subharmonic component of a carrier frequency or the carrier frequency with at least one power amplifier being toggled the subharmonic component at least once power amplifier is toggled. During operation, the SHS system 10 receives a digital signal A(t) from receiver 28. In a refinement, receiver 28 can include a low-voltage differential signaling (LVDS) receiver 30. In some refinements, the SHS system further includes a digital decoder block 32 that generates control signals that include an amplitude control code 34, a phase control code 36, and supply-control codes 38 according to a predetermined power back-off operation table 26. Amplitude control code 34 and supply-control codes 38 are modified by AM/PM Delay block 40 to form modified amplitude control code 34' and supply-control codes 38'.

Control signals are then properly retimed and phase-aligned for subharmonic switching operation. A differential phase modulated (PM) signal 40 can be generated off-chip and passed through a CML-to-CMOS buffer 42. A phase generator 44 then creates a subharmonic PM signal 46 via divider block 48 and a delayed PM signal 50 via delay circuit 52. A phase detector and tunable delays 53 are implemented to ensure that these two signals are phase-aligned. A phase-control signal is retimed with the delayed PM signal to create a MUX control signal 36'. Therefore, some variations of the SHS system 10 include a high-speed MUX 56 that selects the desired switching frequency based on the phase-control signal. Next, AND gates 58 combine a selected PM signal and amplitude control code to provide an amplifier control code 60 that is provided to power amplifier driver 64. Inset 66 provides details of the power amplifier driver 64 which is explained below in more detail. In a refinement, FIG. 1A depicts a segmented capacitor bank 68 is in electrical communication with power amplifier(s) $14^1$ to $14^m$.

Figure 1B:
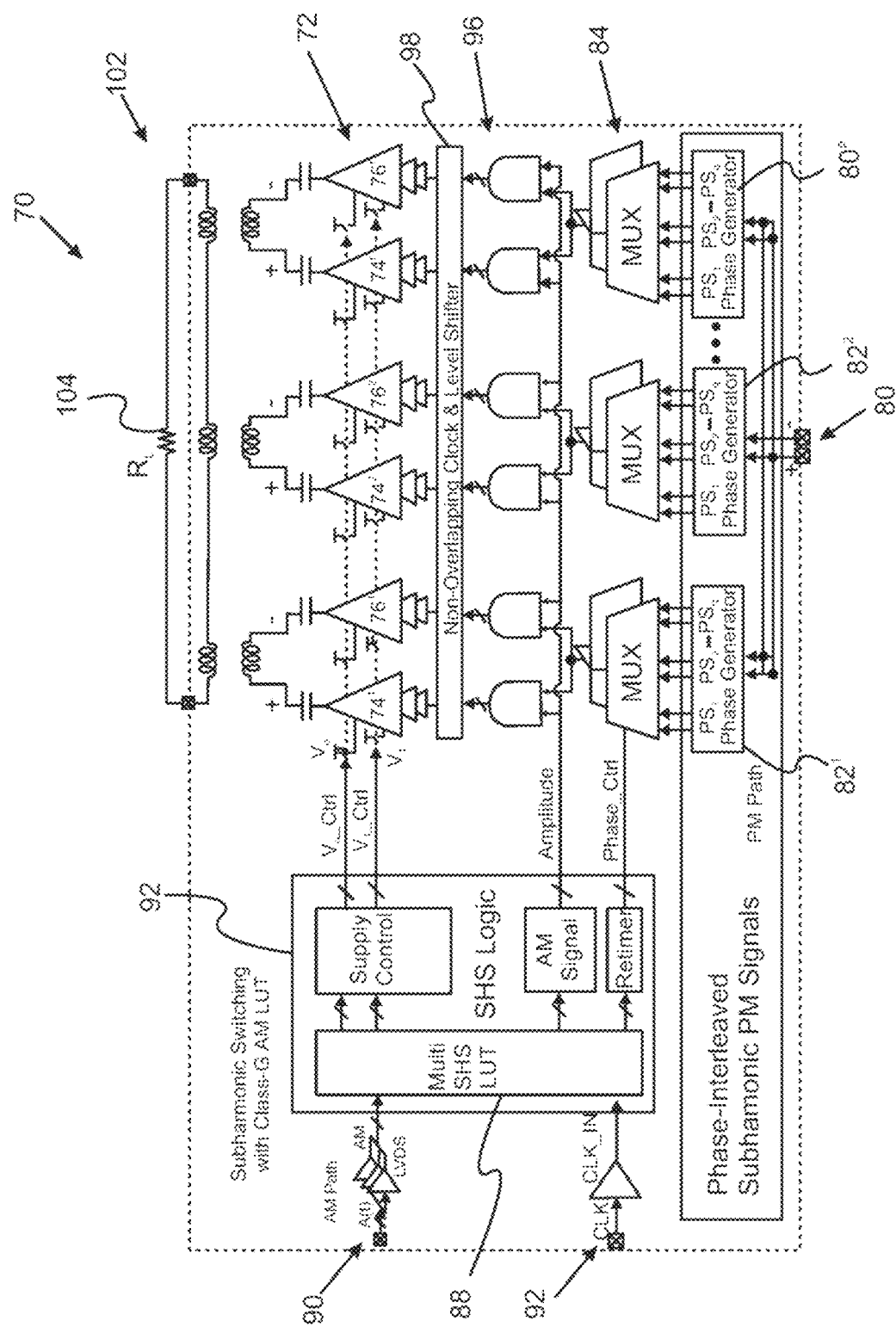
FIG. 1B. Schematic illustration of a subharmonic switching digital power amplifier system employing phase interleaving.

With reference to FIG. 1B, a schematic illustration of a subharmonic switching digital power amplifier system (the SHS system) employing phase interleaving is provided. In a refinement, SHS system 70 adopts the polar architecture. SHS system 70 includes an amplitude modulation (AM) path and phase modulation (PM) path. SHS system 70 includes power amplifier core 72 can include an array of power amplifier pair $74^r$ and $76^r$ with phases of digital input waveforms balanced in the power back-off region where r is an integer providing the total number of pairs (e.g., r is 2 to 10). In particular, phase interleaving is applied to the power amplifier channels to cancel the subharmonic components and hence relax the matching network requirement. Each power amplifier is toggled at a subharmonic component of a carrier frequency or the carrier frequency with at least one power amplifier being toggled the subharmonic component. As set forth above, the subharmonic component has a frequency Fc/n (where n is an integer as set forth above) and/or the subharmonic component has a frequency that is a fraction of the carrier frequency.

Still referring to FIG. 1B, differential PM signal 80 first passes through the current-mode logic (CML) buffers and then converted to a rail-to-rail CMOS-type PM signal. Then, the PM signal is distributed to a plurality of local phase generators $82^1$ to $82^P$ with different control settings. where p is an integer specifying the number of local phase generators. Each phase generator independently creates multiple phase signals $PS_1$ to $PS_q$ including a delayed original PM signal (Fc) (q is an integer from 2 to 10), a subharmonic component has a frequency Fc/n (where n is an integer as set forth above) and/or a subharmonic component has a frequency that is a fraction of the carrier frequency. FIG. 1B depicts an example in which the phase generators generate three phase signals—a delayed original PM signal (Fc), a divide-by-three PM signal (Fc/3), and a non-uniform gated PM signal (2Fc/3). To mitigate time skew between different phase generators and different PM signals, phase detectors and tunable delays are implemented. The generated phase signals then pass through the high-speed multiplexer (MUX) 84. In a refinement, the phase control signal is retimed with the original PM signal to avoid phase glitches. Depending on the AM LUT 88, the MUX selects the PM signals corresponding to the intended PA input switching frequency.

Still referring to FIG. 1B, digital AM signal 90 and the clock signal 92 are generated off-chip using the LVDS format. Digital AM signal 90 is first sent to a digital decoder 92, which generates the LUT 88 for multi-SHS with the hybrid class-G operation. The LUT outputs contain the amplitude code, phase control word, and supply control word to control the phase-interleaved PA core. All the control signals are properly retimed and phase-aligned for the multi-SHS operation. In a refinement, each PA bank maintains the same amplitude code to generate the same output power to guarantee subharmonic cancellation under all the different output power levels. In the system depicted in FIG. 1B, the PM signal and amplitude code are combined in the polar combiner 96 before the non-overlapping clock and level shifters 98. Non-overlapping clock 98 is implemented to generate non-overlapping PA input signals to suppress the crowbar current, which can improve the class-D driver peak efficiency.

In a variation of the SHS systems set forth above, a power combiner can be used to combine the power from the power amplifiers set forth in FIGS. 1A and 1B while canceling the subharmonics. FIG. 1B depicts such a combiner 102 which is transformer-based and is in electrical communication with load 105 having impedance $R_L$.

In some variations of the SHS systems set forth above, subharmonic switching is combined with other efficiency enhancement techniques. Examples of such other efficiency enhancement techniques include but are not limited to, Doherty PA, load modulation and supply modulation (e.g., class-G or envelope tracking) to further improve the power back-off efficiency.

FIGS. 1A and 1B depict subharmonic switching digital power amplifier system having a polar configuration. Subharmonic switching power amplifiers with a quadrature configuration or outphasing configuration can be alternatively used to enhance the average efficiency.

Additional details of the present invention are provided in the following publications: A. Zhang and M. S. Chen, "A Watt-Level Phase-Interleaved Multi-Subharmonic Switching Digital Power Amplifier," in IEEE Journal of Solid-State Circuits, vol. 54, no. 12, pp. 3452-3465, December 2019; A. Zhang and M. S. Chen, "A Sub-Harmonic Switching Digital Power Amplifier with Hybrid Class-G Operation for Enhancing Power Back-off Efficiency," 2018 *IEEE Symposium on VLSI Circuits*, Honolulu, Hi., 2018, pp. 213-214; and A. Zhang and M. S. Chen, "A Subharmonic Switching Digital Power Amplifier for Power Back-Off Efficiency Enhancement," in *IEEE Journal of Solid-State Circuits*, vol. 54, no. 4, pp. 1017-1028, April 2019; the entire disclosures of which are hereby incorporated by reference.

The following examples illustrate the various embodiments of the present invention. Those skilled in the art will recognize many variations that are within the spirit of the present invention and scope of the claims.

Figure 2:
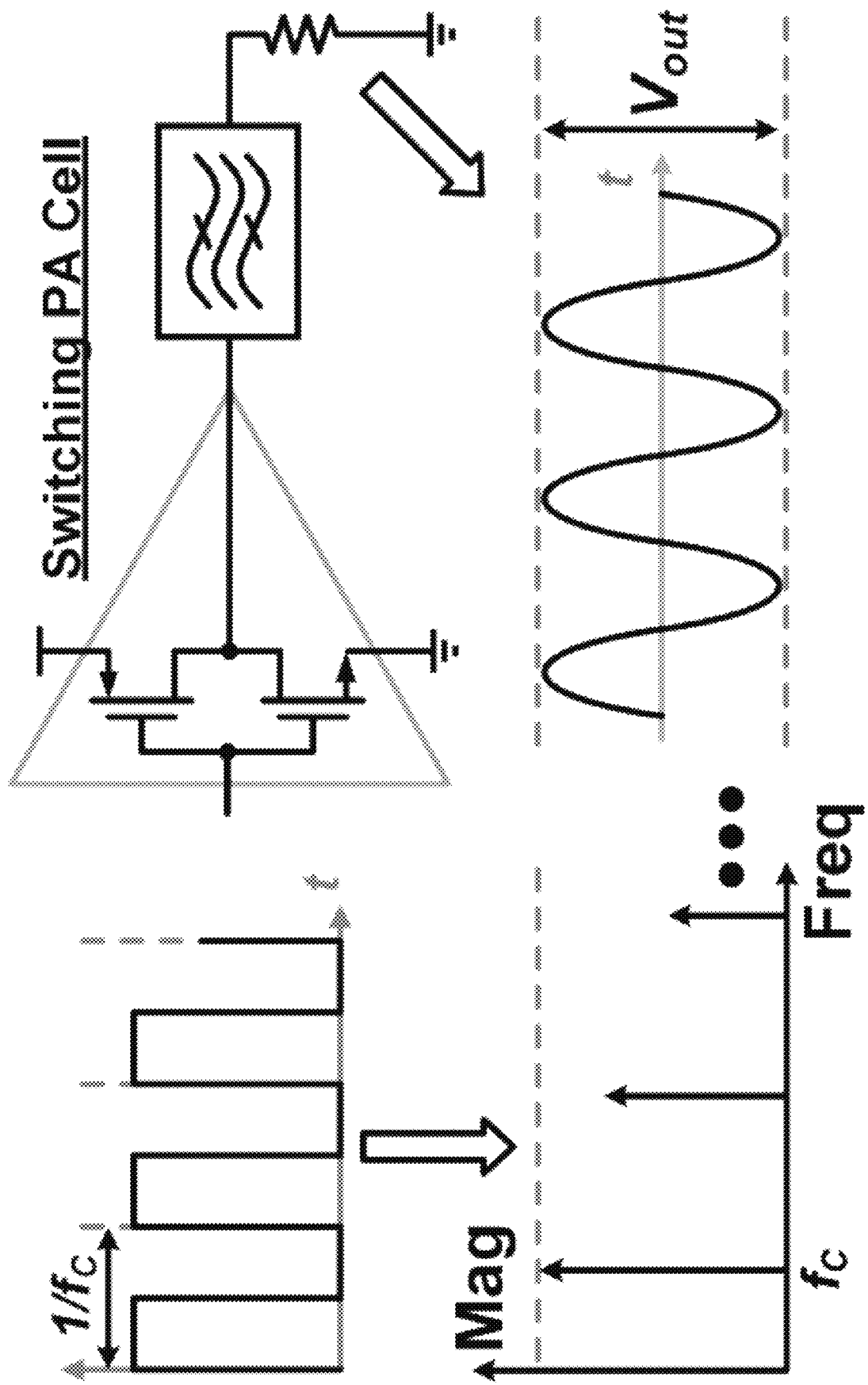
FIG. 2. Conventional class-D PA operation in the peak power mode.
Figure 3:
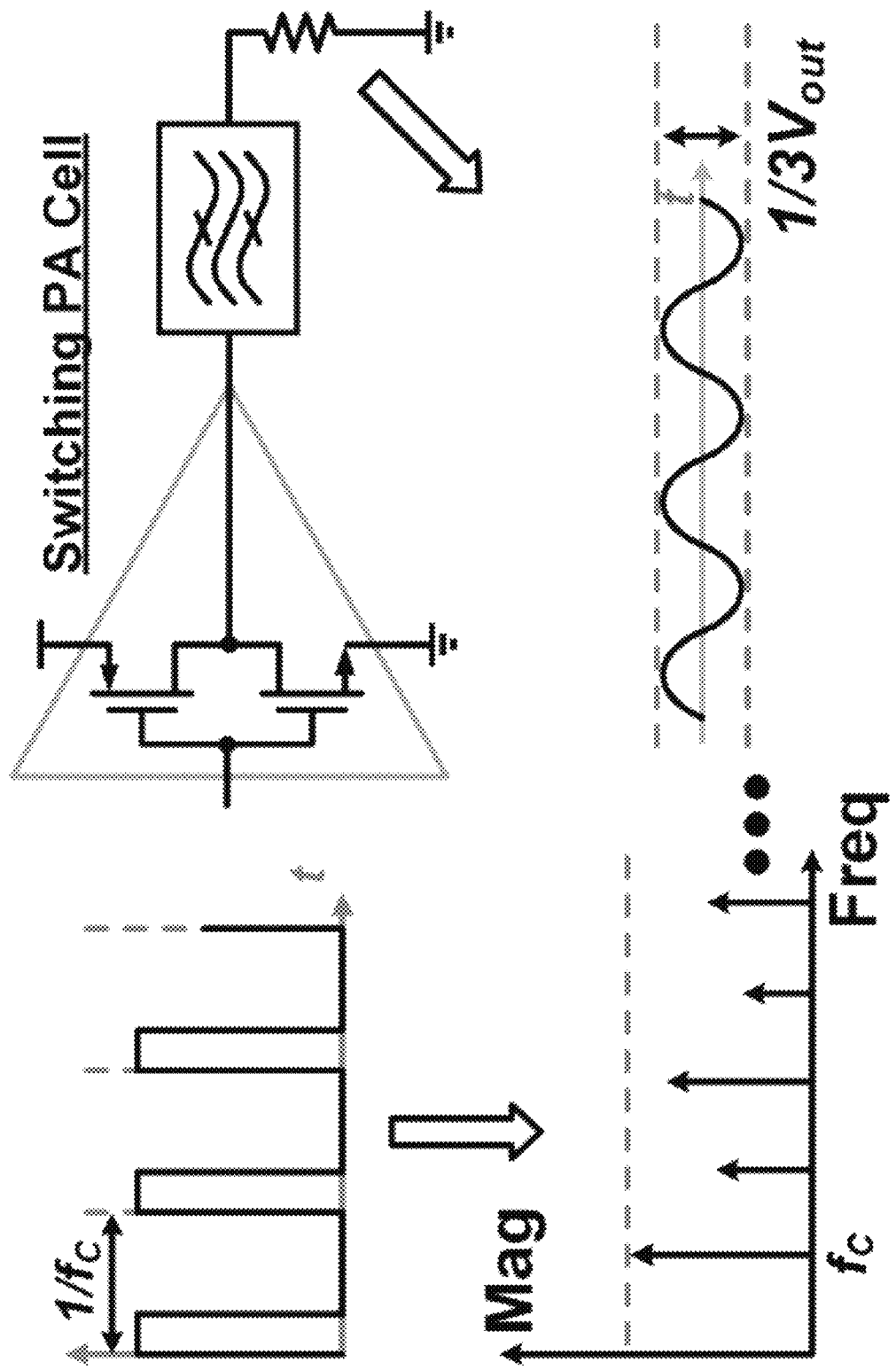
FIG. 3. Conventional class-D PA in the PBO mode.

I. A Subharmonic Switching Digital Power Amplifier for Power Back-Off Efficiency Enhancement Subsection I.1. Proposed Subharmonic Switching Technique A. Operation Principle To introduce the SHS concept, we use a single-bit class-D switching PA as an example and examine its peak power mode and PBO mode, as shown in FIGS. 2 and 3. The NMOS and PMOS transistors are used as switching devices, where the transistors operate in the triode region during the "ON" state. The PA output is toggled between $V_{DD}$ and $V_{GND}$ controlled by the input square wave. Conventionally, the input switching frequency of a class-D PA is equal to the carrier frequency. If the loaded quality factor ($Q_L$) of the following matching network is sufficiently high, then the voltage across $R_L$ will be the fundamental frequency of the input waveform, which surrounds the transmitter carrier frequency. In this case, the output voltage amplitude is $$V_{out} = \frac{2}{\pi} V_{DD}. \tag{1.1}$$

In the peak power mode (FIG. 2), the maximum output power is $$P_{out} = \frac{2}{\pi^2} \frac{V_{DD}^2}{R_L}. \tag{1.2}$$

In the conventional operation, when the single PA cell works in the PBO mode, as shown in FIG. 3, the output power can be reduced by changing the duty cycle. The output voltage amplitude is determined by the duty cycle (d)

$$V_{out} = \frac{2}{\pi} \sin(\pi d) V_{DD}. \tag{1.3}$$

The output power then become $$P_{out} = \frac{2}{\pi^2} \frac{V_{DD}^2}{R_L} \sin^2(\pi d). \tag{1.4}$$

Figure 4:
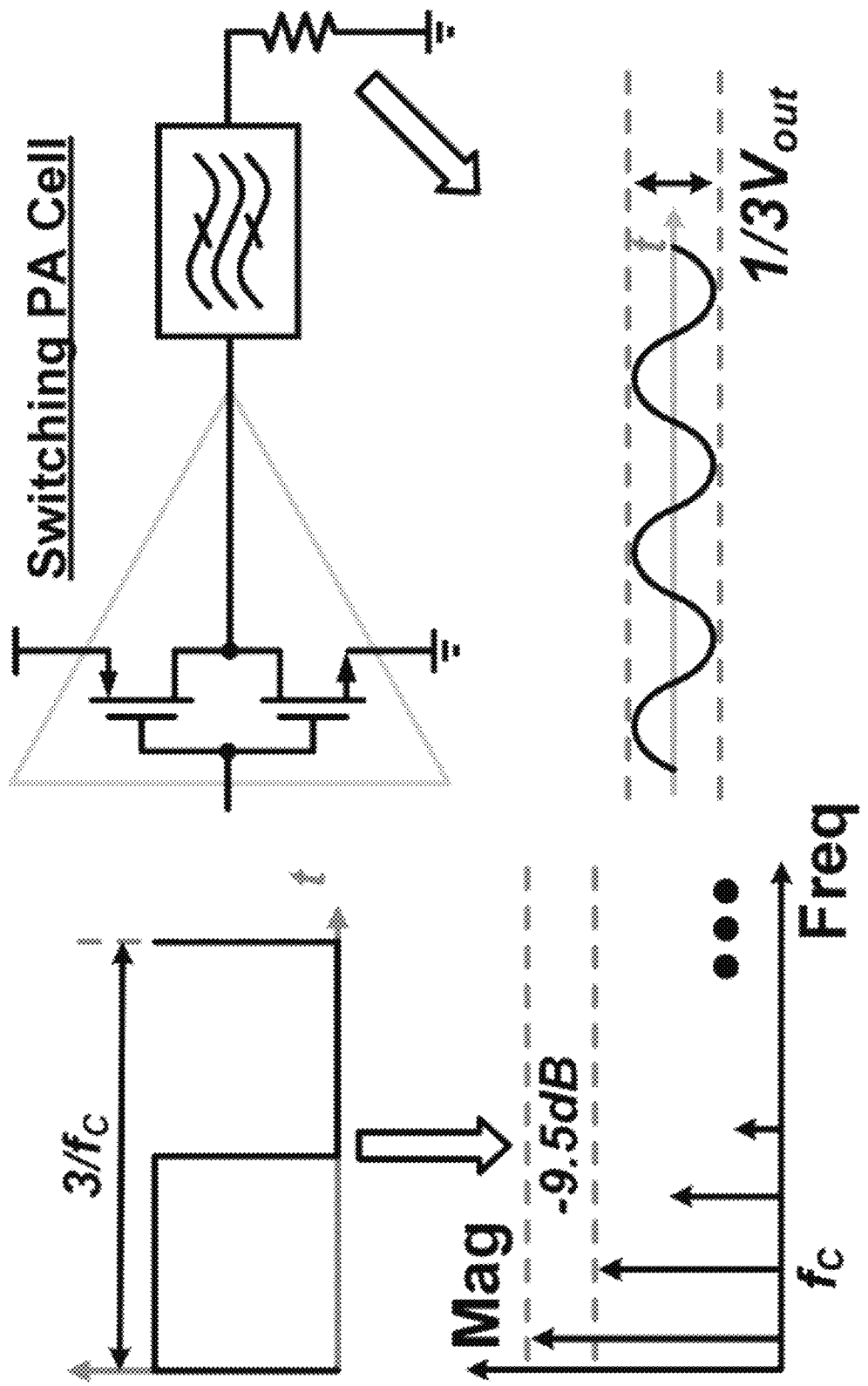
FIG. 4. SHS class-D PA in the PBO mode.

An examination of the switching waveform of the PA shows that it contains different harmonics with deterministic amplitude. The higher the harmonics index, the lower the signal energy. As a result, when the PA works in the PBO region, we can simply use the subharmonic of the carrier frequency as the PA switching frequency and rely on the harmonic component to carry the signal information. As an example (shown in FIG. 4), the input waveform is toggled at the third subharmonic of the carrier frequency (i.e., fc/3), or fc, while the matching network still selects the fc component. The output voltage amplitude at the carrier frequency is then $$V_{out} = \frac{1}{3} \frac{2}{\pi} V_{DD}. \tag{1.5}$$

The output power at the carrier frequency is $$P_{out} = \frac{2}{\pi^2} \frac{1}{9} \frac{V_{DD}^2}{R_L}. \tag{1.6}$$

The output PBO is −9.5 dB relative to the peak mode, i.e., when comparing (1.1) and (1.2). In addition, we can utilize different subharmonics of the carrier frequency to achieve different PBO levels. For the $M^{th}$ subharmonic, the output power at the carrier frequency is $$P_{out} = \frac{2}{\pi^2} \frac{1}{M^2} \frac{V_{DD}^2}{R_L}. \tag{1.7}$$

In other words, the PA can achieve different PBO levels by toggling at different switching frequencies. This SHS PA architecture potentially allows the selection of different PA switching frequencies based on the required PBO. Subsection I.1-B presents various efficiency-enhancement mechanisms for SHS, all of which benefit from lower toggling speeds.

While the example used so far is single-bit switching PA, the proposed SHS can be easily extended for digital PA architecture (i.e., using multi-bit input). Essentially, this technique gives the PA system one more degree of freedom to select both the amplitude control word (ACW) and the switching frequency control word (SFCW) to achieve PBO. A conventional digital PA only relies on ACW, and the output power in the PBO region is the maximum output power scaled by $(n/N)^2$, where n out of the total N number of PA unit cells are turned on. With the assistance of SFCW, we can keep more PA unit cells turned on but toggled at a lower speed for the same output power, which helps improve PA back-off efficiency.

Note that the SHS operation generates additional frequency components, which might violate the requirement of the out-of-band spectral mask specifications. To suppress the subharmonic tone and other unwanted frequency components, a notch filter response is included in the matching network with adds relatively little design overhead. Subsection I.3-D will present the matching network design for the SHS PA prototype.

B. Efficiency Enhancement Due to SHS

Different mechanisms are analyzed for efficiency enhancement in SHS PA architectures. First, the SHS technique can mitigate the dynamic loss of the driver in the PBO region for single-bit PA architecture. Second, the SHS operation helps with PBO impedance matching and conduction loss of driver in digital PA architecture. The output impedance difference in the peak power mode and PBO mode is reduced, thus providing better impedance matching in the PBO region. Finally, since we chose switched-capacitor PA (SCPA) implementation as the test vehicle [13], [20], [21], [22]-[23][24], SHS further helps reduce the energy loss in the switched-capacitor bank. We will elaborate on these mechanisms in Subsections I.2-B1-I2-B3.

Figure 5:
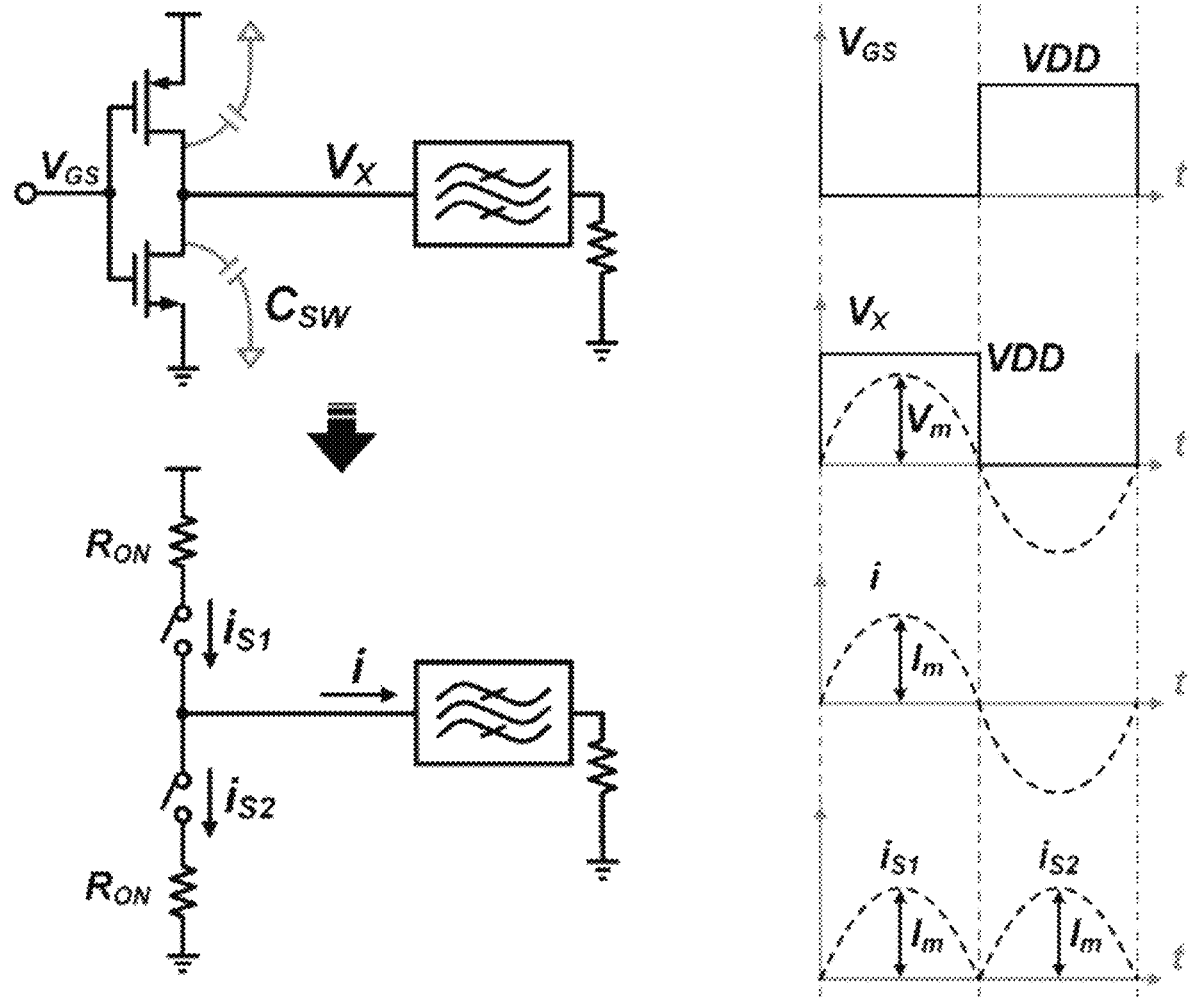
FIG. 5. Single PA architecture.

1) Class-D PA Driver Loss:

Assuming that the matching network is lossless and only selects the carrier frequency, we first examine the efficiency of a single-bit class-D PA due to driver loss with and without SHS (FIG. 5). The root mean square (rms) output current value of each transistor when the PA is in peak power mode can be expressed as $$I_{rms} = \sqrt{\frac{1}{2\pi}\int_0^\pi (I_m \sin \omega t)^2 d(\omega t)} = \frac{I_m}{2} \quad (1.8)$$

where $I_m$ is the peak-to-peak amplitude of the output current waveform. The conduction power loss in each transistor is $$P_{R_{ON}} = R_{ON} I_{rms}^2 = \frac{R_{ON} I_m^2}{4} \quad (1.9)$$

where $R_{ON}$ is the turn-on resistance of the PA.

Another loss mechanism associated with the driver is the dynamic loss due to the driver's output parasitic capacitance. Assuming that the PA switching frequency is f and the associated parasitic capacitance at the driver output is $C_{sw}$ for each pull-up and pull-down devices, the total dynamic power loss dissipated in charging/discharging the parasitic capacitance is $$P_{sw} = f C_{sw} V_{DD}^2 = \frac{\pi^2}{4} f C_{sw} R_L^2 I_m^2. \quad (1.10)$$

The input parasitic capacitance of the PA driver mostly affects the power loss from the pre-driver, assuming the total parasitic capacitance in pre-driver is $C_{pre}$, the power loss in pre-driver is:

$$P_{pre} = f C_{pre} V_{DD}^2 = \frac{\pi^2}{4} f C_{pre} R_L^2 I_m^2. \quad (1.11)$$

Hence, the overall efficiency at peak power mode is $$\eta_D = \frac{P_o}{P_o + 2P_{R_{ON}} + 2P_{sw} + P_{pre}} \quad (1.12)$$

$$= \frac{R_L}{R_L + R_{ON} + \frac{\pi^2}{2} f C_{SW} R_L^2 + \frac{\pi^2}{4} f C_{pre} R_L^2}$$

When the PA works in the PBO region (i.e., the output voltage is M times smaller than the peak output voltage), the output power and conduction power loss of the transistors are scaled down by a factor of $M^2$. However, the dynamic power loss is not scaled down, because only the duty cycle of the switching waveform changes. The overall efficiency in the PBO mode is $$\eta_D = \frac{\frac{R_L}{M^2}}{\frac{R_L}{M^2} + \frac{R_{ON}}{M^2} + \frac{\pi^2}{2} f C_{sw} R_L^2 + \frac{\pi^2}{4} f C_{pre} R_L^2}. \quad (1.13)$$

Next, we derive the driver loss of SHS PA in the PBO region. In order to scale down the output power by M times, the SHS technique is used to lower the switching frequency of the PA driver by a factor of M (M equals 3 in our implementation). The conduction power loss is thus scaled down by a factor of $M^2$, while the dynamic power loss is M times lower due to the reduced hard switching speed. Hence, the SHS PA efficiency due to driver nonidealities is $$\eta_D = \frac{\frac{R_L}{M^2}}{\frac{R_L}{M^2} + \frac{R_{ON}}{M^2} + \frac{\pi^2 f}{2M} C_{SW} R_L^2 + \frac{\pi^2 f}{4M} C_{pre} R_L^2}. \quad (1.14)$$

Comparing (1.12) and (1.13), the single-bit SHS PA efficiency is shown to have improved, mainly due to the lower dynamic power loss of the driver. Note that, in this single-bit scenario, there are some works [14], [25] that also reduce the switching speed to mitigate the dynamic loss of the single-bit driver, leading to efficiency improvement for single-bit driver operation.

Figure 6:
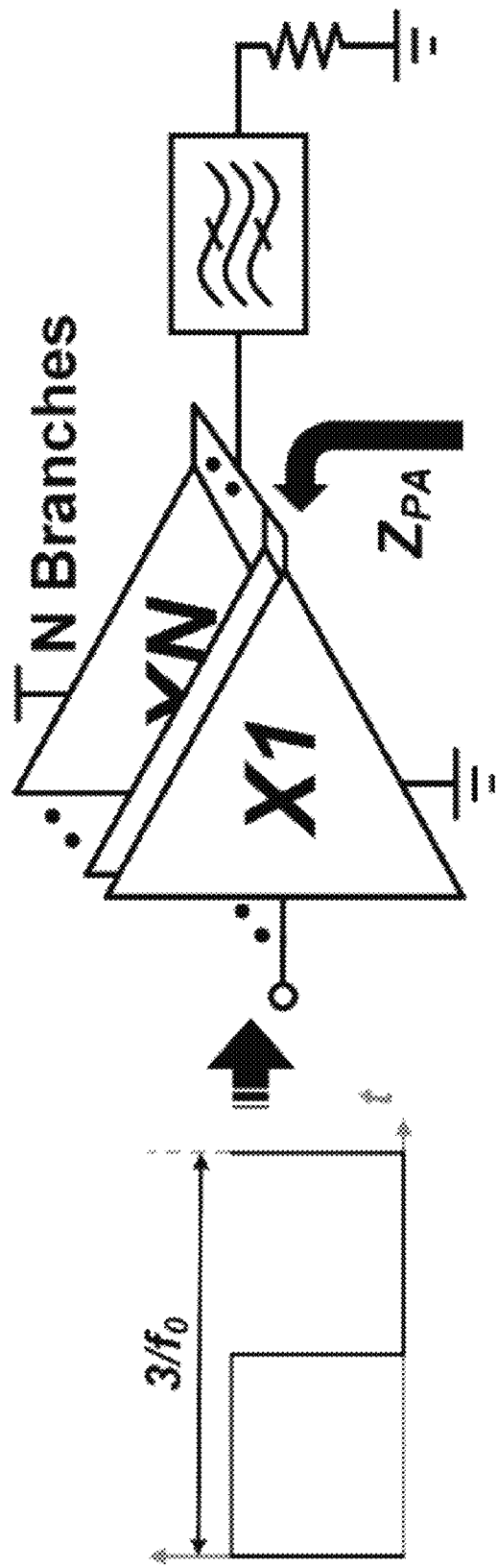
FIG. 6. Digital PA architecture.

In the case of multi-bit digital PA (FIG. 6), assume that the digital PA has N number of PA unit branches. We can follow similar derivations as in the single-bit case. The overall efficiency at peak power mode is $$\eta_D = \frac{R_L}{R_L + R_{ON} + \frac{\pi^2}{2}fC_{sw}R_L^2 + \frac{\pi^2}{4}fC_{pre}R_L^2}. \quad (1.15)$$

When the PA works in the PBO mode, assuming that the output voltage scales down M times, only (N/M) branches toggle and other PA unit branches turn off. The output power is scaled down by $M^2$, and the conduction loss and dynamic power loss are scaled down by M. The efficiency of the PBO of conventional digital PA by turning off the driver unit cells is $$\eta_D = \frac{\frac{R_L}{M^2}}{\frac{R_L}{M^2} + \frac{R_{ON}}{M} + \frac{\pi^2 f}{2M}C_{sw}R_L^2 + \frac{\pi^2 f}{4M}C_{pre}R_L^2}. \quad (1.16)$$

In this case, we can observe less dynamic loss due to the energy savings from the turned-off driver unit cells. When SHS PA is applied, we choose the Mth order subharmonic. Unlike the conventional digital PA, all the N branches toggle at the Mth harmonic to generate M times smaller voltage (M equals 3 in our real implementation). Note that, the conduction current flowing through each transistor is reduced by M as we enabled M times more PA branches. Therefore, the conduction loss can be further reduced (by a factor of $M^2$). Although more driver cells are toggled, the switching frequency is M times lower. The PBO power efficiency for SHS PA can be expressed as $$\eta_D = \frac{\frac{R_L}{M^2}}{\frac{R_L}{M^2} + \frac{R_{ON}}{M^2} + \frac{\pi^2 f}{2M}C_{sw}R_L^2 + \frac{\pi^2 f}{4M}C_{pre}R_L^2}. \quad (1.17)$$

When we compare (1.16) and (1.17), the multi-bit SHS PA efficiency is found to improve, mainly due to the lower conduction loss of the driver. In summary, the SHS technique helps reduce driver-caused power losses in both the single- and multi-bit digital PA configurations.

2) Improved Impedance Matching:

Typically, the PA output impedance is optimized for a certain fixed value for maximal power efficiency at the peak output power level. It is thus advantageous to maintain the same impedance in both the peak power and PBO regions. Given a digital PA architecture, the peak output power occurs when all the driver unit cells are turned on. Assuming that the turn-on impedance of each driver unit cell is $Z_{ON}$, the output impedance in the peak power mode is then $$Z_{PA,Peak} = \frac{Z_{ON}}{N} \quad (1.18)$$

where N is the total number of PA driver unit cells. The impedance of the matching network is usually designed to match $Z_{PA,Peak}$ to achieve either improved efficiency or maximal output power. In contrast, when the PA works in the PBO region, some driver unit cells are turned off to reduce the output power level. Assuming that the turn-off impedance of each driver unit cell is $Z_{OFF}$, when n number of driver unit cells are turned on, the impedance follows the equation:

$$\frac{1}{Z_{PA,PBO}} = \frac{1}{\frac{Z_{OFF}}{N-n}} + \frac{1}{\frac{Z_{ON}}{n}}. \quad (1.19)$$

Therefore, the output impedance in this PBO mode is $$Z_{PA,PBO} = \frac{Z_{ON} \cdot Z_{OFF}}{n \cdot Z_{OFF} + (N-n) \cdot Z_{ON}}. \quad (1.20)$$

Note that, turn-off resistance $R_{OFF}$ is equal to turn-on resistance $R_{ON}$, to the first order [20]. In the real circuit implementation, to make the on resistance the same, the size of PMOS transistor is typically larger than that of NMOS transistor, which leads to a different drain parasitic capacitance value in the ON/OFF mode. Therefore, $Z_{OFF}$ is different from ZON. ZPA,PBO inevitably deviates from $Z_{PA,Peak}$ and is input-code dependent. This degrades the power efficiency and linearity in the PBO region. Thanks to the SHS PA architecture, the impedance difference between peak power mode and PBO mode can be reduced. To generate the same PBO level, 3n number of driver unit cells toggle at third subharmonic. Between the 0- and −9.5-dB PBO region, different output amplitudes can be achieved by toggling each PA cell, either at the fundamental or third subharmonic frequencies. In essence, all the PA cells are always turned on, and hence, PA output impedance remains constant. The output impedance in this PBO region is $$Z_{PA,PBO} = \frac{Z_{ON}}{N}. \quad (1.21)$$

When the output power is lower than −9.5 dB PBO, some PA cells will start to turn off, causing impedance variations. The output impedance now becomes $$Z_{PA,PBO} = \frac{Z_{ON} \cdot Z_{OFF}}{3n \cdot Z_{OFF} + (N-3n) \cdot Z_{ON}}. \quad (1.22)$$

Compared with the conventional digital PA operation, however, the SHS technique always toggles more PA cells in the PBO region, which leads to lower impedance variation and better efficiency. Further discussions of the impedance variation for SHS and hybrid class-G operations will be provided in Subsection I.3.

Figure 7:
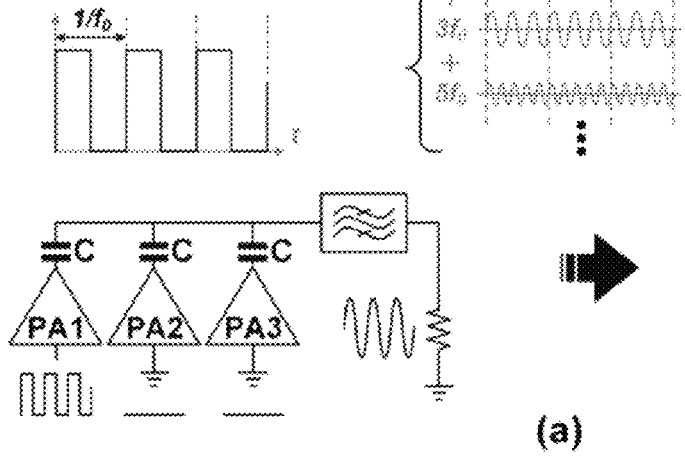
FIG. 7. (a) Conventional SCPA in the PBO mode. (b) SHS SCPA in the PBO mode.
Figure 7:
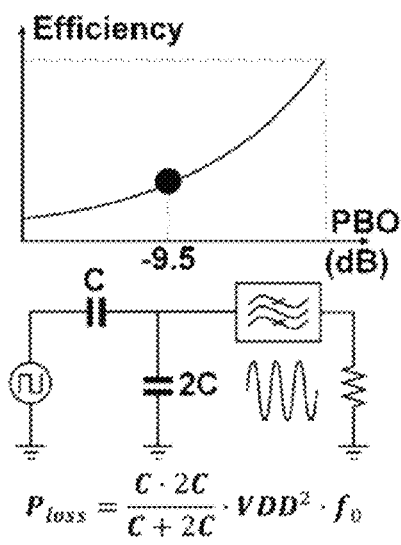
Figure 7:
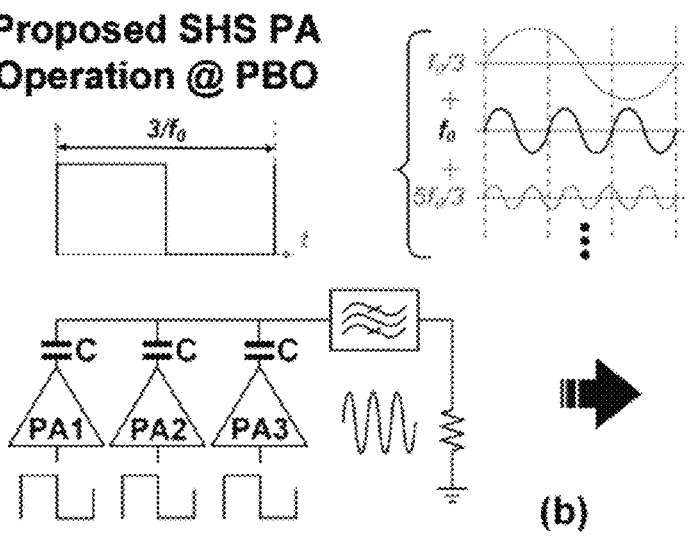
Figure 7:
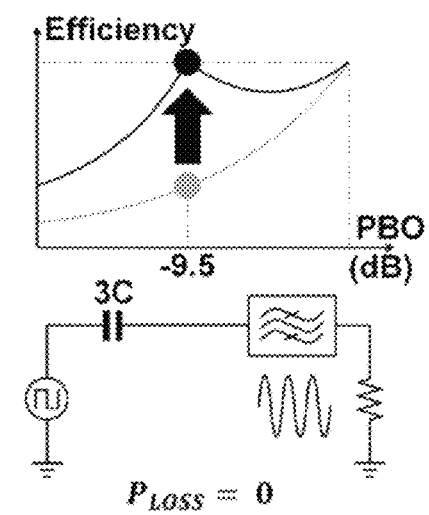

3) Reduced Capacitor Switching Loss:

The ideal SCPA model can achieve 100% efficiency at peak output power, assuming ideal PA drivers. In the peak power mode, all capacitors toggle around the RF carrier frequency, which is the fundamental switching frequency. When the conventional SCPA operates in the PBO region, the power efficiency starts to decrease due to a charge loss through the capacitor array. For example, FIG. 7 shows that two-thirds of the capacitors are connected to ground to achieve a PBO of 9.5 dB via a capacitor divider and, hence, the charge loss. For convenience, the conventional SCPA power and efficiency equations from [20] are repeated here $$\begin{cases} P_{SC} = \dfrac{n(N-n)}{N^2} CV_{DD}^2 f \\ P_{out} = \dfrac{2}{\pi^2}\left(\dfrac{n}{N}\right)^2 \dfrac{V_{DD}^2}{R_L} \\ \eta_D = \dfrac{P_{out}}{P_{out}+P_{SC}} = \dfrac{1}{1+\dfrac{\pi(N-n)}{4}\dfrac{1}{n}\dfrac{1}{Q_{LOAD}}} \\ Q_{LOAD} = \dfrac{2\pi f L}{R_L} = \dfrac{1}{2\pi f CR_L} \end{cases} \quad (1.23)$$

The key energy-loss mechanism involved is that the conventional SCPA reduces the output voltage by capacitive division through the SC array, i.e., through charge redistribution. When some of those capacitors are tied to ground, the charge stored in those capacitors will be discharged and wasted. To avoid this charge loss, it is better to avoid capacitive division as much as possible, which can be achieved via the SHS technique.

Figure 8:
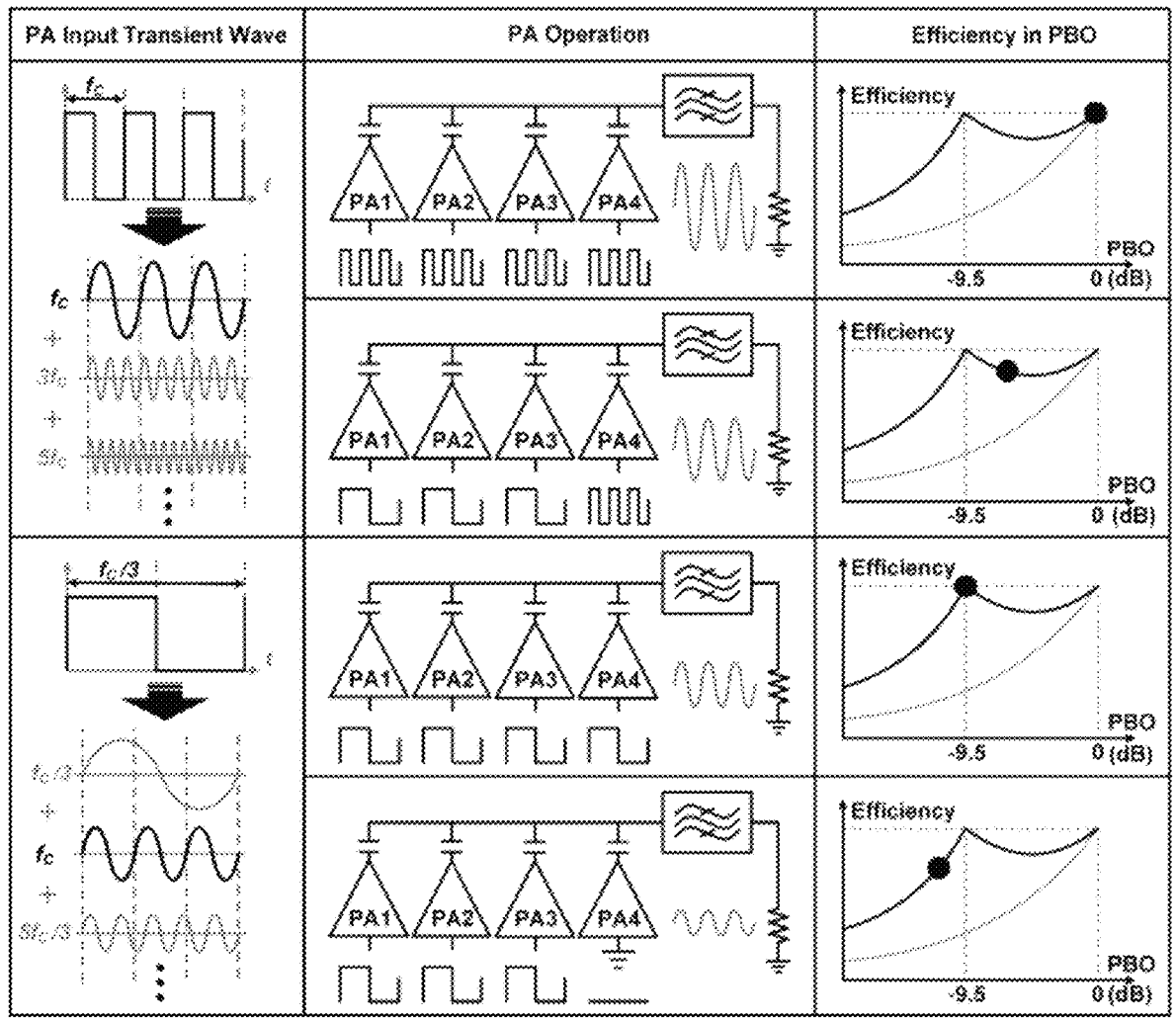
FIG. 8. SHS SCPA in different power regions.

Next, we will analyze this dynamic power loss and theoretical efficiency in the representative PBO regions to observe the improvement due to SHS using the third subharmonic component (fc/3). When the PA operates between 0- and −9.5-dB PBO, part of the PA cells toggle at fc/3, while the rest toggle at fc. This setup occasionally results in capacitive division and hence introduces some energy loss in the capacitor bank. As an example, as shown in FIG. 8, when the output power is at −6-dB PBO, three branches toggle at fc/3 and one branch toggles at fc. Due to the frequency difference, the switched-capacitor bank can never toggle all together, thus causing charge loss. Assuming that 3n cells toggle at fc/3 and (N−3n) cells toggle at fc, we can derive the power and efficiency equations as $$\begin{cases} P_{SC} = \dfrac{3n(N-3n)}{N^2} CV_{DD}^2 \left(f - \dfrac{f}{3}\right) \\ P_{out} = \dfrac{2}{\pi^2}\left(\dfrac{3n}{N}\dfrac{1}{3}+\dfrac{N-3n}{N}\right)^2 \dfrac{V_{DD}^2}{R_L} \\ \qquad = \dfrac{2}{\pi^2}\left(\dfrac{N-2n}{N}\right)^2 \dfrac{V_{DD}^2}{R_L} \\ \eta_D = \dfrac{P_{out}}{P_{out}+P_{SC}} \dfrac{1}{1+\dfrac{\pi n(N-3n)}{2(N-2n)^2}\dfrac{1}{Q_{LOAD}}} \end{cases} \quad (1.24)$$

When the PA operates at the <−9.5-dB PBO region, the PA cells either toggle at fc/3 or are turned off. Compared with a conventional SCPA (FIG. 8), three times more cells toggle together to maintain the same output power. For the −12-dB PBO case shown in FIG. 8, three cells toggle at fc/3 and one cell ties to the ac ground, thus creating capacitive division and, hence, charge loss. In this <−9.5-dB PBO region, the power and efficiency equations are $$\begin{cases} P_{SC} = \dfrac{3n(N-3n)}{N^2} CV_{DD}^2 \dfrac{f}{3} \\ P_{out} = \dfrac{2}{\pi^2}\left(\dfrac{3n}{N}\right)^2 \dfrac{V_{DD}^2}{R_L}\dfrac{1}{9} = \dfrac{2}{\pi^2}\left(\dfrac{n}{N}\right)^2 \dfrac{V_{DD}^2}{R_L} \\ \eta_D = \dfrac{P_{out}}{P_{out}+P_{SC}}\dfrac{1}{1+\dfrac{\pi(N-3n)}{4}\dfrac{1}{n}\dfrac{1}{Q_{LOAD}}} \end{cases} \quad (1.25)$$

Compared with the conventional SCPA [i.e., (1.23) versus (1.25)], the efficiency in the <−9.5-dB PBO region is always better due to the difference of toggling cells (3n versus n).

Subsection I.2. SHS and Hybrid Class-G Operation

Modern communications systems use various modulation signals with varying PAPRs. One efficiency peak in the PBO region is not sufficient to enhance the efficiency of different PAPR signals. In this subsection, we present an SHS digital PA with the hybrid class-G operation for this purpose. The class-G operation essentially changes the power supply of the PA driver cells in order to scale different output power levels. In this prototype, we chose either 3 $V_{DD}$ (3.6 V) or 2 $V_{DD}$ (2.4 V) and the third subharmonic frequency for SHS operation to achieve more power efficiency peaks in the PBO region.

Figure 9:
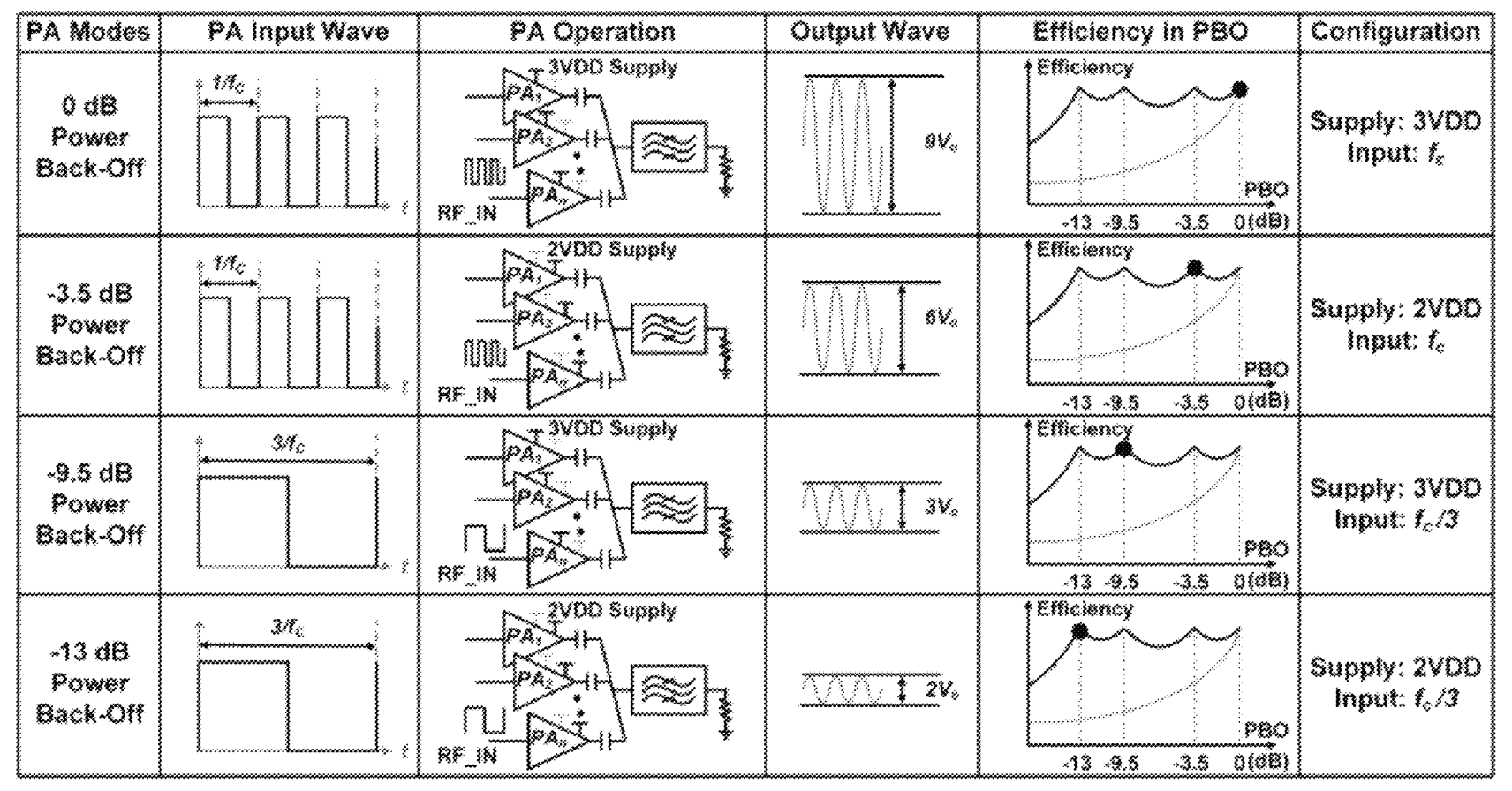

As shown in FIG. 9, at 0-dB PBO (i.e., peak power mode), all the PA cells toggle together at the carrier frequency using 3 $V_{DD}$. This setup achieves the highest efficiency, as discussed in Subsection 1.1-B. When all the PA cells toggle at a lower supply (2 $V_{DD}$) and carrier frequency, another efficiency peak is achieved at the −3.5-dB PBO point. At the −9.5-dB PBO, again, all the PA cells toggle at 3 $V_{DD}$ but now with the SHS frequency. The last efficiency peak occurs at −13-dB PBO when all the PA cells toggle at lower supply and SHS frequency.

The combination of the SHS technique and hybrid class-G operation now yields four efficiency peaks in total. The average efficiency of different PAPR signals can thus be enhanced.

Figure 10:
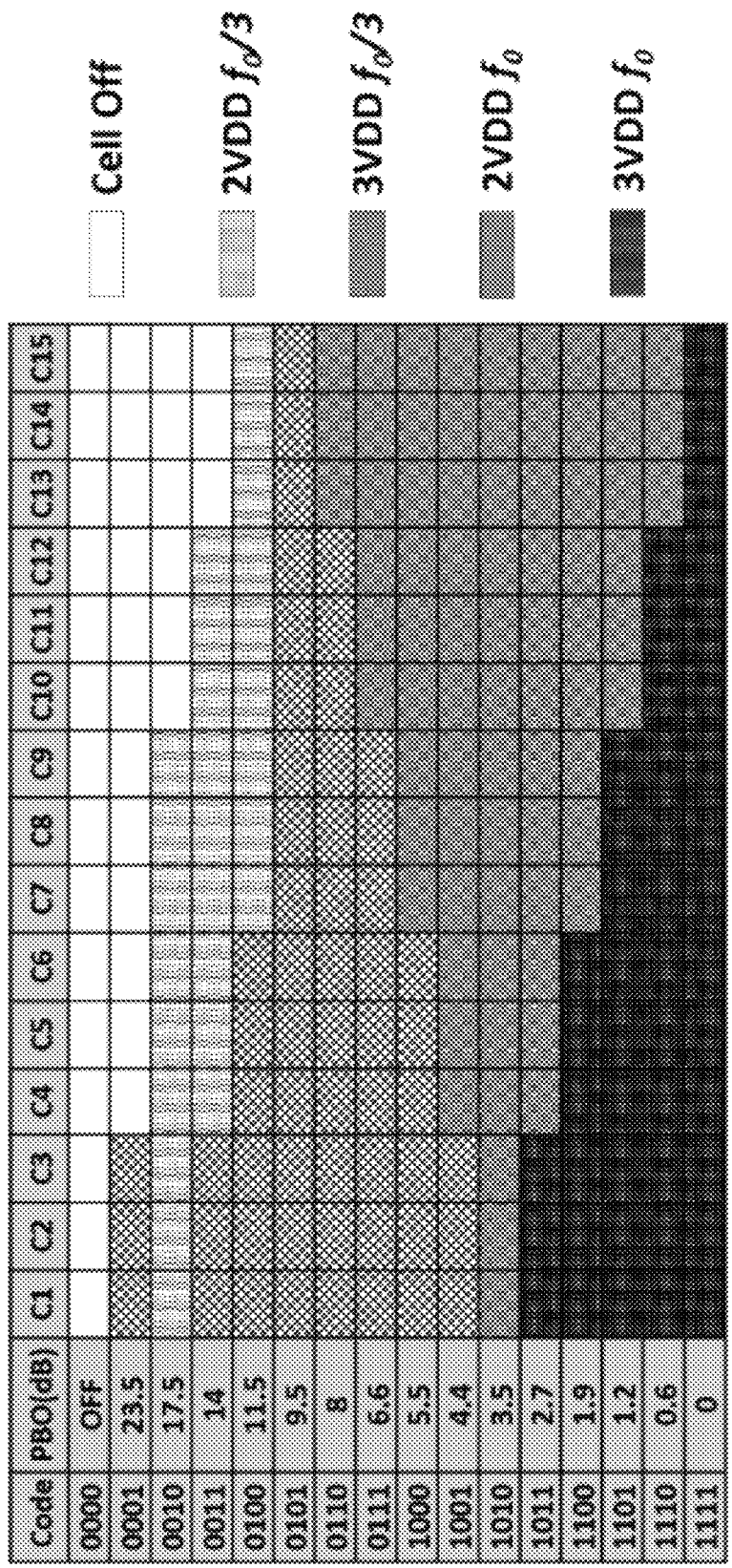
FIG. 10. Simplified PBO operation table.

In addition, we compile a hybrid switching table that combines SHS and dual-supply class-G operation for each PA cell to further optimize the efficiency between these peaks. The lookup table (LUT) optimizes the efficiency for all the AM codes. FIG. 10 shows a simplified LUT to illustrate the operation. (Note that the actual LUT implementation is 8 bit.) To achieve better average efficiency, the general design guideline for this LUT is to turn on more PA unit cells simultaneously, which can minimize the PA driver conduction loss [see (1.17)], offer better impedance matching [see (1.21) and (1.22)], and reduce the dynamic loss [see (1.24) and (1.25)] in the switched-capacitor bank.

Specifically, from 0- to −3.5-dB PBO, the hybrid class-G switching scheme enhances efficiency. The PA cells' supply voltages gradually change from higher supply to lower supply. This scheme uses both supply voltages simultaneously to achieve better efficiency. From −3.5- to −9.5-dB PBO, the PA cells start to operate at subharmonic frequency with a higher power supply. All the PA cells sequentially convert to the combination of subharmonic and higher supply.

Between −9.5- and −13-dB PBO, all the PA cells again change from higher supply to lower supply with SHS frequency. Note that all the PA cells remain in the "ON" state from 0- to −13-dB PBO. The PA output impedance variation is small within this range. When the output power level is lower than −13-dB PBO, some of the PA cells start to turn off, thus degrading efficiency. Since SHS helps to keep more PA cells toggling compared with a conventional digital PA, the efficiency still improves given the same PBO point, as discussed in Subsection I.2-B. In this prototype, we use a behavioral model that includes all the power-loss mechanisms to help determine the final LUT. The LUT is implemented on-chip and fully synthesized inside the SHS block.

Subsection I.3. Circuit Implementation

A. Overall Block Diagram

Figure 11:
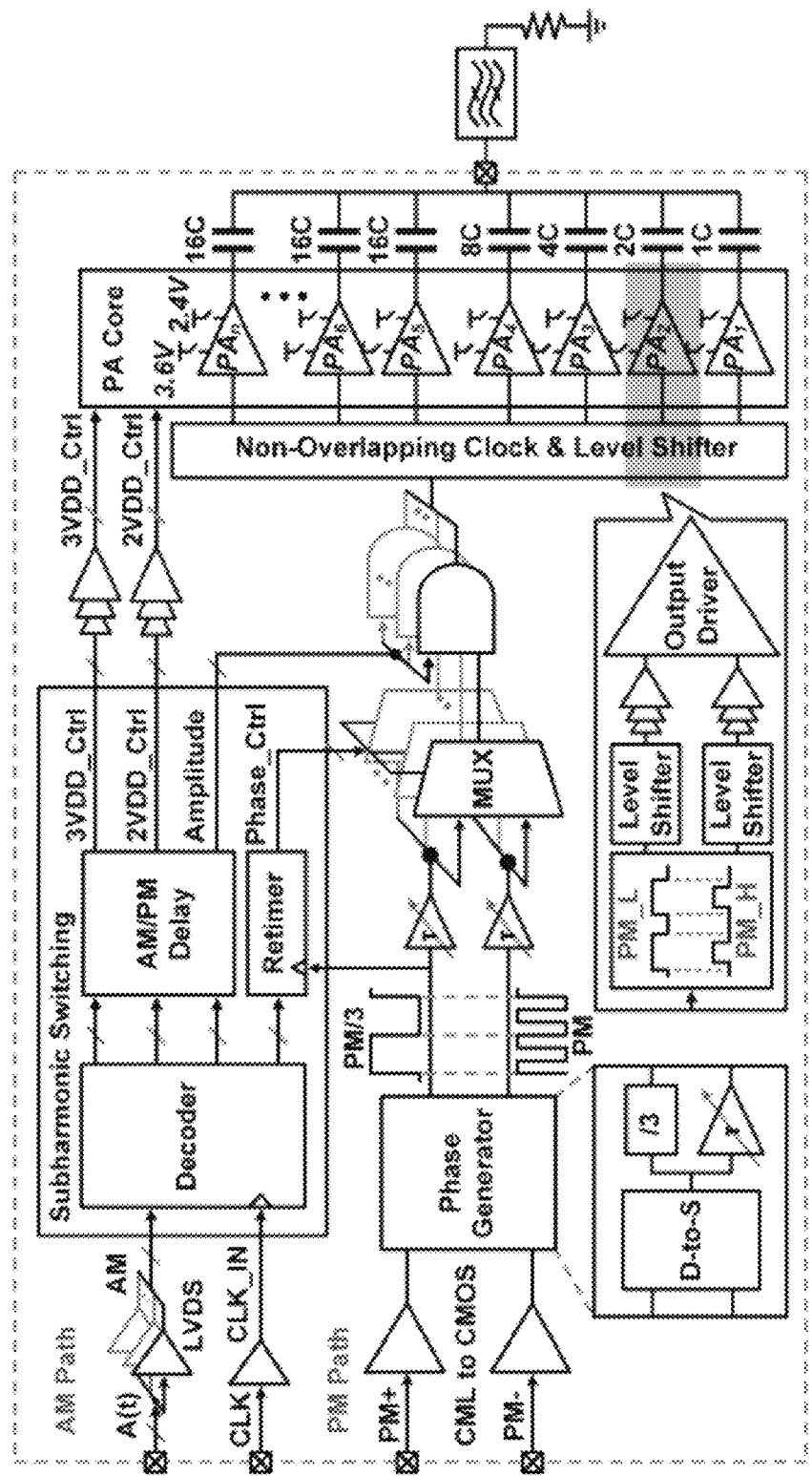
FIG. 11. Block diagram of the proposed PA implementation.

FIG. 11 shows the overall block diagram of the digital PA prototype, which utilizes polar architecture. The 8-bit AM signal path is clocked up to 400 MS/s and is received off-chip via the low-voltage differential signaling (LVDS) receiver. Based on the AM code, a digital decoder block generates the proper amplitude, phase, and supply-control codes according to FIG. 10. Those control signals are then properly retimed and phase-aligned for SHS operation.

The differential PM signal is generated off-chip and passed through the CML-to-CMOS buffer. The phase generator then creates the divide-by-three PM signal and delayed PM signal. A phase detector and tunable delays are implemented to ensure that these two signals are phase-aligned. In order to avoid phase glitches, the phase-control signal is retimed with the PM signal to create a glitch-free MUX control signal. The high-speed MUX then selects the desired switching frequency based on the phase-control code. The selected PM signal and amplitude control code are combined with AND gate prior to the PA drivers. The outputs then connect to an 8-bit segmented capacitor bank with 15-bit unary MSBs and 4-bit binary LSBs. Note that nonoverlapped control signals are used for PA drivers in order to minimize short-circuit currents (i.e., power loss). The details of several key building blocks will be discussed as following.

B. PA Driver

One design challenge for class-D PA is that the output voltage swing is bounded by the device breakdown voltage. To achieve higher output power, one way is to reduce the PA load impedance RL. A few issues are associated with small load impedance, however. First, given a 50-Ω antenna, the small PA load impedance requirement increases the impedance conversion ratio, which degrades the matching network efficiency. Second, the routing parasitic resistance can easily degrade the overall PA efficiency. Therefore, we stack multiple devices to allow a higher power supply and, hence, a larger output voltage swing instead of drastically reducing the PA load impedance. Additionally, to support class-G operation, the PA driver should work with two different supplies (3 and 2 VDD in this paper).

Figure 12:
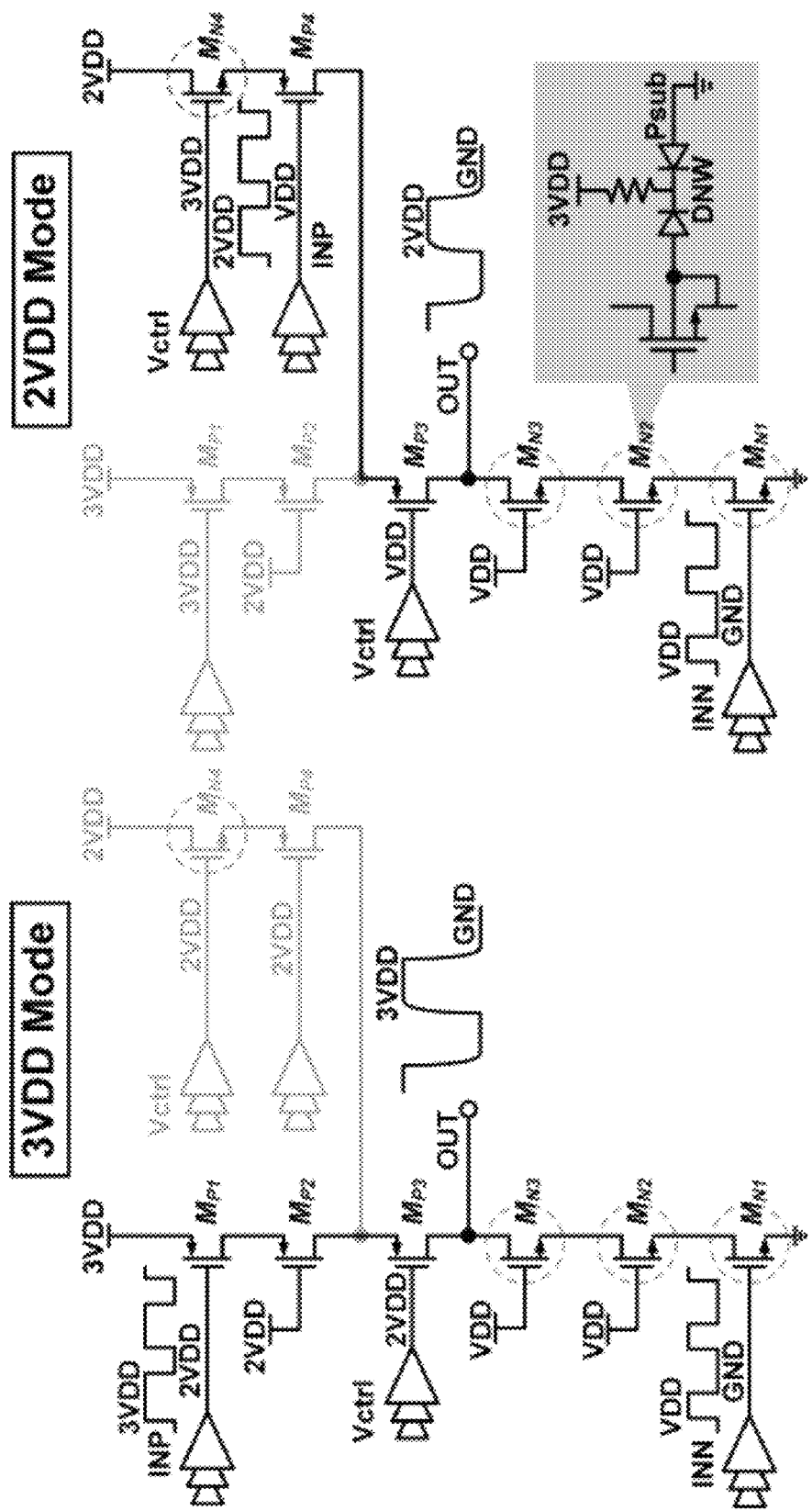
FIG. 12. Proposed PA unit cell.

As shown in FIG. 12, when the driver operates in the 3-$V_{DD}$ mode, the non-overlapping PM signals are sent to the $M_{P1}$ and $M_{N1}$ transistors to turn on either the pull-up or pull-down paths. The output then toggles between 3 $V_{DD}$ and ground. The gate of the $M_{N4}$ transistor is biased at 2 $V_{DD}$ to disable the 2-$V_{DD}$ mode and to avoid current leakage. When the driver works in the 2-$V_{DD}$ mode, $M_{P1}$ and $M_{P2}$ transistors are turned off, and the gate of the $M_{N4}$ transistor is biased at 3 $V_{DD}$ to turn on the 2-$V_{DD}$ mode. $M_{P3}$ changes from 2 to 1 $V_{DD}$ to pass the signal. In this mode, the non-overlapping PM signals are sent to the $M_{N1}$ and $M_{P4}$ transistors, which connect the driver output to either 2 $V_{DD}$ or ground To alleviate voltage stress when the stacked devices are turned on, deep n-well (DNW) devices are used to separate the NMOS transistors' bodies so that their bodies and source terminals can be shorted together. The DNW layer is connected to 3 $V_{DD}$ through large isolation resistance, which avoids forward biasing and reduces the parasitic capacitance power loss associated with the diodes. In the 3-$V_{DD}$ mode, when the devices turn on, we bias the gate of the stacked DNW devices $M_{N2}$ and $M_{N3}$ at $V_{DD}$ to ensure that the voltage difference between gate, source, body, and the drain terminal equals the nominal supply voltage of $V_{DD}$. For PMOS transistors, the gates of PMOS transistors $M_{P2}$ and $M_{P3}$ are biased at 2 $V_{DD}$ for the same purpose. When the devices are OFF, however, the voltage stress of $M_{N3}$ and $M_{P3}$ can be 2 $V_{DD}$. Fortunately, the transistor can sustain high voltage stress when the transistor is in the "OFF" state. If reliability is of particular concern, this issue can be alleviated by implementing the self-bias control circuit in the driver [26].

Figure 13:
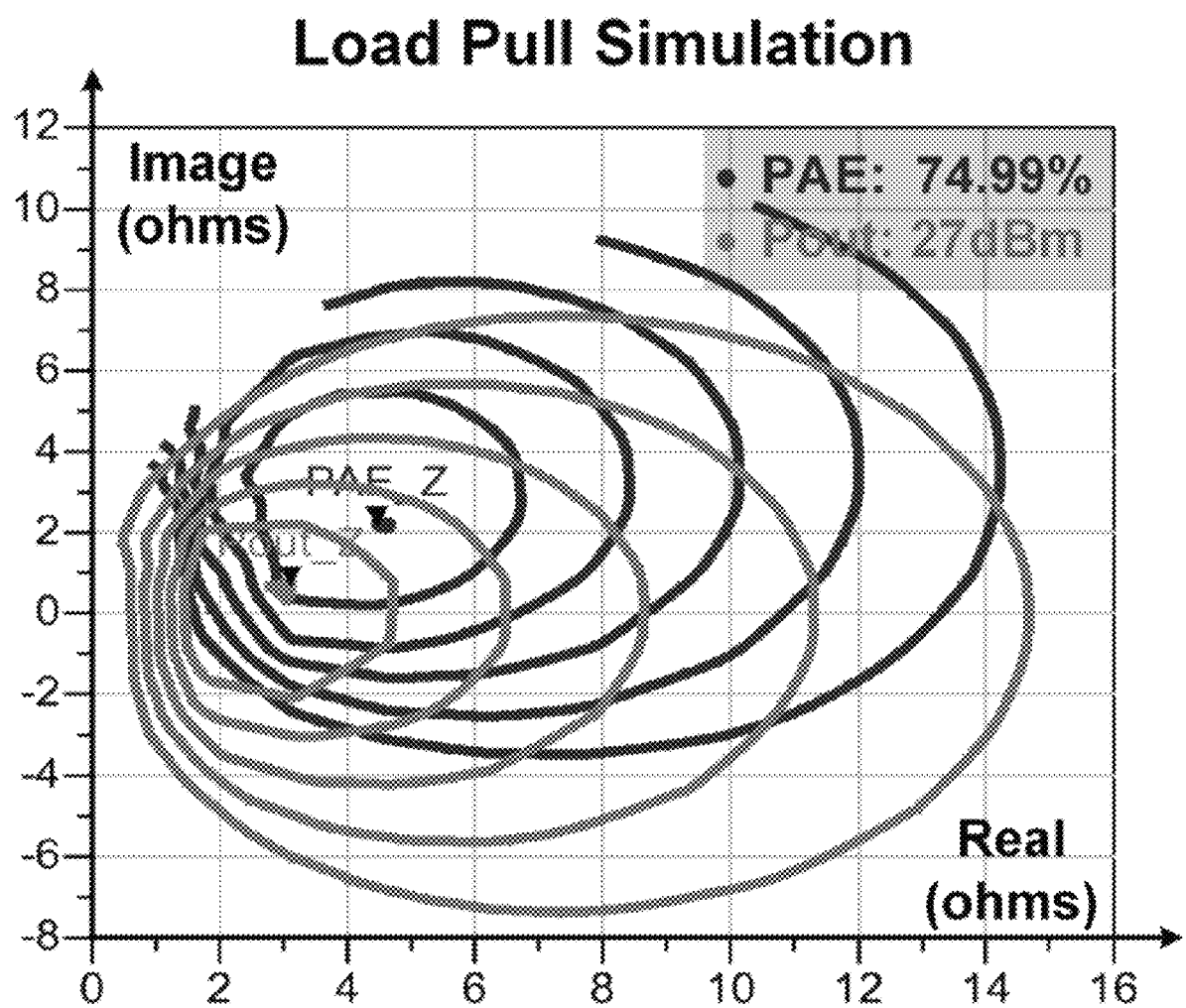
FIG. 13. Power and efficiency contours.

To optimize the tradeoff between PA maximum output power and efficiency, we size the transistors according to the load-pull simulation results (FIG. 13). The load-pull simulation includes all the 8-bit PA pre-drivers and final output driver stages. To achieve both efficiency and output power, the matching network impedance is designed as 4+1.9j to compromise between maximum efficiency contours and power contours.

C. PM Generator

Figure 14:
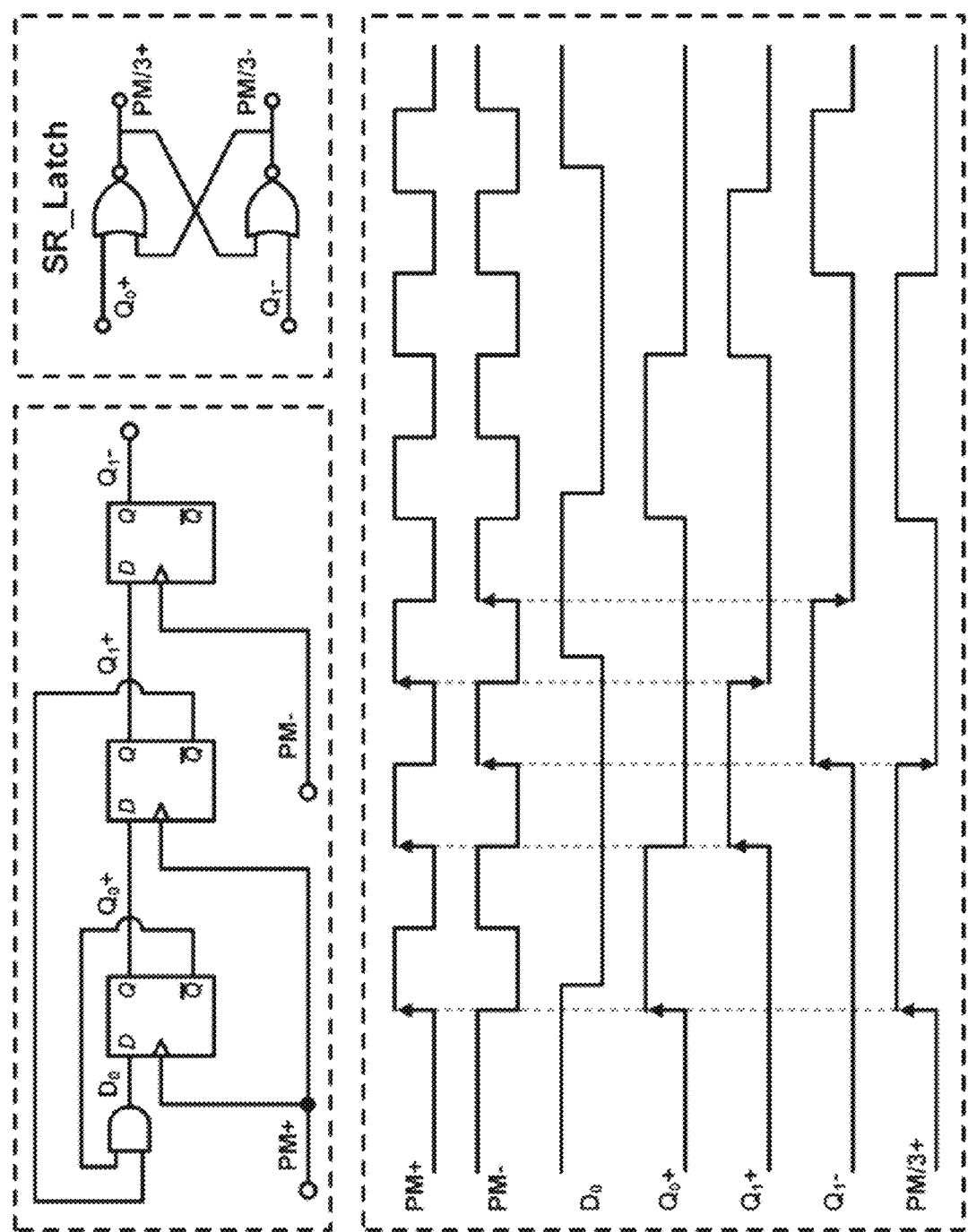
FIG. 14. PM generator.

The PM generator takes in the external PM signal and uses a divide-by-three block to create the subharmonic component of the PM signal for SHS operation (FIG. 14). Note that, to keep the same phase information at carrier frequency, the relative phase should be divided by three at subharmonic, which is naturally achieved by the divide-by-three block. With the combination of the D flip-flop (DFF) outputs, the subharmonic PM signal is created by S-R Latch. A phase alignment block is implemented to align both the PM signals at fundamental and SHS frequencies.

A non-overlapping control signal is created after the PM generator to mitigate the crowbar current, which is another power-loss mechanism in a class-D PA. During the switching transitions, the pull-down NMOS and pull-up PMOS transistors can both be on momentarily, which leads to large crowbar current. To avoid this issue, the non-overlapped PM_H and PM_L signals are generated to control the pull-up and pull-down devices of the output driver, respectively. Given the small relative time delay, the crowbar current is then suppressed. A tunable delay is implemented in this prototype to experiment on the tradeoffs between maximum efficiency and peak output power.

Notably, the duty cycle of the generated subharmonic affects the amplitude at the carrier frequency. Ideally, a third subharmonic waveform with 50% duty cycle provides ⅓ of the peak output voltage amplitude, However, the duty cycle variation can cause output voltage amplitude to deviate. Theoretically, using fc/3 with a duty cycle of d, the output voltage at the carrier frequency is $$V_{out} = \frac{2}{3\pi}\sin(3\pi d)V_{DD} \quad (1.26)$$

where d is the duty cycle of the SHS signal. According to (1.26), if the duty cycle changes from 50% to 45%, a 1-dB difference in output power will result. Since the duty cycle error introduces additional AM-AM and AM-PM nonlinearity, the error can be calibrated by the PA pre-distortion in this prototype.

D. Matching Network

Figure 15:
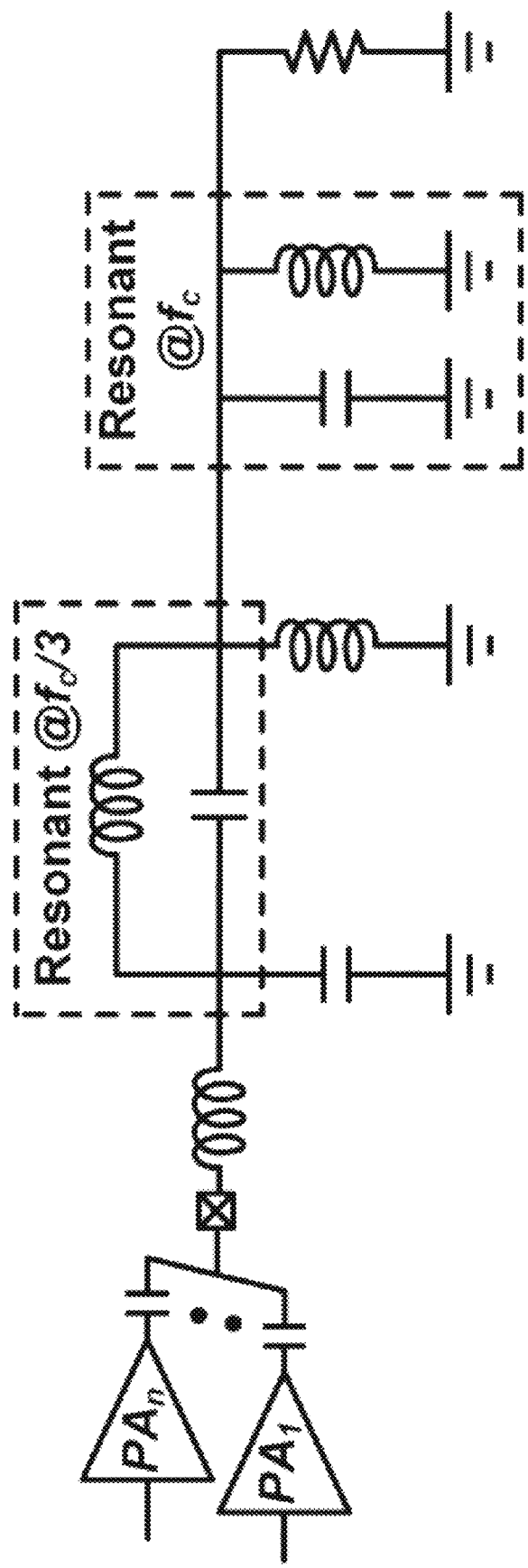
FIG. 15. Single-ended onboard matching network.

The matching network is implemented on board by using Murata surface-mounted components. The single-end matching network schematic is shown in FIG. 15. The network converts the impedance from 50Ω to the optimum impedance value, which is determined by the PA load-pull simulation. Based on the bandpass frequency response, the notch response can be simply added by changing one of the inductors to an LC tank that resonates at subharmonic frequencies (i.e., fc/3 in this paper). At the carrier frequency, the LC tank works as a capacitor, and the matching response takes a second-order bandpass shape. At subharmonic frequency fc/3, the matching network becomes an open circuit for the frequency term, and the input impedance of the matching network becomes sufficiently large. Ideally, the impedance at the subharmonic will be sufficiently high to prevent power leakage, as with other unwanted harmonics. The output power of those harmonics is negligible (less than 1.5% compared with the carrier frequency). Compared with the conventional second-order matching network, the additional loss is less than 0.3 dB.

Subsection I.4. Measurement

A. Measurement Setup

Figure 16:
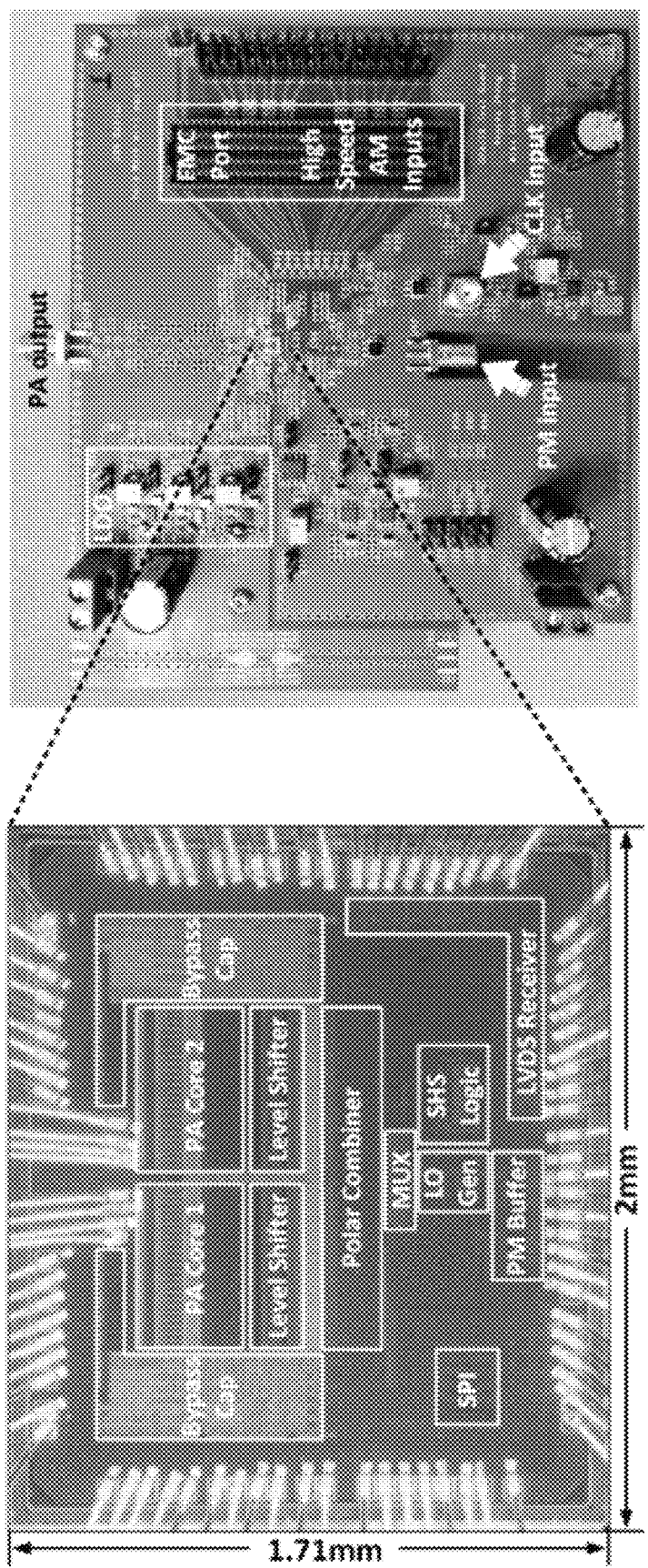
FIG. 16. Chip micrograph and testing board.

The SHS PA prototype was fabricated using a 65-nm bulk CMOS process with a die size of 2 mm×1.71 mm (FIG. 16). The silicon die was directly mounted and bonded to a lower dielectric constant Nelco N4000 ($\varepsilon r \approx 3.4$) PCB with an onboard matching network (FIG. 15). The measured matching network loss was found to be ~1.3 dB at 2.25 GHz.

In the next step, a low-phase-noise sine wave and 12-bit 200-MS/s baseband PM digital codes were sent to an AD9779 evaluation board to generate the phase-modulated signal. The chip also included a 200-MHz clock and a 200-MS/s baseband AM digital stream from field-programmable gate array (FPGA) via the FMC interface. The PA output was then connected to the power meter and spectrum analyzer for static and dynamic measurements. For proper operation, a 10-MHz reference clock was used to synchronize the sine-wave generator and FPGA reference clock.

B. Continuous-Wave (CW) Test

Figure 17:
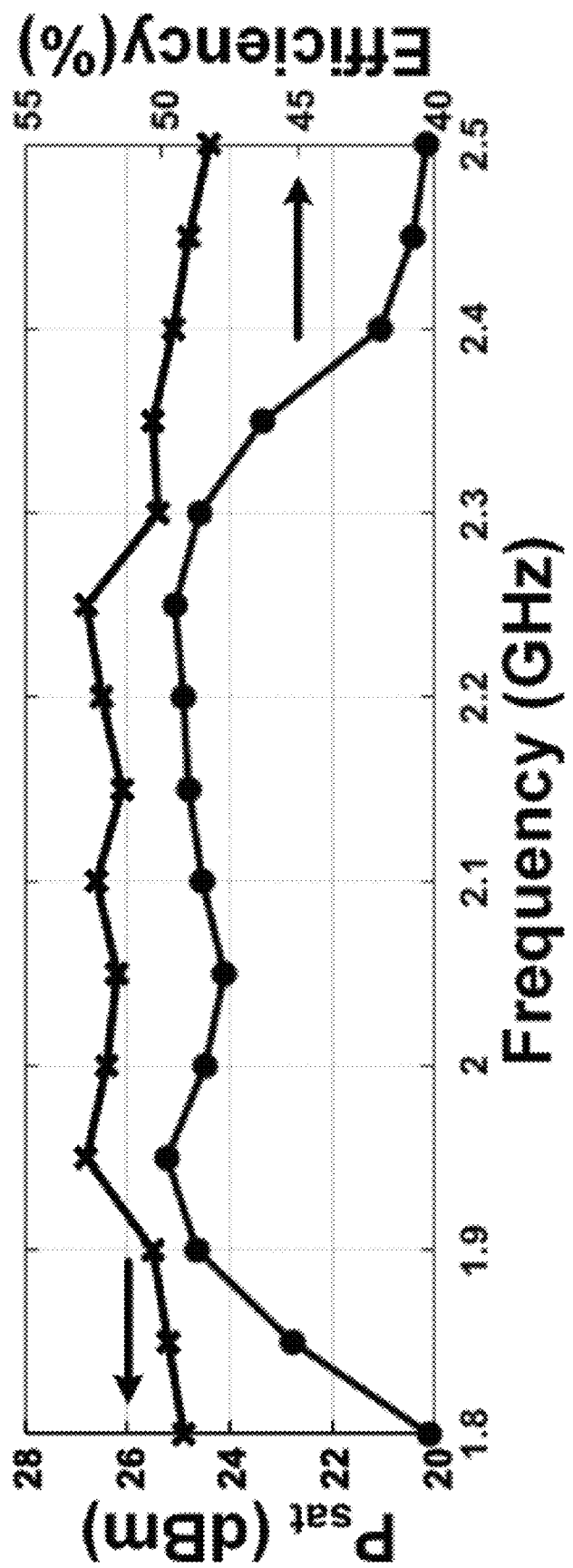
FIG. 17. Measured peak power and efficiency versus frequency.

First, we measured the maximum PA output power (Psat) and peak drain efficiency (DE) by sweeping the frequency (FIG. 17). The PA was found to deliver 26.8-dBm maximum output power and 49.3% peak DE at 2.25 GHz. The PA achieved a 3-dB bandwidth of more than 500 MHz.

Figure 18:
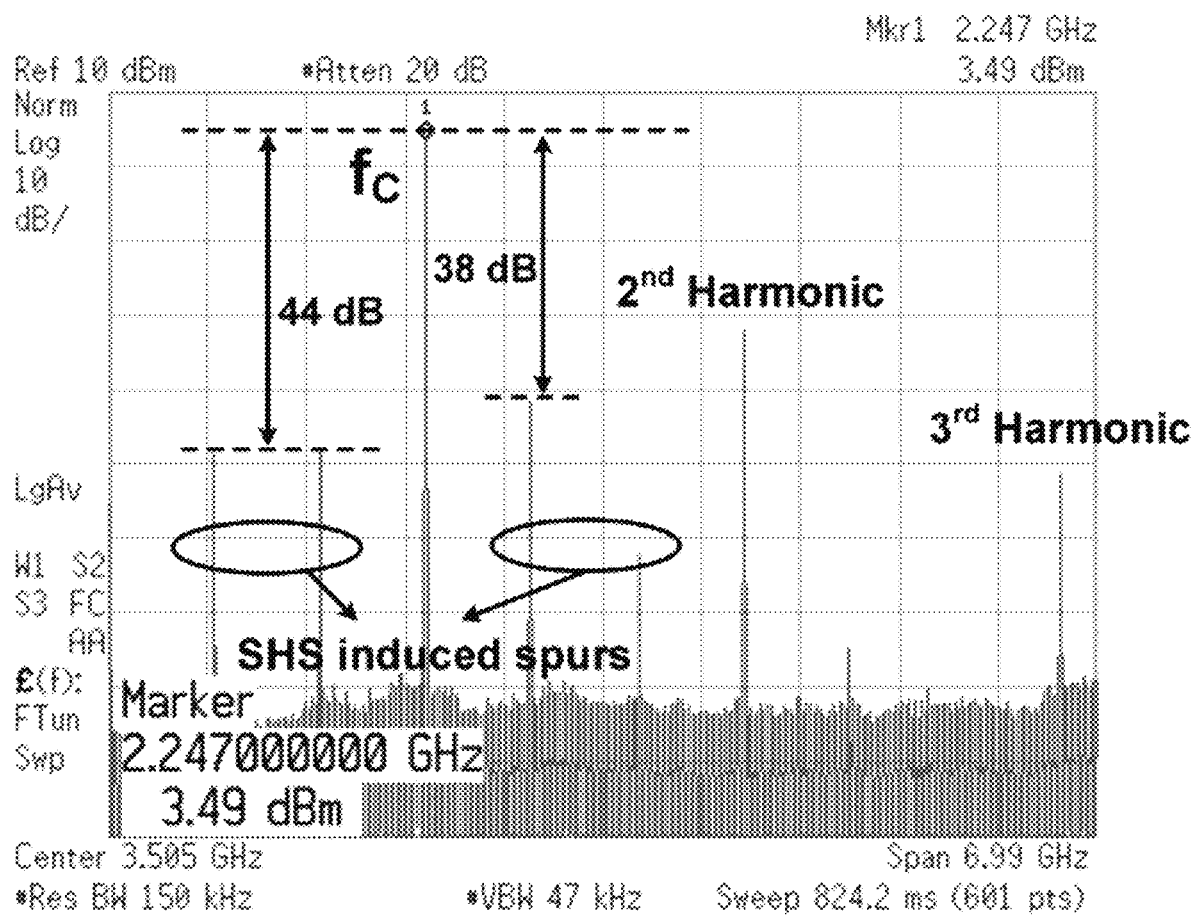
FIG. 18. Measured PA output spectrum at −13-dB PBO without any additional filtering. A 10-dB attenuator is used at the PA output in the measurement.

The measured subharmonic rejections at −13-dB PBO are shown in FIG. 18. At −13-dB PBO, all the PA cells toggle at third subharmonic, which generate the largest subharmonic tones. With the off-chip matching network, the worst spur is 38 dB lower than the desired tone at the carrier frequency.

Figure 19:
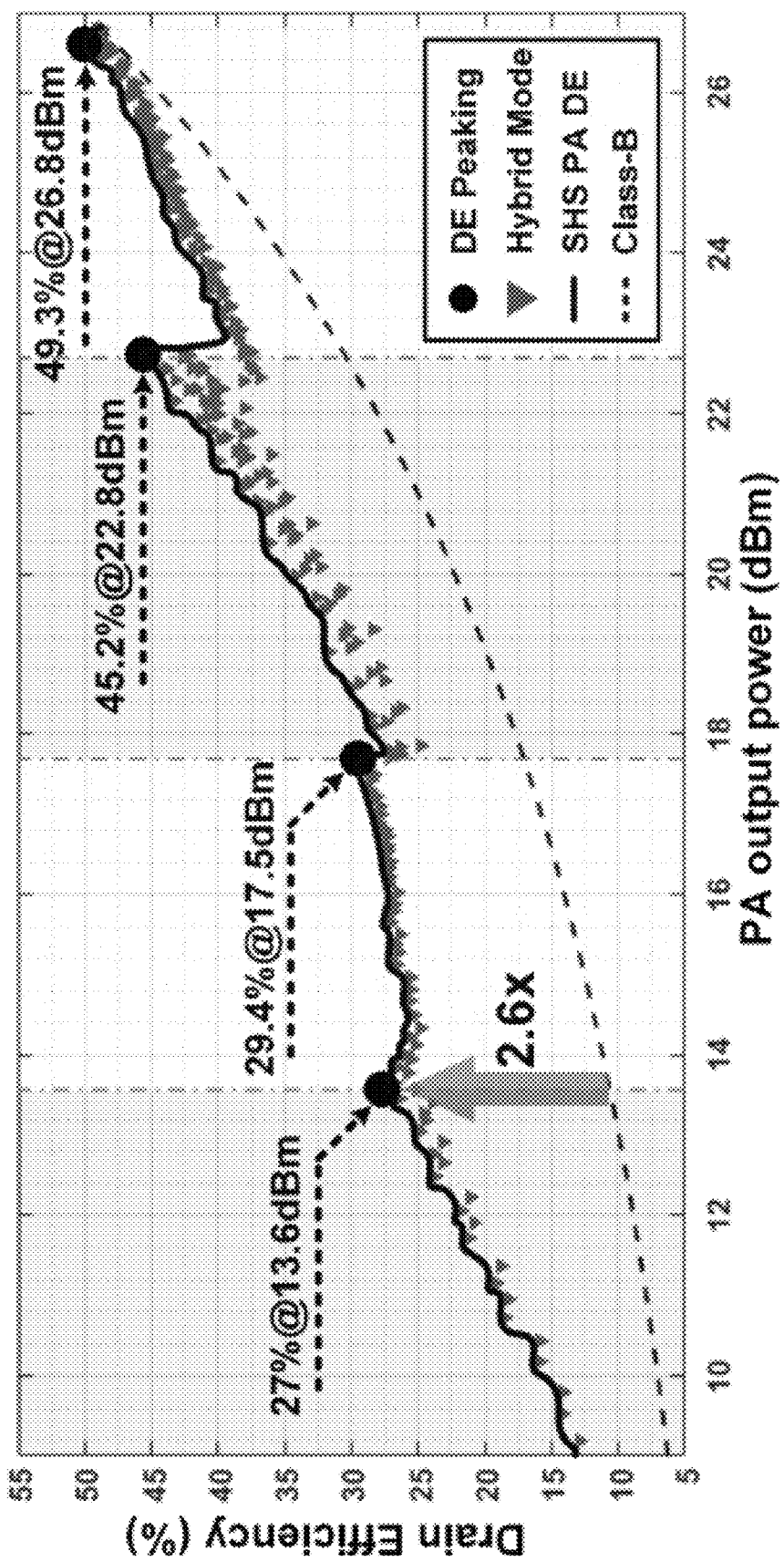
FIG. 19. Measured PA DE at 2.25 GHz versus PA Pout.

FIG. 19 shows the measured PA efficiency versus different PBO levels. We can observe four efficiency peaks thanks to SHS with the hybrid class-G operation. The measured power efficiency was found to improve by as much as 2.6× at −13-dB PBO over class-B PA, thus validating the effectiveness of the proposed SHS architecture. The measurement is based on the pre-compiled LUT, as described in Subsection I.3. As an experiment, we have compared several different SHS/class-G combinations that yield the same PA output level, i.e., multiple points at the same Pout level in FIG. 19. It is found that the operation modes pre-compiled in LUT yields better or similar efficiency.

Figure 20:
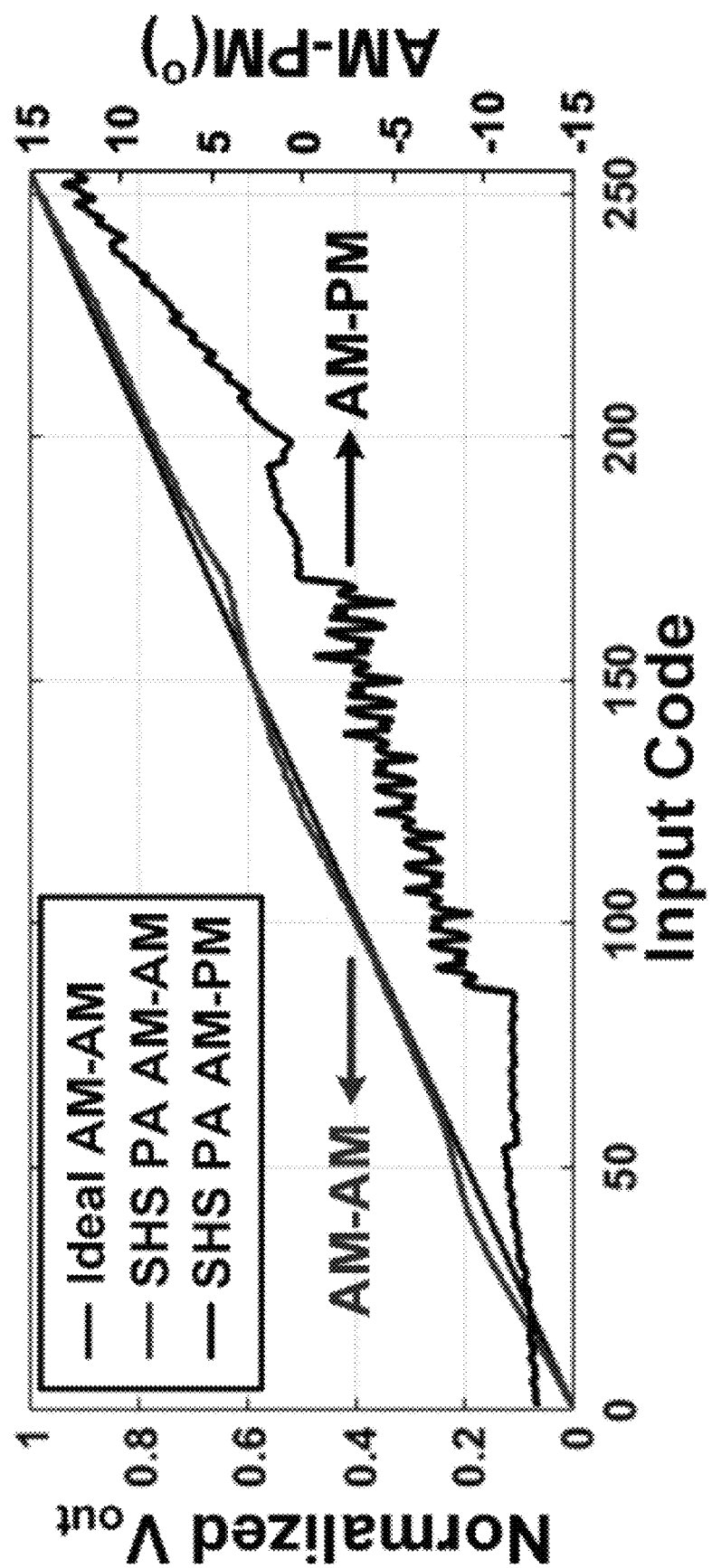
FIG. 20. Measured AM-AM and AM-PM distortions.

The AM-AM and AM-PM transfer function of the PA were measured by sweeping the amplitude codes (FIG. 20). The AM-AM performance of the PA was found to be superior because of the custom-designed precision of the MIM capacitors. Note that the AM-PM characteristic showed a few ripples between codes 85 and 169. This effect was caused by changing supplies and input-switching frequencies simultaneously between the second- and third-efficiency peaks (−3.5- to −9.5-dB PBO), which agrees well with the correct operation. The AM-AM and AM-PM characteristics were used to generate the LUTs for PA pre-distortion.

C. Dynamic Measurement

For the modulated signal measurement, the PA was first pre-distorted by the memoryless LUTs to compensate AM-AM and AM-PM distortion. The entire pre-distortion process was done on-chip. We tested the PA prototype with a 5-MHz, 52 sub-carrier, 16-QAM OFDM-modulated signal with a 7.2-dB PAPR. Under real-time operation (i.e., transmitting a set of OFDM symbols on the fly), the PA achieved an average DE of 35.7%.

Figure 21:
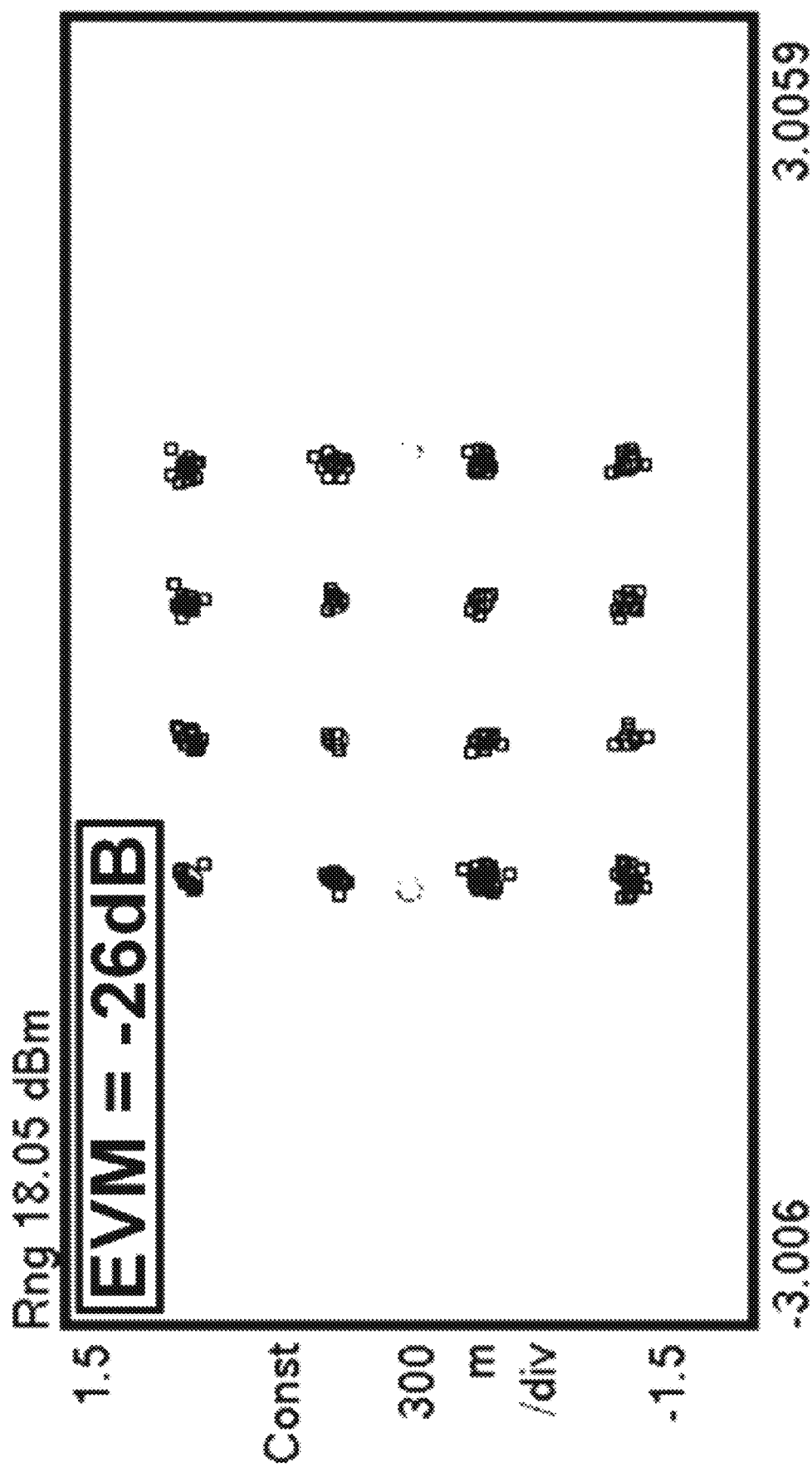
FIG. 21. Measured EVM for real-time SHS and hybrid class-G operation.
Figure 22:
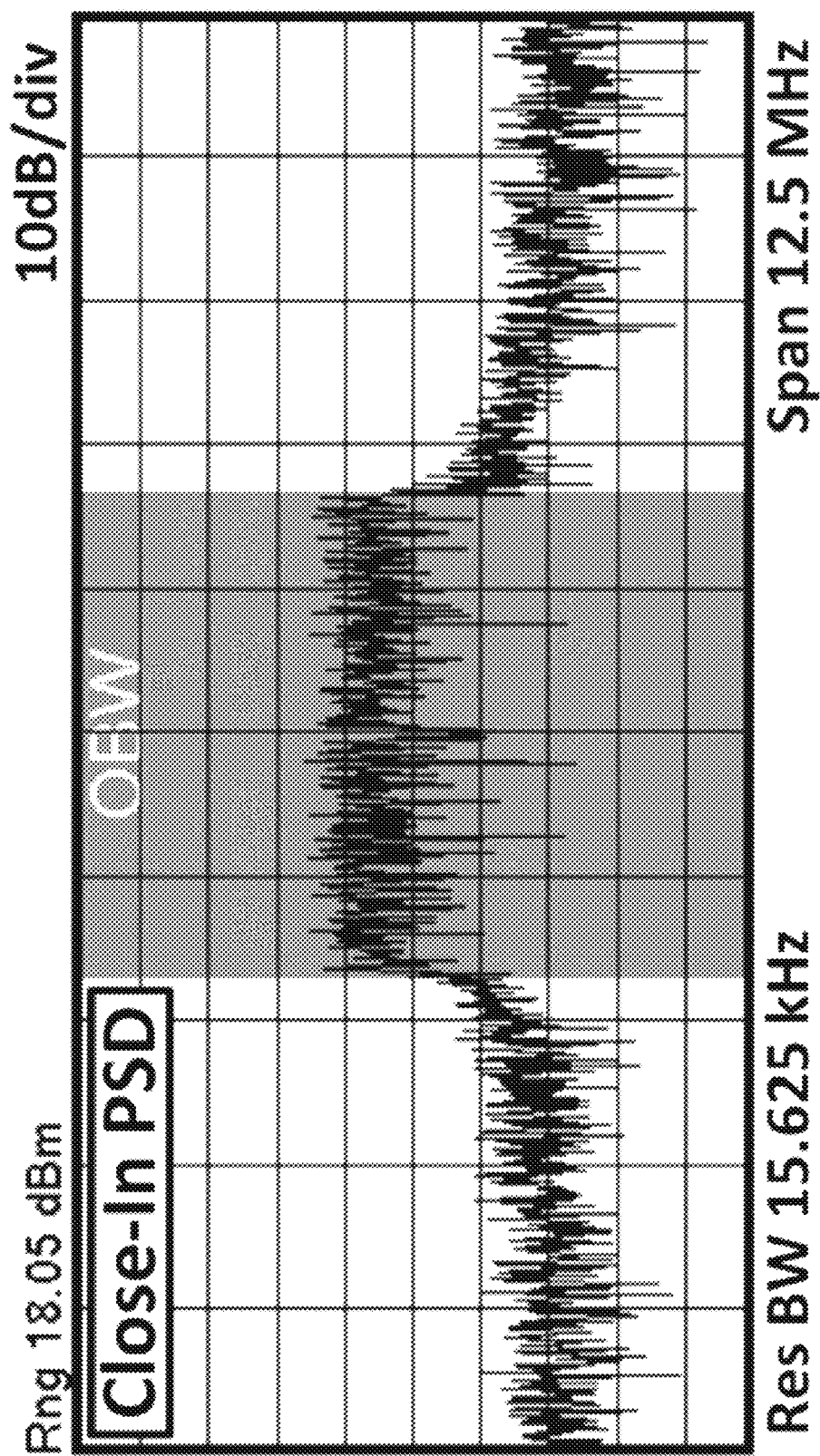
FIG. 22. Measured spectrum for real-time SHS and hybrid class-G operation.
Figure 24:
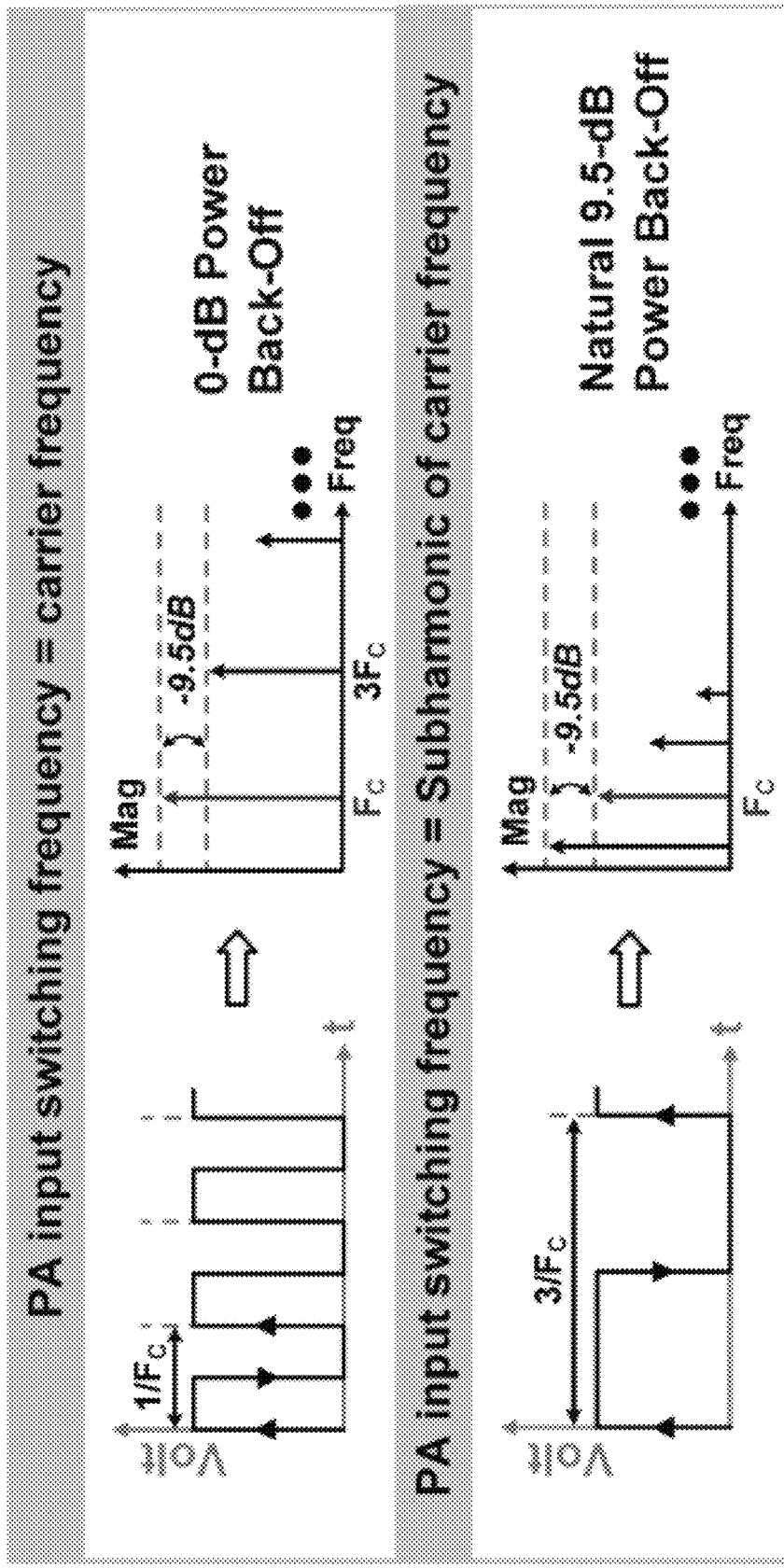
FIG. 24. SHS digital PA input waveform.

For linearity characterization, the PA in-band and out-of-band linearity values were recorded under the same real-time operation. As shown in FIG. 21, the measured EVM was found to be −26 dB. FIG. 22 shows the measured close-in PSD characteristics. The ACPR is −28 dBc before calibration and −34 dBc after calibration. The linearity can be further improved by using advanced digital pre-distortion (DPD) and memory-effect calibration. The sample rate can be increased to lower the noise spectral density. In addition, the PA linearity can be further improved by real-time 2-D LUT and memory-effect calibration.

Table I (FIG. 23) compares this paper with the state-of-the-art CMOS PAs with different PBO efficiency-enhancement techniques. Our PA delivers 26.8-dBm peak output power with a 49.3% peak DE. The −13-dB PBO DE was found to be 27%. The proposed SHS with hybrid class-G operation achieved superior PBO and average DE with comparable maximum output power.

Subsection I.5. Conclusion

The SHS PA architecture set forth in this section enhances PBO efficiency. The SHS technique can be combined with other efficiency-enhancement techniques (such as class-G operation) to further improve deep PBO efficiency. We proposed a stacking class-D driver to enlarge the output voltage swing. The PA prototype achieved superior PBO efficiency compared with the state-of-the-art CMOS PAs.

II. Watt-Level Phase-Interleaved Multi-Subharmonic Switching Digital Power Amplifier The Switching Digital Power Amplifier system of this section improves upon the system of section II. The system of section I can reduce the conduction loss of the PA, switched capacitance dynamic loss, and provide better impedance matching. However, to eliminate the unwanted subharmonic tones, additional notch filtering is required to remove those spurs, which potentially increases the order of the matching network. Although the sharp notch response may be achieved with high-Q off-chip components, doing so limits the PA bandwidth at the carrier frequency. Therefore, the present section provides a phase-interleaved architecture that inherently cancels the undesired spurs. Meanwhile, this architecture can be used to increase the peak output power of the PA, achieving watt-level output power. Moreover, based on the SHS concept, a multi-SHS technique is provided to create a larger number of efficiency peaks over a deeper PBO region, which enhances the PA average efficiency as well as supports a higher PAPR signal. Finally, the proposed architecture can be further combined with other efficiency-enhancement techniques to improve the average efficiency.

Subsection II.1. Proposed Multi-Subharmonic Switching Technique

A. Proposed Multi-SHS Operation

Figure 25:
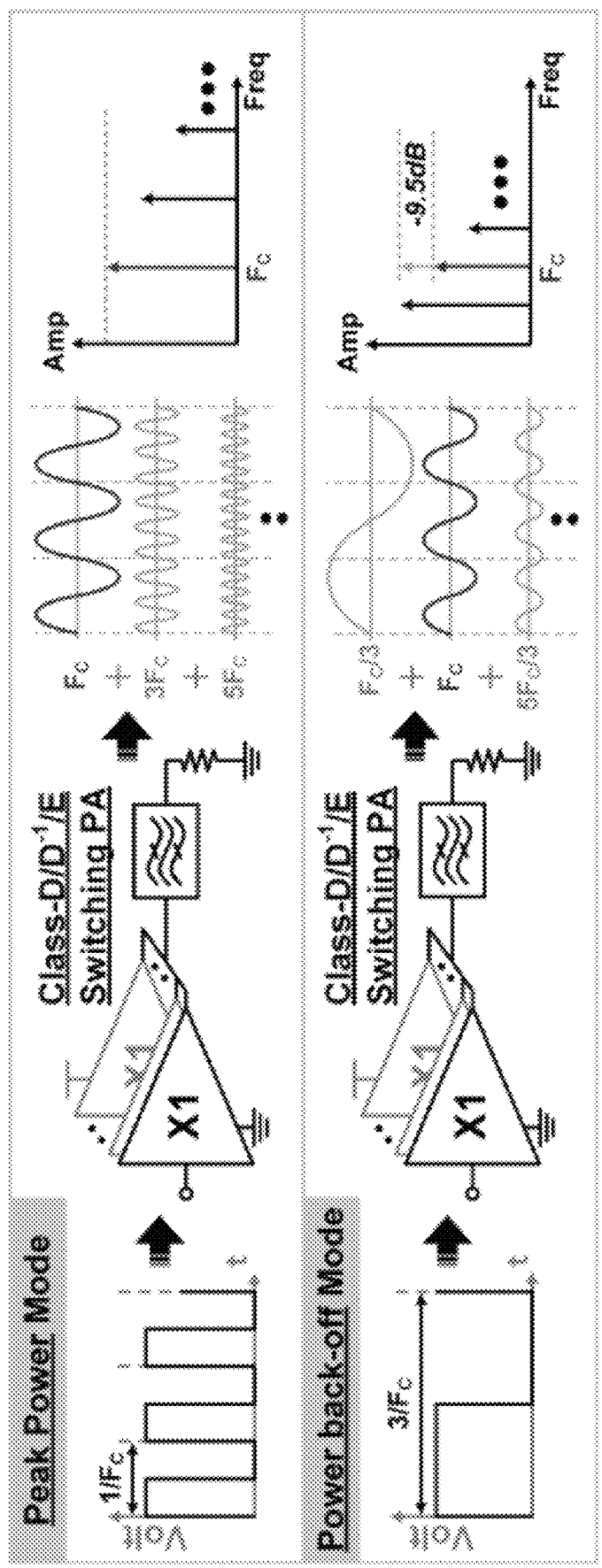
FIG. 25. SHS digital PA operation.

We first briefly review the concept of the SHS PA, as shown in FIG. 25. In the peak power mode, the PA switching frequency equals the carrier frequency. The matching network picks up the fundamental of the square waveform as the carrier frequency. As we notice here, the input switching waveform is a square wave, and it contains odd-harmonic components, assuming it is a 50% duty cycle. The power profile of the harmonics is in the descending order (i.e., the third harmonic is lower than the fundamental tone, and the fifth harmonic is even lower).

The PA works in the SHS region when the PA toggles at a subharmonic of the carrier frequency and chooses the harmonic as the carrier frequency. It naturally achieves PBO without turning off the PA cells or reducing the power supply. For example, if we use the third subharmonic, Fc/3, to toggle the PA cells, its third-harmonic component, i.e., Fc, equates the carrier frequency. In this case, the output power at Fc is 10·log 10((⅓)2) dB lower due to the square switching waveform and, hence, achieves PBO. Extending from the SHS PA concept, we propose a multi-SHS scheme by using multiple SHS waveforms, that is, there are multiple toggling frequency candidates for each PA driver cell. The selection of the actual toggling frequency depends on the intended PBO level. In other words, each PA driver cell can toggle at Fc/3, 2Fc/3, or Fc. In the SHS PA, we have shown that Fc/3 waveform can be generated via a divide-by-three circuit.

Figure 26:
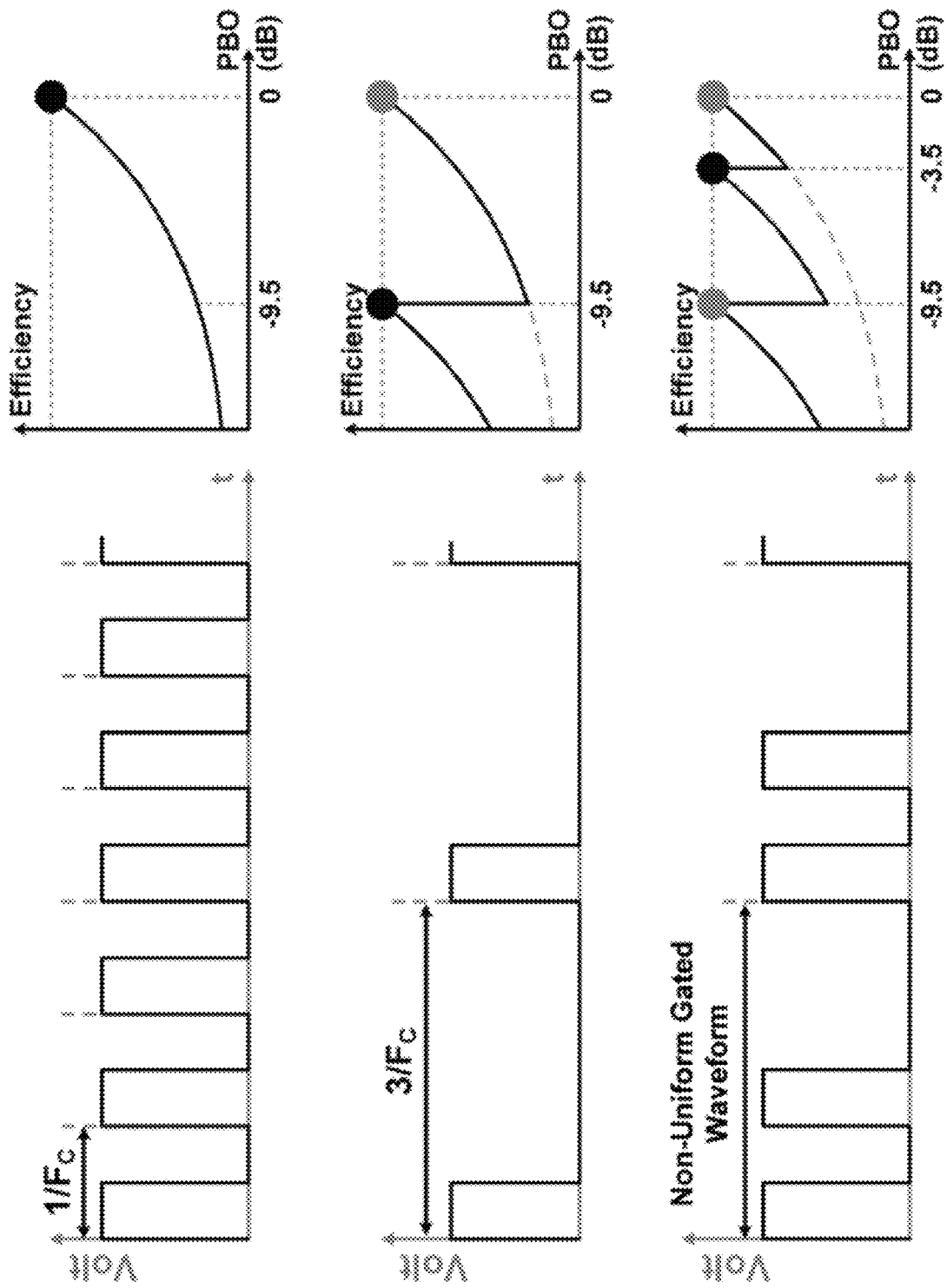
FIG. 26. Switching waveforms of the proposed multi-subharmonic operation.

To generate 2Fc/3 for a multi-SHS PA, we propose a non-uniform gating scheme to create the switching waveform. As shown in FIG. 26, if we non-uniformly gate off one of the pulses at Fc, it naturally derives the frequency of 2Fc/3. All the PA driver cells simultaneously toggle twice every three cycles. The output power possesses 10·log 10((⅔)2) less power compared to peak power mode. Assuming the PA unit cell is lossless, the whole PA architecture can lead to an efficiency peak at the −3.5-dB PBO point. More details of the efficiency peak will be addressed in Subsection II.1.B. Note that the proposed non-uniform gating scheme allows a simple implementation, as a window function can be directly gated with the original waveform at the carrier frequency (Fc), avoiding the need for a fractional-N frequency synthesizer. In addition, the same scheme can be easily extended to use deeper subharmonics, such as Fc/5, 2Fc/5, and 3Fc/5, and creates even more efficiency peaks.

B. Efficiency Enhancement in a Multi-SHS Digital PA

In this subsection, we analyze the efficiency enhancement using a multi-SHS PA. There are three efficiency-enhancement mechanisms in an SHS digital PA, including PA conduction loss, impedance matching, and dynamic loss in a switched capacitor bank. More detailed derivations can be found in [27]. A multi-SHS PA has the same efficiency-enhancement mechanism for PA conduction loss and impedance matching. The switched capacitor dynamic loss is different compared to the SHS digital PA. We focus on the dynamic loss savings to validate the multiple efficiency peaks created by the multi-SHS scheme.

Figure 27:
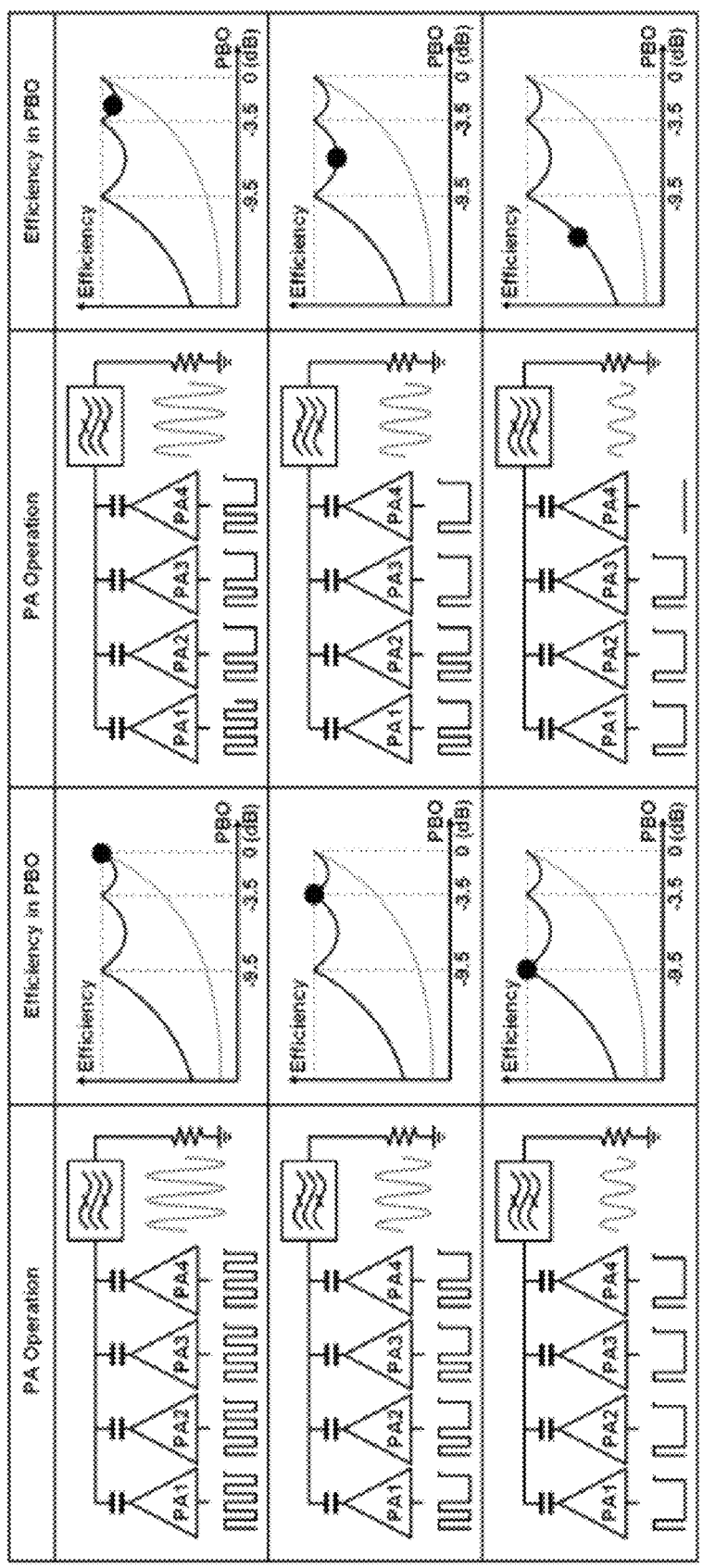
FIG. 27. Multi-SHS digital PA at different output power levels.

FIG. 27 shows the multi-SHS switched-capacitor PA (SCPA) in different power regions. The efficiency can be improved by operating different subharmonics between the efficiency peaks. To derive the power and efficiency equations under a multi-SHS scheme, the conventional SCPA output power and drain efficiency (DE) equations considering the switched capacitor dynamic loss are repeated here [28]

$$\begin{cases} P_{SC} = \dfrac{n(N-n)}{N^2} CV_{DD}^2 F_C \\ P_{out} = \dfrac{2}{\pi^2}\left(\dfrac{n}{N}\right)^2 \dfrac{V_{DD}^2}{R_L} \\ \eta_D = \dfrac{P_{out}}{P_{out}+P_{SC}} = \dfrac{1}{1+\dfrac{\pi(N-n)}{4}\dfrac{1}{n}\dfrac{1}{Q_{LOAD}}} \\ Q_{LOAD} = \dfrac{2\pi F_C L}{R_L} = \dfrac{1}{2\pi F_C C R_L} \end{cases} \quad (2.1)$$

dynamic power loss PSC and output power Pout are shown in equation (2.1).

Here, we will derive theoretical efficiency and dynamic loss of multi-SHS in the representative PBO. We assume that (N-M) and M of the PA cells will toggle at the frequency of FSH1 and FSH2, respectively. By design, {FSH1 and FSH2} is the subset of adjacent frequency candidates, namely, fundamental, subharmonic frequencies, and 0, where FSH1>FSH2. Note that when the toggling frequency is zero, it indicates that the PA cell does not toggle. Next, a generalized multi-SHS PA dynamic loss, output power, and efficiency can be derived as $$\begin{cases} P_{SC} = \dfrac{M(N-M)}{N^2} CV_{DD}^2 (F_{SH1}-F_{SH2}) \\ P_{out} = \dfrac{2}{\pi^2}\left(\dfrac{N-M}{N}\dfrac{F_{SH1}}{F_C}+\dfrac{M}{N}\dfrac{F_{SH2}}{F_C}\right)^2 \dfrac{V_{DD}^2}{R_L} \\ \eta_D = \dfrac{P_{out}}{P_{out}+P_{SC}} \\ = \dfrac{1}{1+\dfrac{\pi M(N-M)F_C(F_{SH1}-F_{SH2})}{4}\dfrac{1}{[(N-M)F_{SM1}+MF_{SM2}]^2 Q_{LOAD}}} \end{cases} \quad (2.2)$$

While (2.2) describes a general case of multi-SHS PA, our silicon prototype uses the third-subharmonic frequencies, i.e., the toggling frequency candidates include Fc, 2Fc/3, Fc/3, and 0. As shown in FIG. 27, when the PA operates between 0- and −3.5-dB PBO, a portion of the PA cells starts to toggle at 2Fc/3, while the rest toggle at Fc. The frequency difference results in some charge redistribution and, thus, introduces some energy loss in the capacitor bank. When the PA operates between −3.5- and −9.5-dB PBO, the PA cells toggle at either 2Fc/3 or Fc/3. The dynamic loss is smaller compared to that of the conventional SHS PA. When the PA operates at the <−9.5-dB PBO region, a portion of PA cells starts to turn off, resulting in efficiency roll-off. The PA efficiency and output power follow those of the SHS PA [27]. The ideal efficiency under different PBO regions can be expressed as $$\begin{cases} \eta_D = \dfrac{1}{1+\dfrac{\pi\,n(N-M)}{4(N-M/3)^2}\dfrac{1}{Q_{LOAD}}}, & P_{out}\in 0\sim -3.5\text{ dB} \\ \eta_D = \dfrac{1}{1+\dfrac{\pi 3M(N-M)}{4(2N-M)^2}\dfrac{1}{Q_{LOAD}}}, & P_{out}\in -3.5\sim -9.5\text{ dB} \\ \eta_D = \dfrac{1}{1+\dfrac{\pi\,(N-M)}{4}\dfrac{1}{M/3}\dfrac{1}{Q_{LOAD}}}, & P_{out}\in -9.5\sim -13\text{ dB} \end{cases} \quad (2.3)$$

Figure 28:
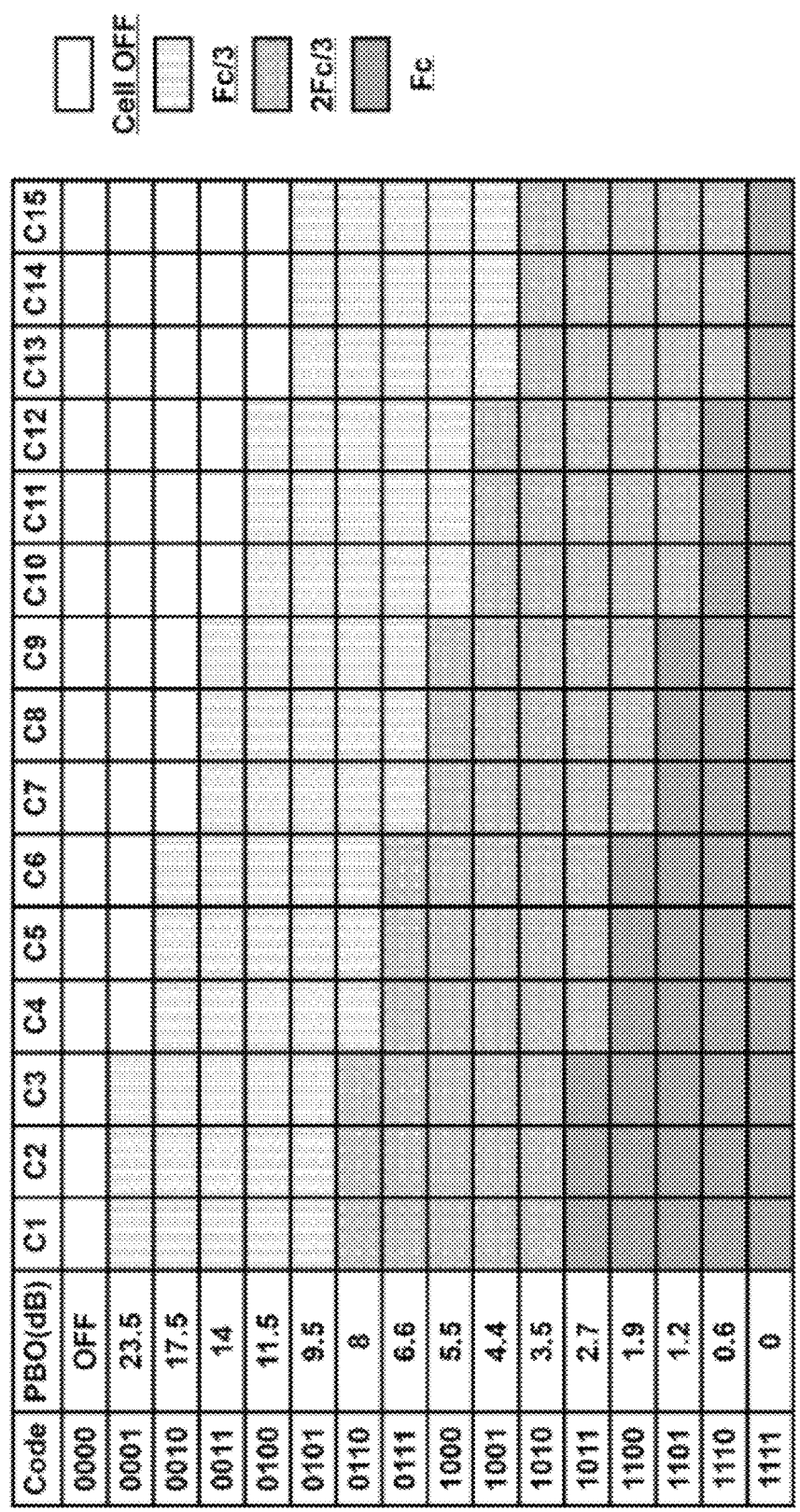
FIG. 28. Example of a multi-SHS digital PA operation table.

FIG. 28 shows the 4-bit multi-SHS lookup table (LUT) to illustrate the operation, while the actual implementation is 8-bit with class-G. The general LUT design guideline is to minimize the equivalent capacitance, which requires more PA unit cells to be turned on simultaneously. Note that at certain output power level, the PA cells can operate with different subharmonics. With this hybrid operation, efficiency between the peaks can be optimized as well.

Figure 29:
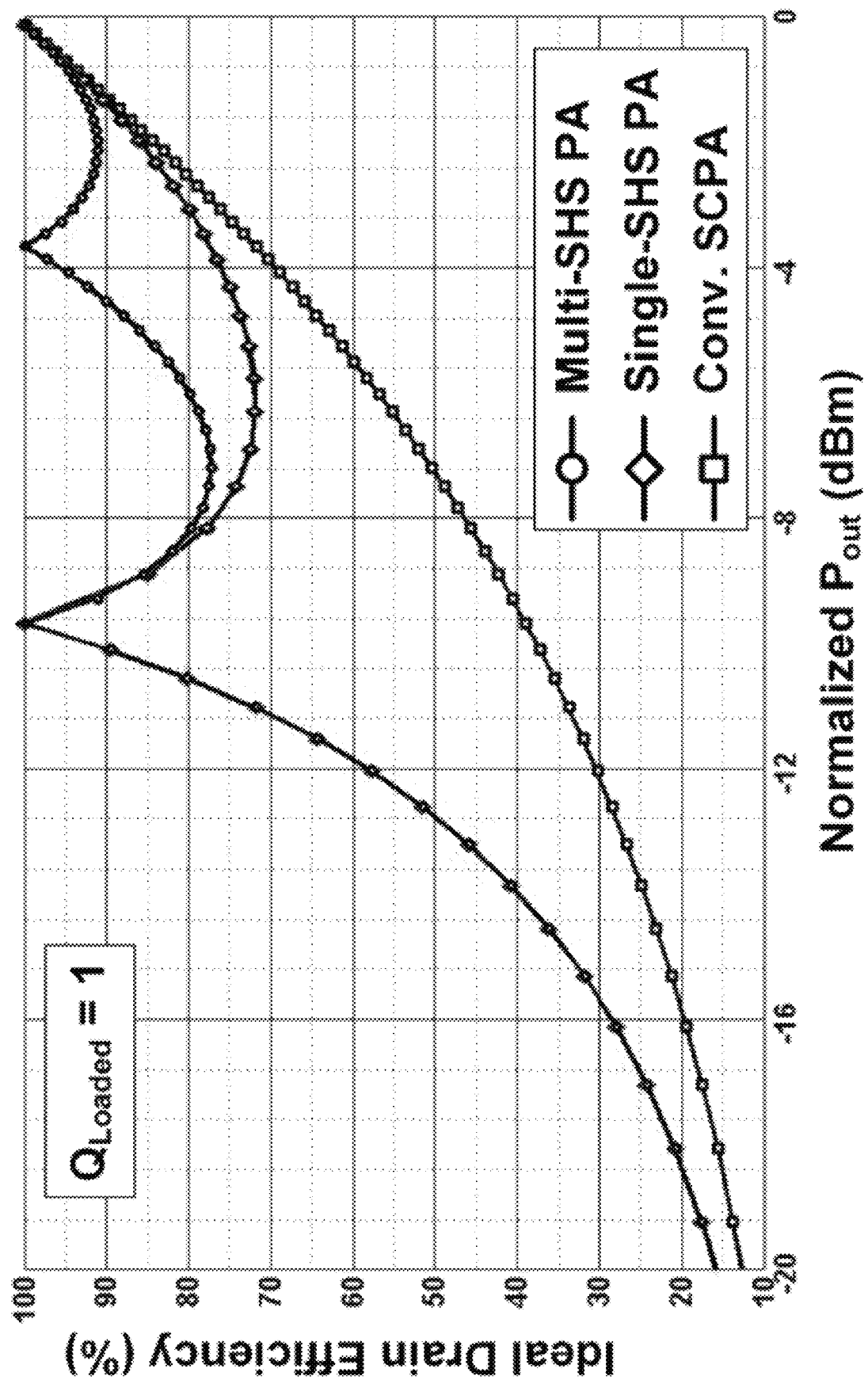
FIG. 29. Ideal efficiency of multi-SHS PA architecture versus Pout and for single-SHS PA and conventional SCPA.

The efficiency tradeoffs with Pout for multi-SHS, single-SHS digital PA, and conventional SCPA are plotted in FIG. 29. In this comparison, the loaded quality factor QLoaded is fixed to 1. The PBO efficiency curve indicates that the multi-SHS PA PBO efficiency is always higher than other alternative architectures. Note that the multi-SHS can further combine with other efficiency-enhancement techniques to improve the deep PBO efficiency.

C. Phase-Interleaved Subharmonics Inherent Cancellation

Unwanted subharmonics can violate the mask and degrade the PA efficiency if they appear at the transmitter output waveform. These spurs can cause reciprocal mixing or violate the emission mask [29]. Notch filtering embedded in the matching network is required, which inevitably increases the matching order and complexity. It becomes worse when we use the multi-SHS scheme, as there are multiple subharmonic frequencies to be notched. We propose the phase-interleaved PA architecture to cancel the undesired subharmonics before the power combiner without introducing additional power loss.

Figure 30:
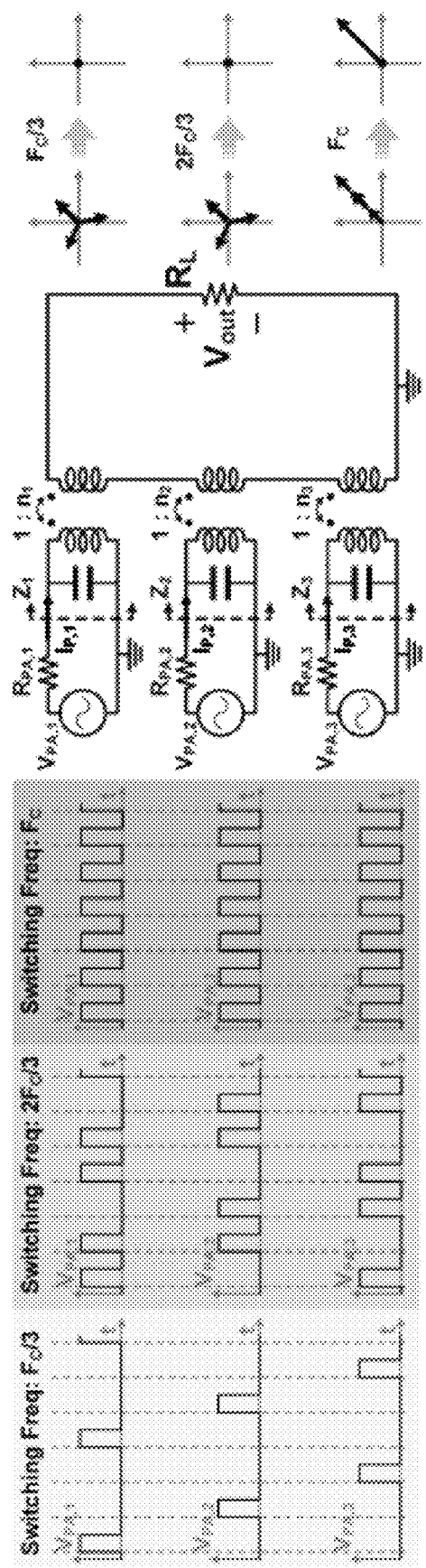
FIG. 30. Equivalent circuit model of ideal three-way phase-interleaved multi-SHS PA with different input switching waveforms.

FIG. 30 shows the phase-interleaved power combining under two different input switching waveforms. Assuming the PA voltage signal is VPA,i (i=1, 2, 3) and the PA output impedance is RPA,i, the current in the primary winding of the transformers can be calculated by using the superposition theorem [30]. The primary current of the three-way transformer-based combiner can be written as $$I_{p,i} = \frac{n_i(n_1 V_{PA,1} + n_2 V_{PA,2} + n_3 V_{PA,3})}{R_L + (n_1^2 R_{PA,1} + n_2^2 R_{PA,2} + n_3^2 R_{PA,3})}. \quad (2.4)$$

The output impedance is RL, and the transformer turn ratio is ni. The transformer impedance seen by each PA becomes $$Z_i = \frac{(R_L + (n_1^2 R_{PA,1} + n_2^2 R_{PA,2} + n_3^2 R_{PA,3}))V_{PA,i}}{n_i(n_1 V_{PA,1} + n_2 V_{PA,2} + n_3 V_{PA,3})} - R_{PA,i}. \quad (2.5)$$

It is clear that the transformer impedance seen by each PA is related to load impedance RL and the output voltage signal (the magnitude and the phase) of all the PA cells. Based on the observation, if the summation of the three voltage signals becomes zero, then the impedance seen by each PA is infinity, which can potentially reject the unwanted subharmonics. Assuming the turn ratio ni of the three coils is equal to n, three PAs have the same output impedance RPA; when the three PA voltage signals are in phase, the primary current of each PA cell can be written as $$I_p = \frac{n^2(A_{PA,1} + A_{PA,2} + A_{PA,3})\sin(\omega t)}{R_L + 3n^2 R_{PA}}. \quad (2.6)$$

The transformer impedance can be written as $$Z_i = \frac{(R_L + 3n^2 R_{PA})A_{PA,i}\sin(\omega t)}{n^2(A_{PA,1} + A_{PA,2} + A_{PA,3})\sin(\omega t)} - R_{PA}. \quad (2.7)$$

The current waveform and the voltage waveform are in phase. The transformer impedance seen by each PA is identical. The power is combined at the secondary winding side. If the three PA voltage signals are 120° apart, then the primary current becomes $$I_p = \frac{n^2}{R_L + 3n^2 R_{PA}} \quad (2.8)$$

$$\left(A_{PA,1}\sin(\omega t) + A_{PA,2}\sin\left(\omega t + \frac{2\pi}{3}\right) + A_{PA,3}\sin\left(\omega t + \frac{4\pi}{3}\right)\right).$$

As observed in (11), if three PAs present the same magnitude A, the primary current becomes zero in this condition. In other words, output impedance Zi seen by the PA is infinity, and the unwanted signal gets rejected from the primary side with a certain phase difference. Although the voltage signal is non-zero, the power loss, which equals the integration of the voltage multiplied by the current, becomes zero due to zero primary current. More importantly, as long as the summation of the three PA voltage signals becomes zero, the RL value will not affect the results of the cancellation. In other words, the cancellation of the subharmonic component is effective over different voltage standing wave ratios (VSWRs).

Based on the discussions in this subsection, if the desired carrier frequency component is in phase and the subharmonic frequencies are out of phase, we can combine the output power at the desired frequency and inherently cancel the unwanted subharmonics. The phasors in FIG. 30 show inherent cancellation in Fc/3 and 2Fc/3 frequency components, while the Fc frequency components are added coherently. The phase-interleaved Fc/3 and 2Fc/3 square waves contain Fc/3 components 120° apart and 2Fc/3 components 240° apart, where the Fc components are combined in phase. In conclusion, all the unwanted subharmonics components are nullified, except for the residual errors due to magnitude and phase mismatches, which will be discussed in the following.

1) Amplitude Mismatch:

So far, we assume all three PA banks are identical. However, in a real implementation, there will be mismatches between different PA banks. PA magnitude and phase errors can degrade the effectiveness of the inherent cancellation, as we can observe from the measurement results. Here, we first analyze the impact of magnitude mismatches on the PA output spectrum. Considering one of the PA magnitudes now becomes (A+ΔA), the corresponding current and voltage at Fc/3 derived from (2.7) can be written as $$\begin{cases} I_p\left(\frac{\omega_C}{3}t\right) = \frac{n^2}{R_L + 3n^2 R_{PA}} \sum_{i=1}^{3} V_{PA,i}\left(\frac{\omega_C}{3}t\right) \\ V_{PA,1}\left(\frac{\omega_C}{3}t\right) = (A + \Delta A)\sin\left(\frac{\omega_C}{3}t\right) \\ V_{PA,2}\left(\frac{\omega_C}{3}t\right) = A\sin\left(\frac{\omega_C}{3}t + \frac{2\pi}{3}\right) \\ V_{PA,3}\left(\frac{\omega_C}{3}t\right) = A\sin\left(\frac{\omega_C}{3}t + \frac{4\pi}{3}\right) \end{cases} \quad (2.9)$$

The subharmonic power, PSH,i, is the integration of the product of the voltage and current at subharmonic $$\begin{cases} P_{SH,1} = \int_0^{2\pi} I_p\left(\frac{\omega_C}{3}t\right)V_{PA,1}\left(\frac{\omega_C}{3}t\right) = \frac{\pi \Delta A(A + \Delta A)n^2}{R_L + 3n^2 R_{PA}} \\ P_{SH,2} = \int_0^{2\pi} I_p\left(\frac{\omega_C}{3}t\right)V_{PA,2}\left(\frac{\omega_C}{3}t\right) = -\frac{\pi}{2}\frac{\Delta A \cdot An^2}{R_L + 3n^2 R_{PA}} \\ P_{SH,3} = \int_0^{2\pi} I_p\left(\frac{\omega_C}{3}t\right)V_{PA,3}\left(\frac{\omega_C}{3}t\right) = -\frac{\pi}{2}\frac{\Delta A \cdot An^2}{R_L + 3n^2 R_{PA}} \end{cases} \quad (2.10)$$

Assuming the transformer is lossless, the total subharmonic power PSH at the undesired subharmonic can be written as $$P_{SH} = \Sigma_{i=1}^{3} P_{SH,i} = \frac{\pi \cdot \Delta A^2 n^2}{R_L + 3n^2 R_{PA}}. \quad (2.11)$$

We can observe that the undesired power due to gain mismatch is proportional to ΔA2. The corresponding current and voltage amplitudes at Fc are three times smaller than the subharmonic $$\begin{cases} I_p(\omega_C t) = \frac{n^2}{R_L + 3n^2 R_{PA}} \frac{\Delta A}{3} \sin(\omega_C t) \\ V_{PA,1}(\omega_C t) = \frac{A + \Delta A}{3} \sin(\omega_C t) \\ V_{PA,2}(\omega_C t) = \frac{A}{3} \sin(\omega_C t) \\ V_{PA,3}(\omega_C t) = \frac{A}{3} \sin(\omega_C t) \end{cases} \quad (2.12)$$

Similar to (2.10), the total output power considering the amplitude mismatch at Fc becomes $$P_{out} = \Sigma_{i=1}^{3} P_{PAi} = \frac{\pi \cdot (3A + \Delta A)^2 \cdot n^2}{9 \cdot (R_L + 3n^2 R_{PA})}. \quad (2.13)$$

Therefore, the amplitude mismatch-induced SFDR becomes $$SFDR = 10 lg \frac{P_{out}}{P_{SH}} = 20 lg \frac{3A + \Delta A}{3 \cdot \Delta A}. \quad (2.14)$$

From (2.14), one can calculate the amplitude mismatch requirement for this PA architecture. As an example, when ΔA/A~1%, SFDR is roughly 40 dB. To meet the mask and EMI/EMC requirement, the proposed non-overlapping clock is utilized to calibrate the amplitude difference of each path.

2) Phase Mismatch:

Next, we discuss the effect of the phase error. Assuming all the three PAs are matched, except that one PA presents a phase offset Δθ, the current and voltage equations are $$\begin{cases} I_p(\omega_C t) = \frac{An^2}{R_L + 3n^2 R_{PA}} \Sigma_{i=1}^{3} V_{PA,i}(\omega_C t) \\ V_{PA,1}(\omega_C t) = A\sin(\omega t + \Delta\theta) \\ V_{PA,2}(\omega_C t) = A\sin\left(\omega t + \frac{2\pi}{3}\right) \\ V_{PA,3}(\omega_C t) = A\sin\left(\omega t + \frac{4\pi}{3}\right) \end{cases} \quad (2.15)$$

Similarly, the subharmonic power of each PA can be expressed as $$\begin{cases} P_{SH,1} = \frac{n^2 A^2 \pi}{R_L + 3n^2 R_{PA}}(1 - \cos(\Delta\theta)) \\ P_{SH,2} = \frac{n^2 A^2 \pi}{R_L + 3n^2 R_{PA}}\left(\frac{1}{2} - \frac{1}{2}\cos(\Delta\theta) + \frac{\sqrt{3}}{2}\sin(\Delta\theta)\right) \\ P_{SH,3} = \frac{n^2 A^2 \pi}{R_L + 3n^2 R_{PA}}\left(\frac{1}{2} - \frac{1}{2}\cos(\Delta\theta) - \frac{\sqrt{3}}{2}\sin(\Delta\theta)\right) \end{cases} \quad (2.16)$$

As a result, the total subharmonic power PSH become $$P_{SH} = \Sigma_{i=1}^{3} P_{SH,i} = \frac{2n^2 A^2 \pi}{R_L + 3n^2 R_{PA}}(1 - \cos(\Delta\theta)). \quad (2.17)$$

From (2.17), it shows that the power at the unwanted subharmonic frequency is a function of cos(Δθ), which is relatively insensitive when the phase error is small.

Similar to the derivation of amplitude mismatch, the total output power considering the amplitude mismatch at Fc becomes $$P_{out} = \Sigma_{i=1}^{3} P_{PA,i} = \frac{\pi \cdot A^2 \cdot n^2 \cdot (5 + \cos(3\Delta\theta))}{9 \cdot (R_L + 3n^2 R_{PA})}. \quad (2.18)$$

Therefore, the amplitude mismatch-induced SFDR becomes $$SFDR = 10 \log \frac{P_{out}}{P_{SH}} = 10 \log \frac{5 + 4\cos(3\Delta\theta)}{18(1 - \cos(\Delta\theta))}. \quad (2.19)$$

From (2.19), when Δθ equals 1.8° at Fc, it yields roughly 40-dB SFDR. The phase detector and tunable delay cells are implemented on-chip to calibrate the phase mismatch between different channels. The delay cells have a 0.2-ps tuning resolution with 2-ns tuning range, i.e., 10-bit resolution.

Note that the calculated SFDR, since both amplitude mismatch and phase mismatch assume the matching network and antenna, presents an all-pass response. In reality, additional attenuation can be achieved via matching network and antenna's selectivity, which suggests better SFDR between fundamental and subharmonic components.

In the real implementation, there are more mismatch sources, such as PA output impedance RPA and transformer coupling factor ni, which can be analyzed in a similar analysis strategy. In addition, due to the associated parasitic inductance from the transformer, the current at the subharmonics is non-zero. Fortunately, the current waveform remains 90° out-of-phase with the voltage waveform, and thus, it still achieves the cancellation and zero power loss.

Subsection II.2. Multi-SHS and Hybrid Class-G Operation

The phase-interleaved multi-SHS operation can be further combined with other existing efficiency-enhancement techniques to further improve the average efficiency under different PAPRs. All three PA banks must maintain the same input switching pattern and the same supply configuration to guarantee that the output power of each PA bank is identical, which results in effective cancellation on all the subharmonics, as the equations shown in Subsection II.1.

In this subsection, we introduce a multi-SHS digital PA with the hybrid class-G operation to optimize efficiency for different PAPR signals. The class-G operation changes the power supply of each PA driver to create different output power levels. In the real implementation, we chose either 2VDD or 3VDD for class-G, and either Fc/3 or 2Fc/3 for multi-SHS, to achieve five ideal efficiency peaks located at 0, −3.5, −7.0, −9.5, and −13 dB (see FIG. 31). The efficiency between the peaks can be further improved by toggling the cells of each PA with different supplies and input switching frequencies.

Figure 31:
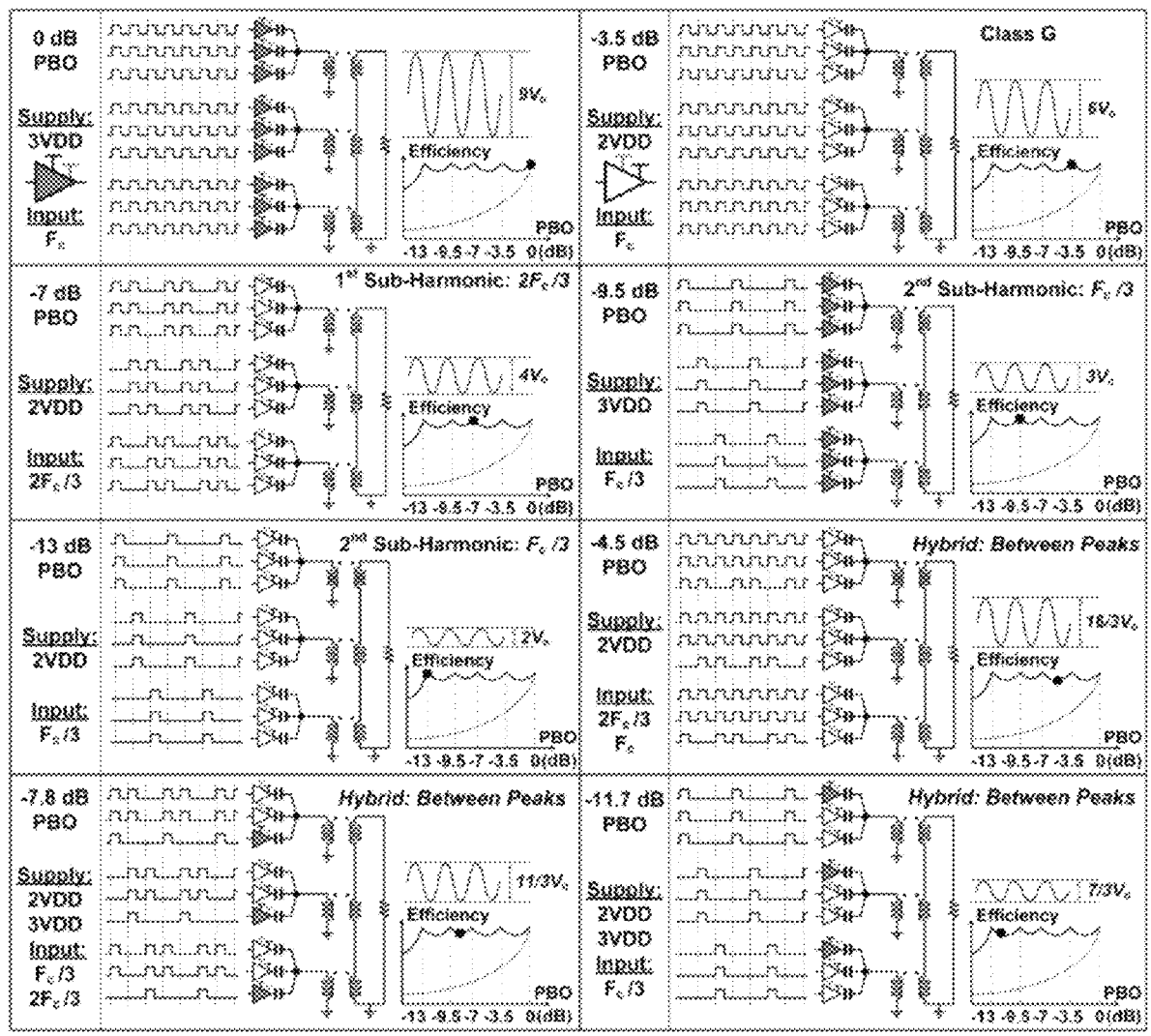
FIG. 31. Complete phase-interleaved multi-SHS digital PA with the hybrid class-G operation.

In addition, the efficiency between the peaks can be further improved by toggling the cells of each PA with different supplies and input switching frequencies (see FIG. 31). To optimize the efficiency between the peaks, the general guideline is to reduce the equivalent capacitance from the capacitor bank and minimize the toggling overhead. From 0- to −3.5-dB PBO, the hybrid class-G operation is utilized to create the PBO and enhance efficiency. From −3.5- to −7-dB PBO, all the PA cells are tied to 2VDD but with different input switching frequencies. As an example, shown in FIG. 31, two PA cells toggle with Fc, and one PA cell toggles at 2Fc/3 at −4.5-dB PBO. Note that all three PA banks must keep the same configuration to maintain the same output power. Therefore, the subharmonic inherent cancellation requirement can be satisfied.

Between −7- and −9.5-dB PBO, all the PA cells toggle at different supplies and input switching frequencies. For example (see FIG. 31), in each PA bank, two PA cells toggle at 2Fc/3 with 2VDD, and one PA cell toggles at Fc/3 with 3VDD at −7.8-dB PBO. From −9.5- and −13-dB PBO, all the PA cells have the same input switching frequency, Fc/3, and different supplies. In FIG. 31, all the PA cells toggle at Fc/3 with the 2VDD and 3VDD supplies, which creates −11.7-dB PBO. Based on the optimal efficiency value, we determine the combination of different supplies and switching frequencies. Note that the phase-interleaved subharmonic cancellation is effective for all amplitude levels, as the input waveforms of each PA bank are the same except for the 120° phase shift between them. The compiled LUT is fully synthesized in the multi-SHS block.

Subsection II.3. Circuit Implementation

A. Overall Block Diagram

Figure 32:
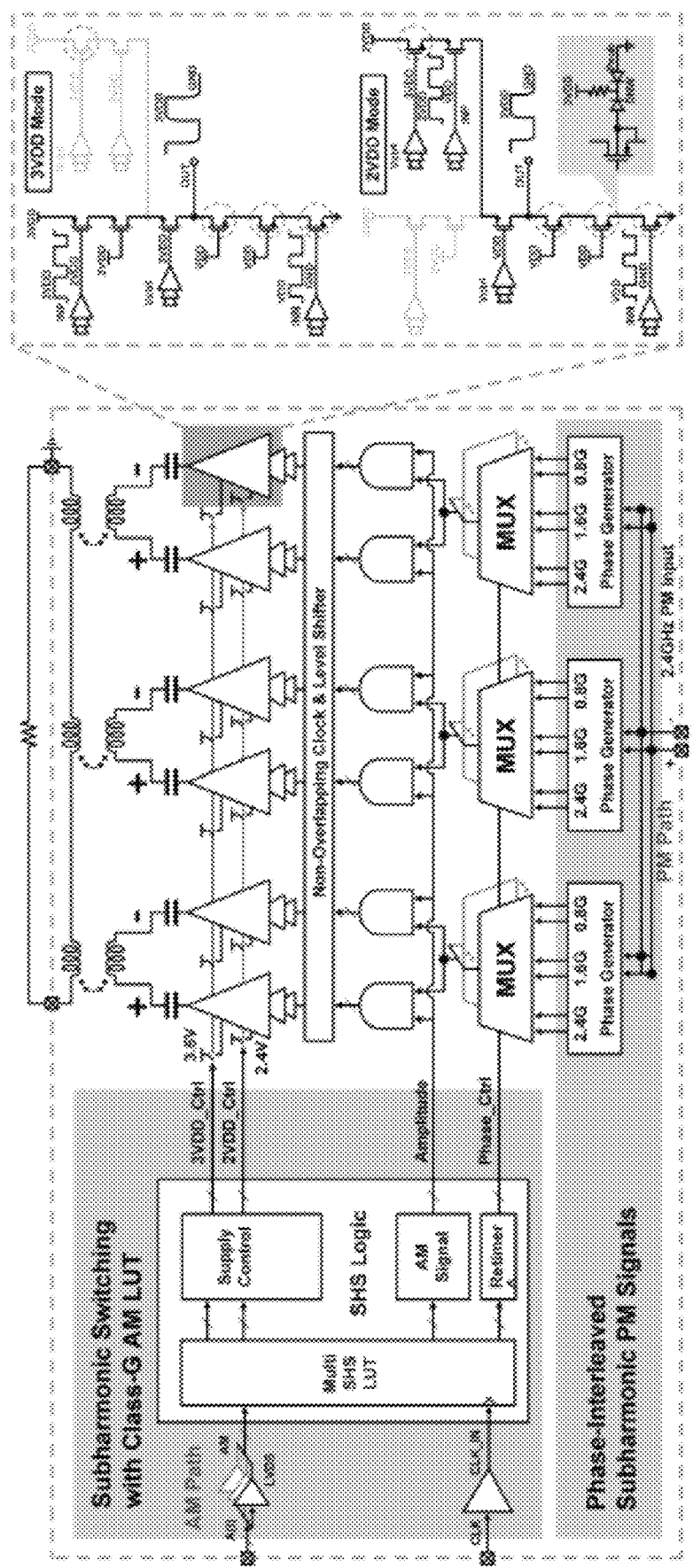
FIG. 32. Block diagram of the PA prototype.

FIG. 32 shows the top-level block diagram of the phase-interleaved multi-SHS PA prototype. The prototype adopted the polar architecture with the consideration of high efficiency. The input paths contain amplitude modulation (AM) and phase modulation (PM) paths. The differential PM signal first passes through the current-mode logic (CML) buffers and converts to the rail-to-rail CMOS-type PM signal. Then, the PM signal is distributed to three local phase generators with different control settings. The phase generator creates three phase signals, including a delayed original PM signal (Fc), a divide-by-three PM signal (Fc/3), and a non-uniform gated PM signal (2Fc/3). To mitigate time skew between different phase generators and different PM signals, phase detectors and tunable delays are implemented. The generated phase signals then pass through the high-speed multiplexer (MUX). Note that the phase control signal is retimed with the original PM signal to avoid phase glitches. Depending on the AM LUT, the MUX selects the PM signals corresponding to the intended PA input switching frequency.

The 8-bit AM signal and the clock signal are generated off-chip using the low-voltage differential signaling (LVDS) format. Depending on the modulated signal bandwidth, the sample rate of the AM signals can be set up to 1 GS/s. The AM signal is first sent to a digital decoder, which generates the LUT for multi-SHS with the hybrid class-G operation. The LUT outputs contain the amplitude code, phase control word, and supply control word to control the phase-interleaved PA core. All the control signals are properly retimed and phase-aligned for the multi-SHS operation. An "H-tree" layout strategy is utilized to minimize the time skew between different channels and control signals. Note that each PA bank must maintain the same amplitude code to generate the same output power. It guarantees the subharmonic cancellation under all the different output power levels, as we discussed in Subsection II.1.

The desired PM signal and amplitude code are combined in the polar combiner before the PA drivers. The non-overlapping clock is implemented to generate non-overlapping PA input signals to suppress the crowbar current, which can improve the class-D driver peak efficiency. It also achieves an equivalent resolution of 1.2 mV in the voltage domain to fine calibrate the unwanted subharmonic spurs. We use a three-stacking class-D driver to enlarge the output voltage. Depending on the control LUT, the driver can work in the 2VDD and 3VDD modes separately. The load-pull simulation includes all the PA drivers that are matched to the load that generates the best efficiency point. More implementation details about the triple stacking drivers can be found in [31]. The PA driver outputs connect to the capacitor bank. The custom-designed precise MIM capacitor is implemented to result in differential nonlinearity (DNL). Finally, an on-chip three-way power combiner is used, which is described in the following Subsection II.3.B.

B. Three-Way Power Combiner

Figure 33:
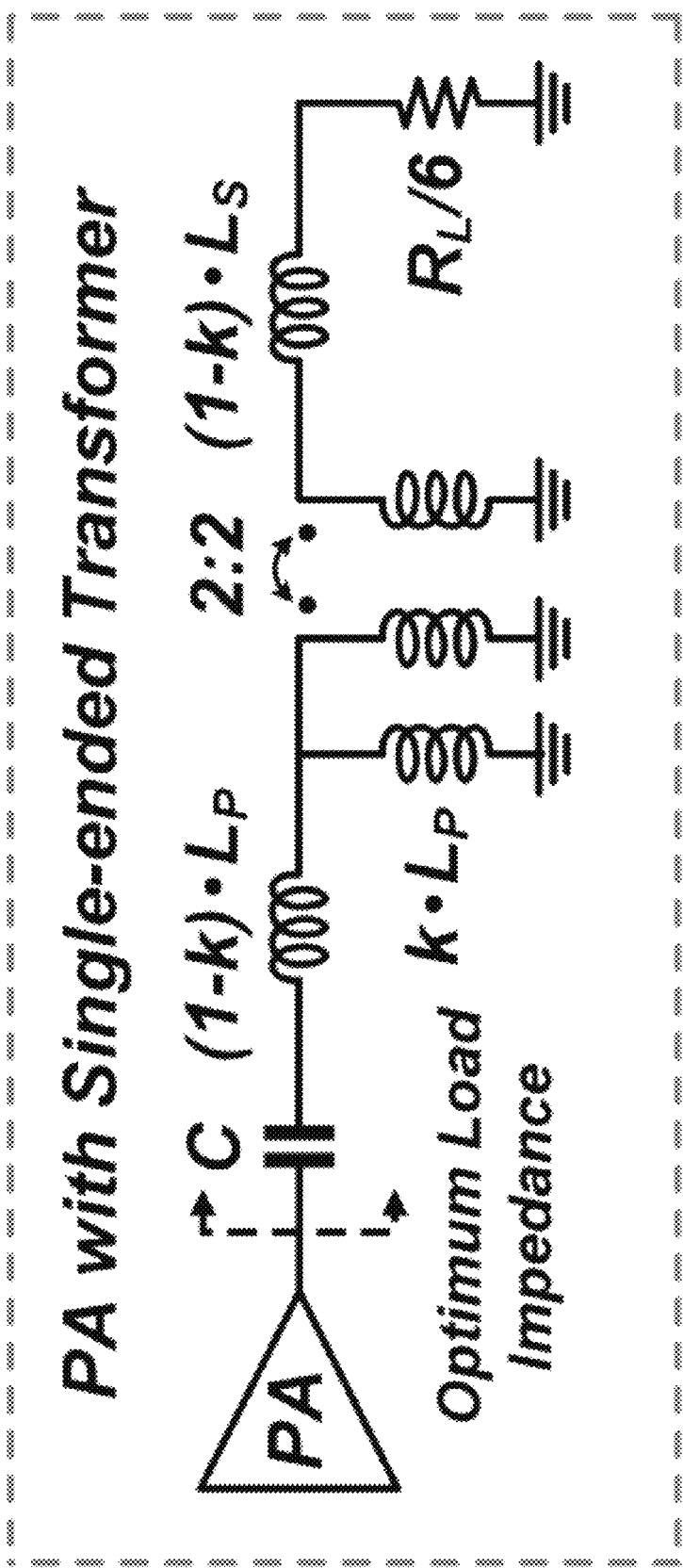
FIG. 33. Three-way power combiner model in HFSS.

The proposed transformer-based power combiner provides four main objectives in this PA prototype: power combining, inherent subharmonic cancellation, differential to single-ended conversion, and impedance matching. FIG. 33 shows the singled-ended equivalent circuit of the transformer. First, each of the transformers sees a differential RL/3 load (single-ended RL/6) due to the three-way power combiner. There are two turns for both primary and secondary sides to obtain enough inductance. The transformer's intrinsic inductance, together with the switched capacitor bank, will convert the load impedance to the PA optimum load impedance at the carrier frequency.

Figure 34:
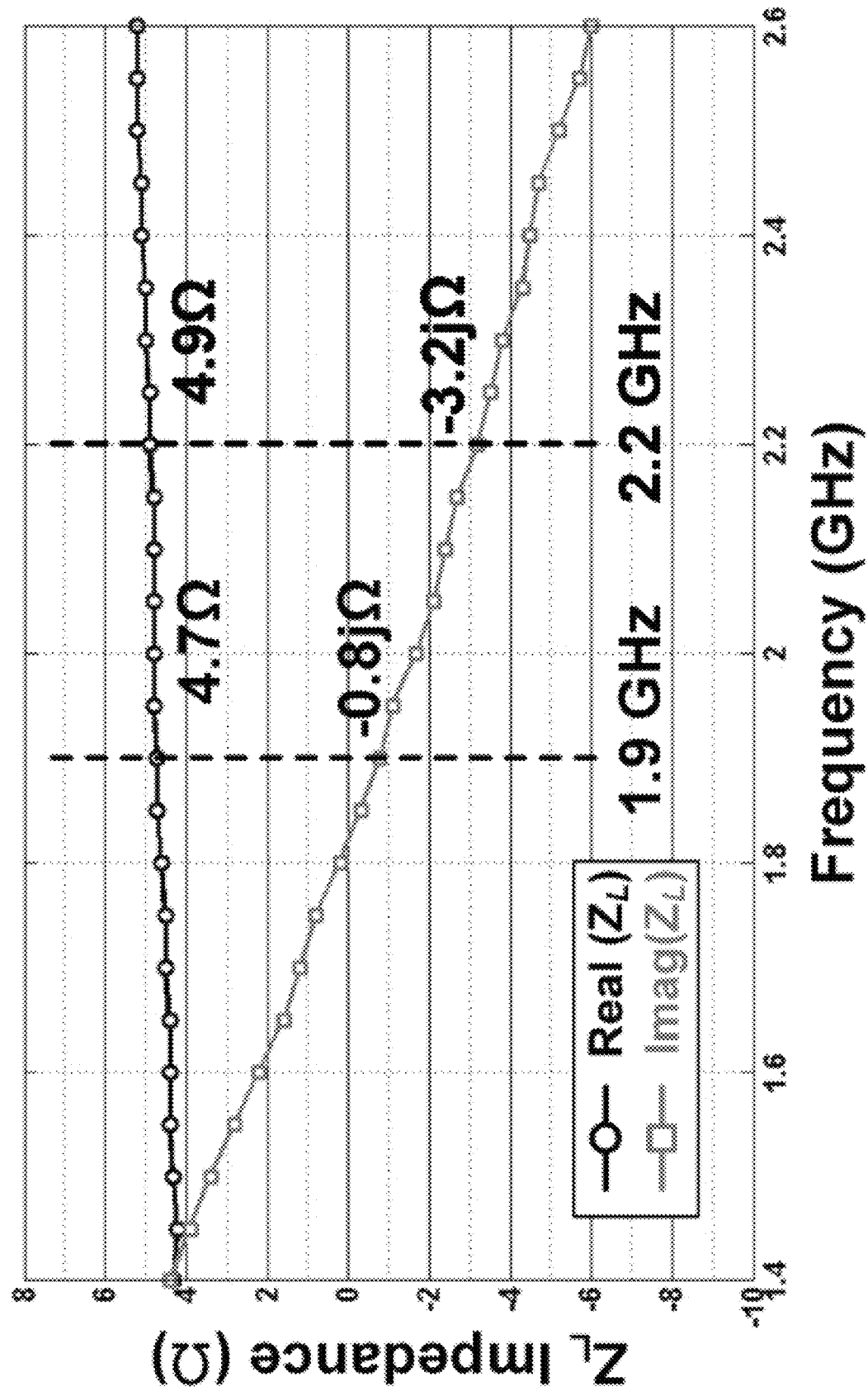
FIG. 34. Simulated PA load impedance ZL versus frequency.

FIG. 34 shows the simulated PA load impedance ZL versus the frequency. The result shows that the impedance is around 5.5Ω with 1-Ω variation from 1.45 to 2.25 GHz, achieving wideband impedance transformation with low loss. The matching load impedance is designed as 5.5Ω to provide optimum efficiency and output power.

Figure 35:
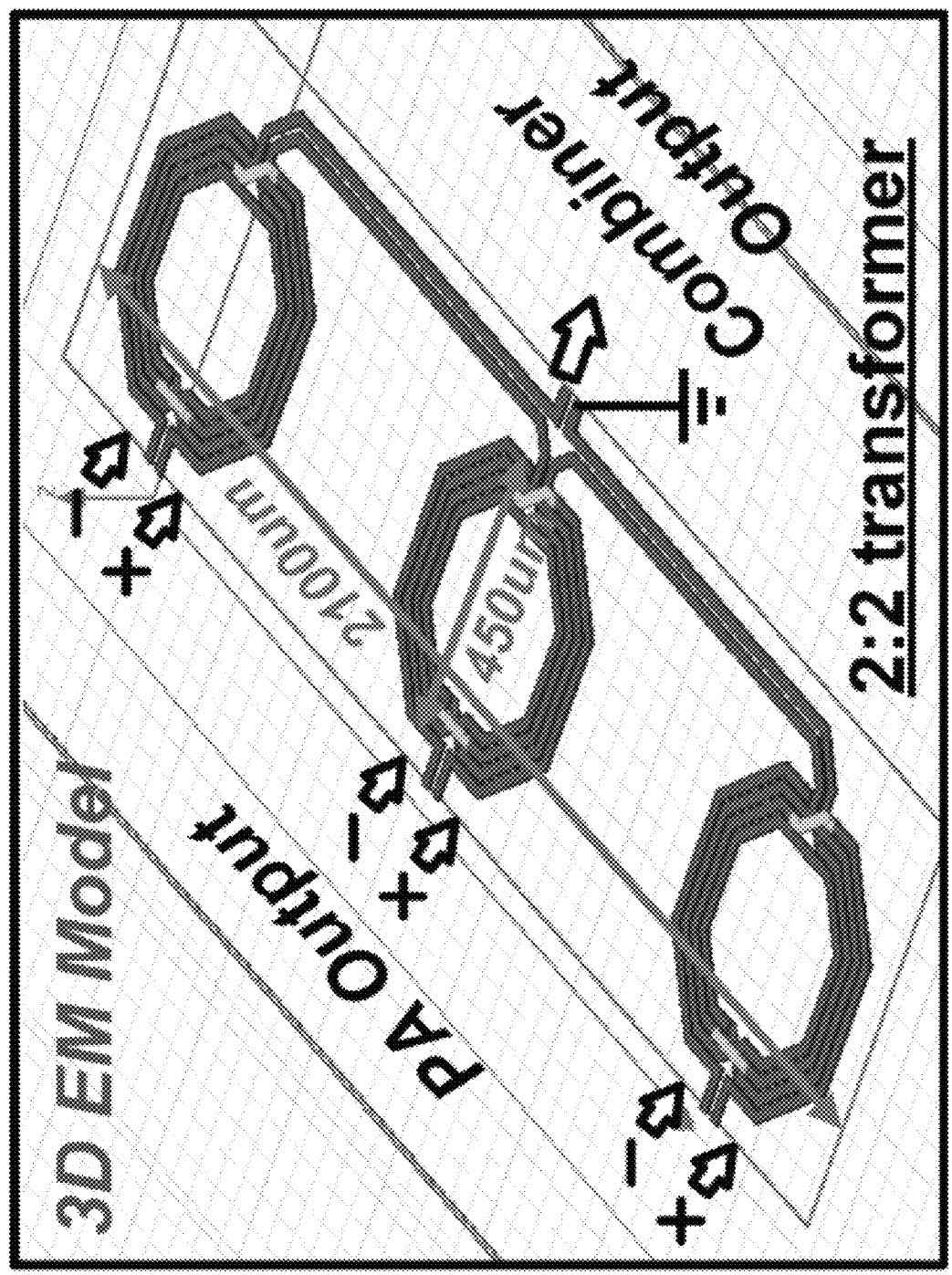
FIG. 35. Three-way power combiner model in HFSS.
Figure 36:
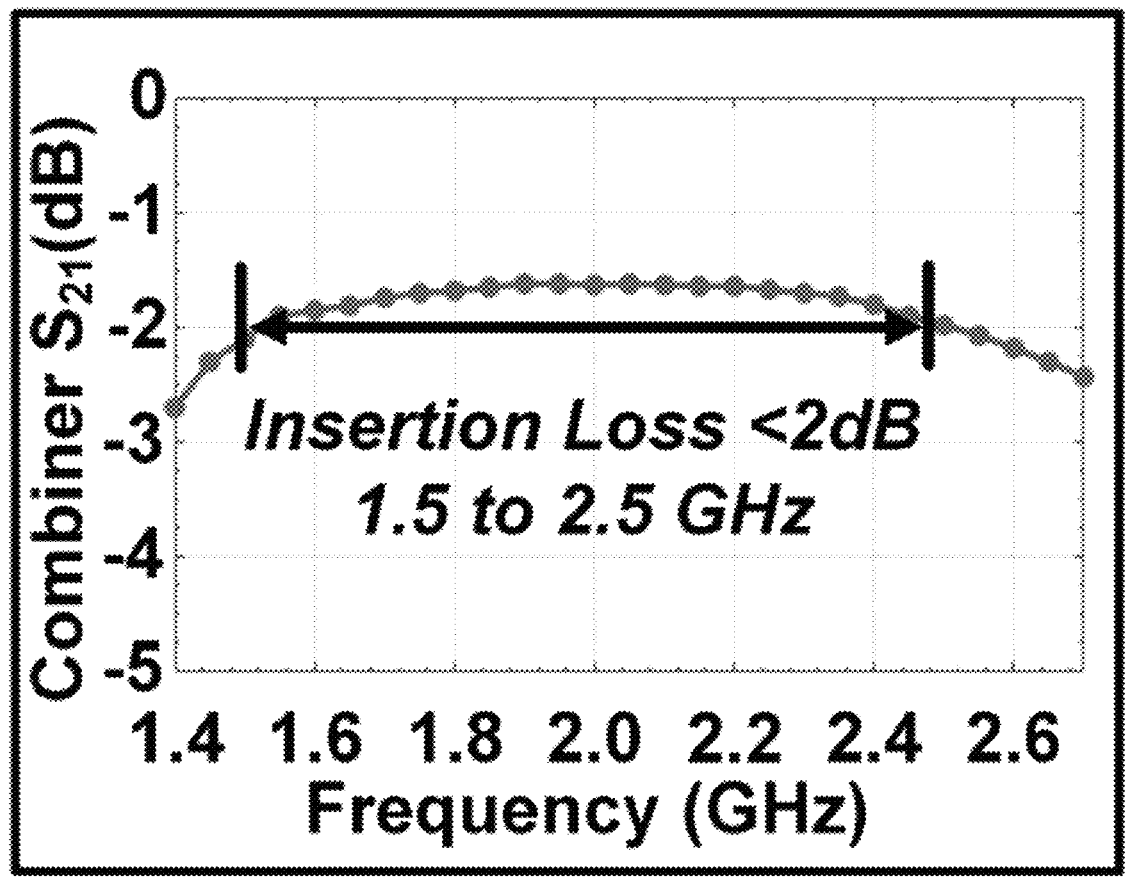
FIG. 36. Simulated S21 of the power combiner over the frequencies.

The "FIG. 31" power combiner structure could be a potential candidate for a high-efficiency high-power PA design, as it helps reduce mutual coupling between adjacent primary coils. However, for the "FIG. 31" structure, all the primary windings are not symmetric with respect to the secondary, thus introducing an inherent amplitude and phase mismatch. Therefore, we choose the same 2:2 transformer footprint to keep the impedance conversion ratio symmetric. The parasitic coupling between the primary and secondary windings of the power combiner is minimized via layout optimization. It reduces the ratio of direct subharmonic coupling to the PA output, as it would have undermined the efficacy of subharmonic cancellation otherwise. To make it symmetric, the secondary coil of each PA bank always connects from the top side and connects to the adjacent channel. The coupling between the primary and secondary coils is balanced. Note that additional calibration circuitry is implemented to balance the asymmetric output trace of the transformer. The three-way power combiner is modeled and simulated in HFSS (see FIG. 35). It shows less than 2-dB insertion loss over 1-GHz bandwidth (see FIG. 36).

C. Multi-SHS PM Generator

Figure 37:
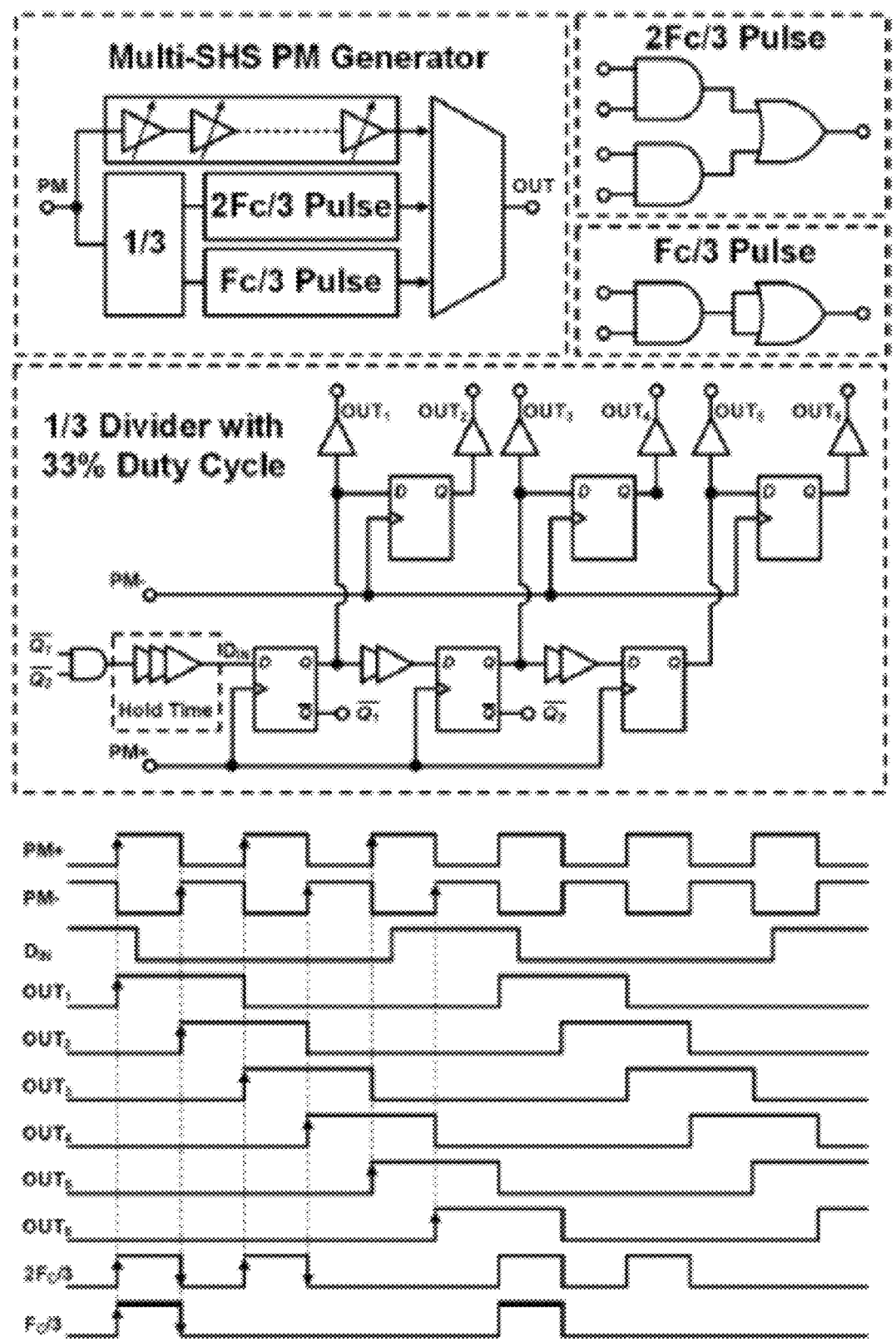
FIG. 37. Multi-SHS phase generator.

To generate the multi-SHS waveform, we use three local PM generators to create three different subharmonics, Fc, 2Fc/3, and Fc/3. The same Fc signal is distributed to three PM generators. For each PM generator shown in FIG. 37, it contains a one-third divider, Fc/3 pulse generator, 2Fc/3 pulse generator, tunable delay line, and output MUX. The one-third divider first generates the Fc/3 signals from OUT1 to OUT6, which have a 33% duty cycle with six different phases. The 2Fc/3 pulse generator and Fc/3 pulse generator will create the 2Fc/3 and Fc/3 subharmonics, respectively. The tunable delay line delays the original PA signal to align with these subharmonics. The layout is balanced for each building block to reduce the phase skew between different channels. The output MUX selects the desired phase and sends to each PA unit cell. The tunable delays are implemented to calibrate the subharmonics mismatch, which is described in Subsection II.1.

Subsection II.4. Measurement

Figure 38:
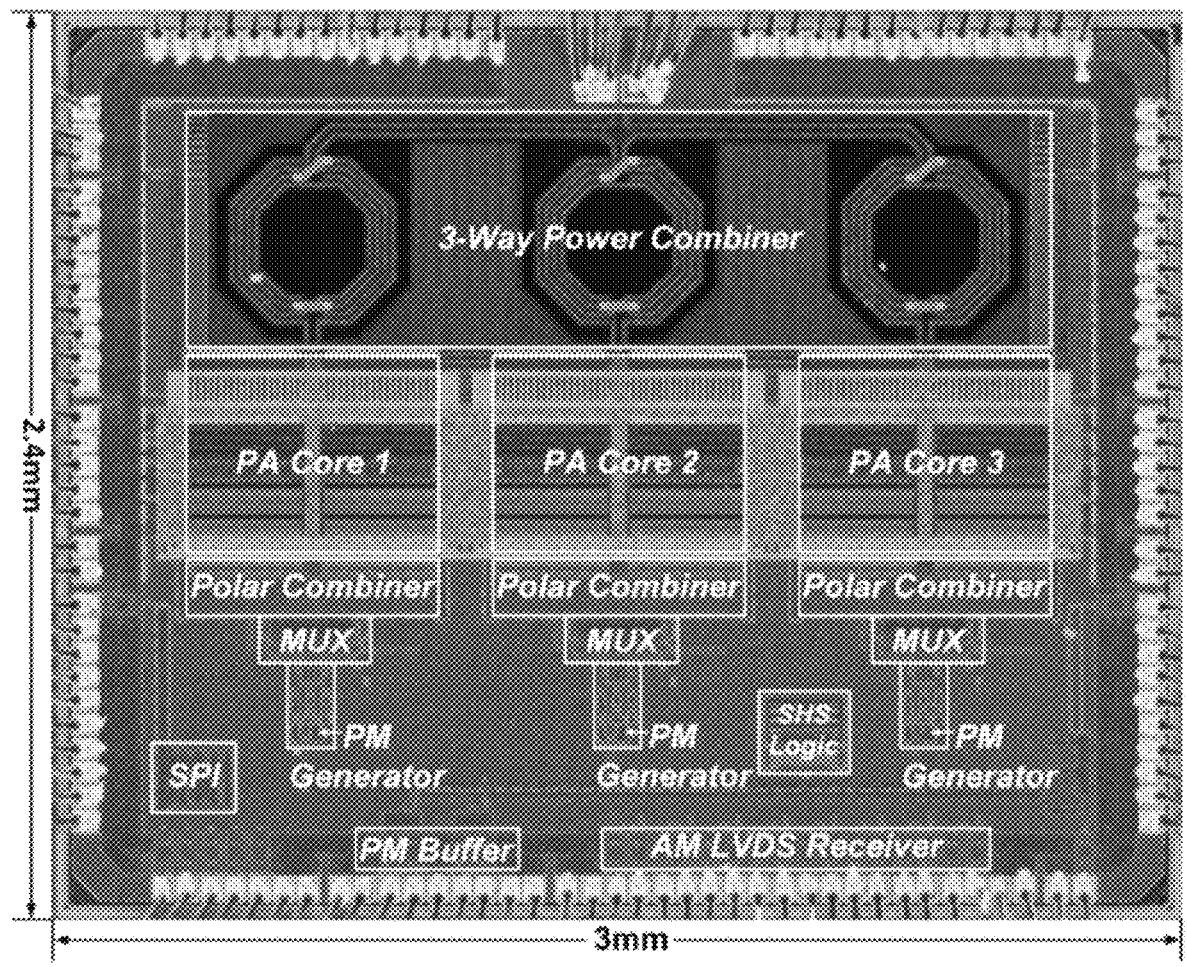
FIG. 38. Chip micrograph.

The phase-interleaved multi-SHS PA prototype is implemented in the 65-nm bulk CMOS process with a die size of 3 mm×2.4 mm (FIG. 38). The chip is directly mounted on the PCB to minimize the bond wire inductance to the PA supplies. The PA pre-drivers operate from 0 to 1.2 V. The PA output drivers are powered by either 2.4 or 3.6 V, as described previously, i.e., 2VDD and 3VDD, respectively. To test this digital PA, we send the 12-bit PM digital code to an off-the-shelf evaluation board (AD9779) for generating the phase-modulated signal. With technology scaling, additional bits could be implemented to pursue higher linearity.

A. Continuous Wave Test

Figure 39:
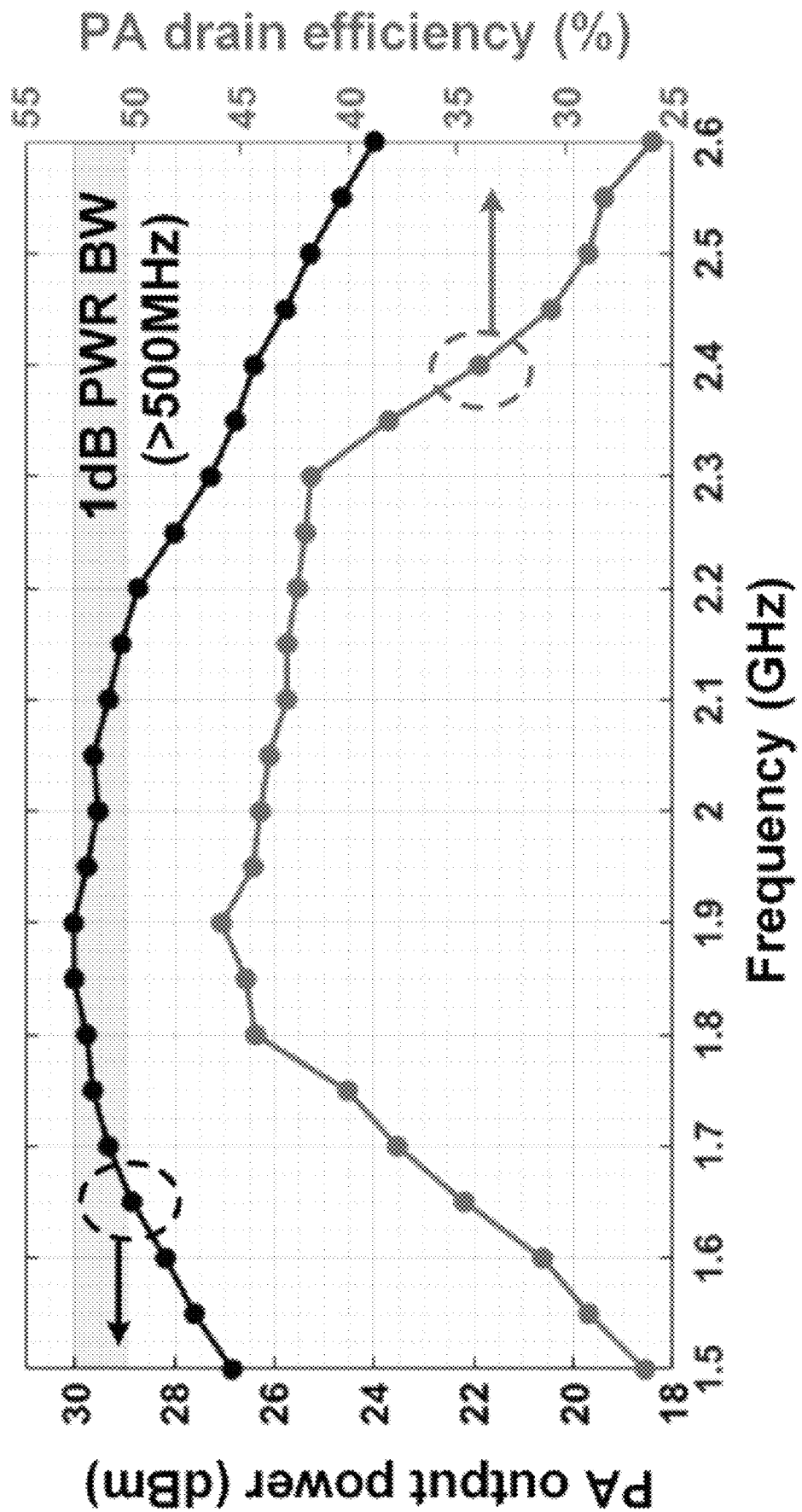
FIG. 39. Measured PA output power and efficiency over the frequencies.

We first characterize the PA peak performance by measuring the PA peak output power (Psat) and the peak DE. The measured results under different frequencies are shown in FIG. 39. The measured PA peak output power and efficiency are 30 dBm and 45.9%, respectively, for a center frequency of 1.9 GHz. The measured 1-dB power bandwidth is more than 500 MHz. The efficiency is more than 40% between 1.8 and 2.3 GHz. The reported DE includes all the phase generators, polar combiners, level shifters, pre-drivers, output stages, and the transformer-based power combiner.

Figure 40:
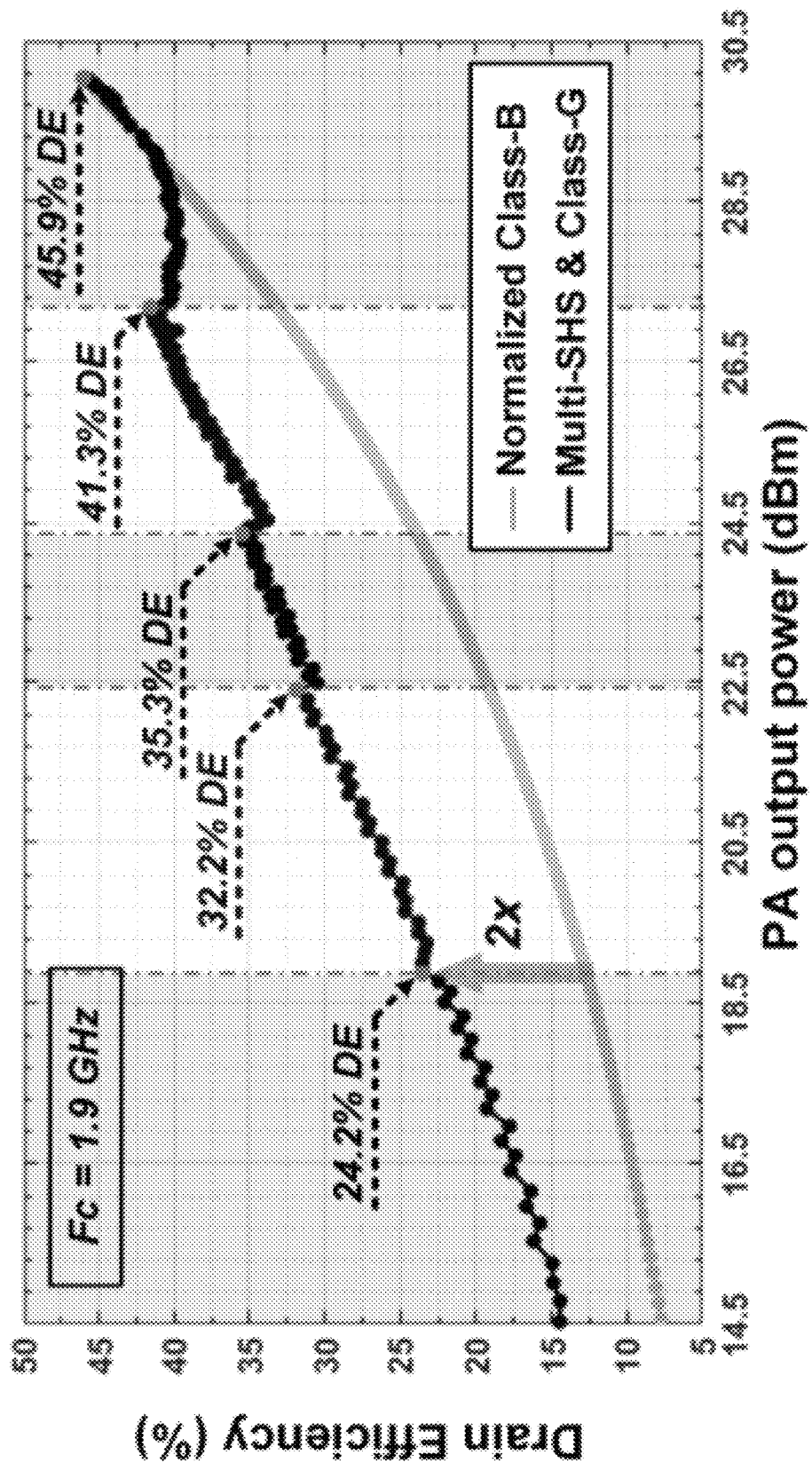
FIG. 40. Measured PA DE at 1.9 GHz versus PA Pout.
Figure 41:
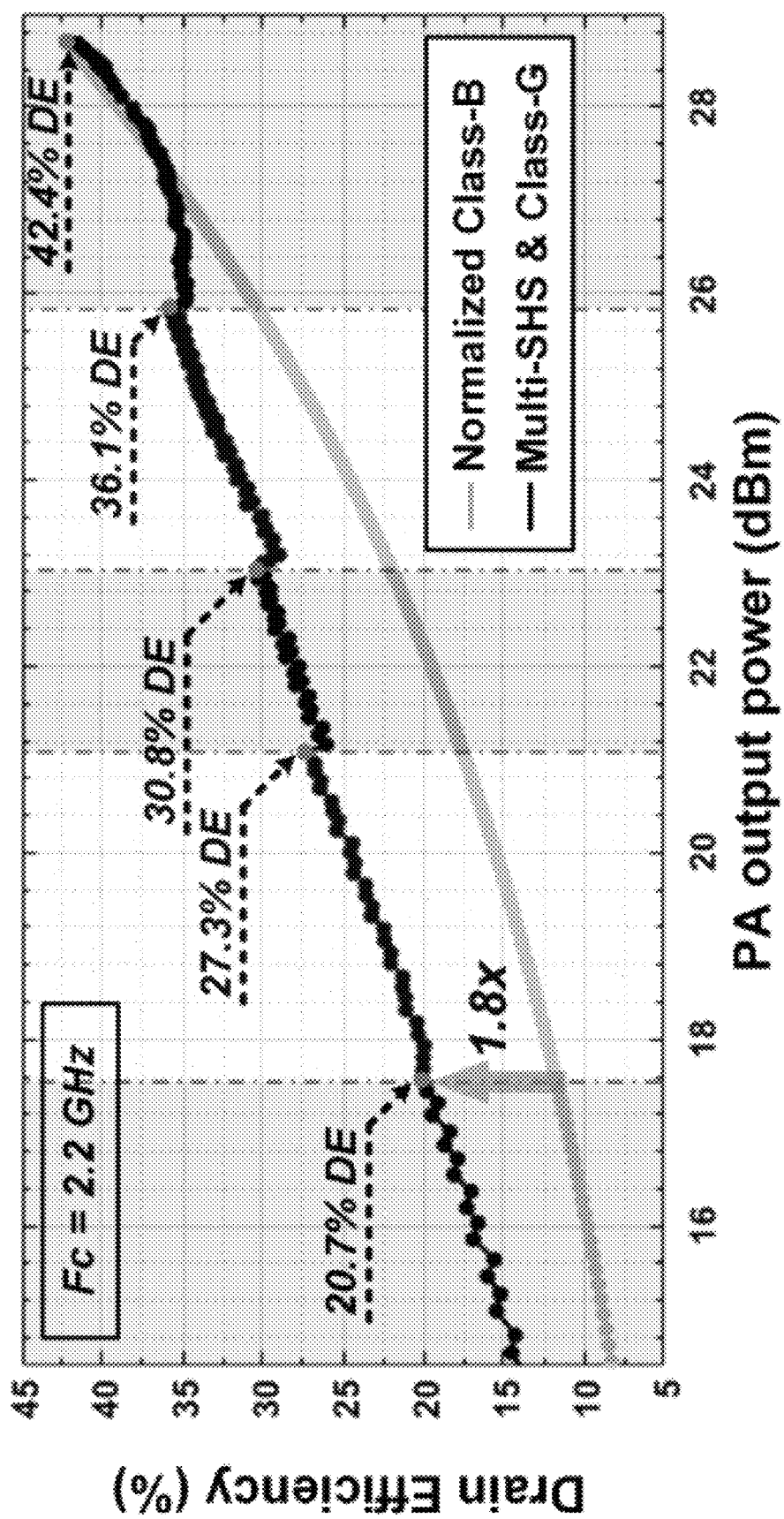
FIG. 41. Measured PA DE at 2.2 GHz versus PA Pout.

FIGS. 40 and 41 show the measured PA back-off efficiency under different output power levels. Compared to the simulation results, the efficiency is around 10% lower than the measurement results. There is a total of five efficiency peaks due to the pre-compiled multi-SHS with hybrid class-G operation LUT, as described in Subsection II.2. At 1.9 GHz, the five efficiency peaks are located at 0, −3.5, −7.0, −9.5, and −12 dB, indicating 45.9%/41.3%/35.3%/32.2%/24.2% output DE. The measured power efficiency improves as much as twofold at −12-dB PBO over the normalized class-B PA. At 2.2 GHz, a similar efficiency roll-off curve has been observed. The five efficiency peaks located at 0, −3.5, −7.0, −9.5, and −12 dB indicate 42.4%/36.1%/30.8%/27.3%/20.7% output DE. The measured power efficiency improves as much as 1.8× at −12-dB PBO over the normalized class-B via the proposed architecture. Note that the measurement shows that the efficiency peaks are not exactly located at the theoretical PBO points. For example, the last efficiency peak is located at −12-dB PBO. However, the theoretical results indicate −13-dB PBO. The reason for this offset is that the PA output saturates when the output power is high. It makes all the PBO efficiency points move closer to the peak point, which leads to −12 dB in this case. The efficiency roll-off curve is based on the pre-calculated LUT, using MATLAB simulation results, which yield the best efficiency among all the other combinations.

Figure 42:
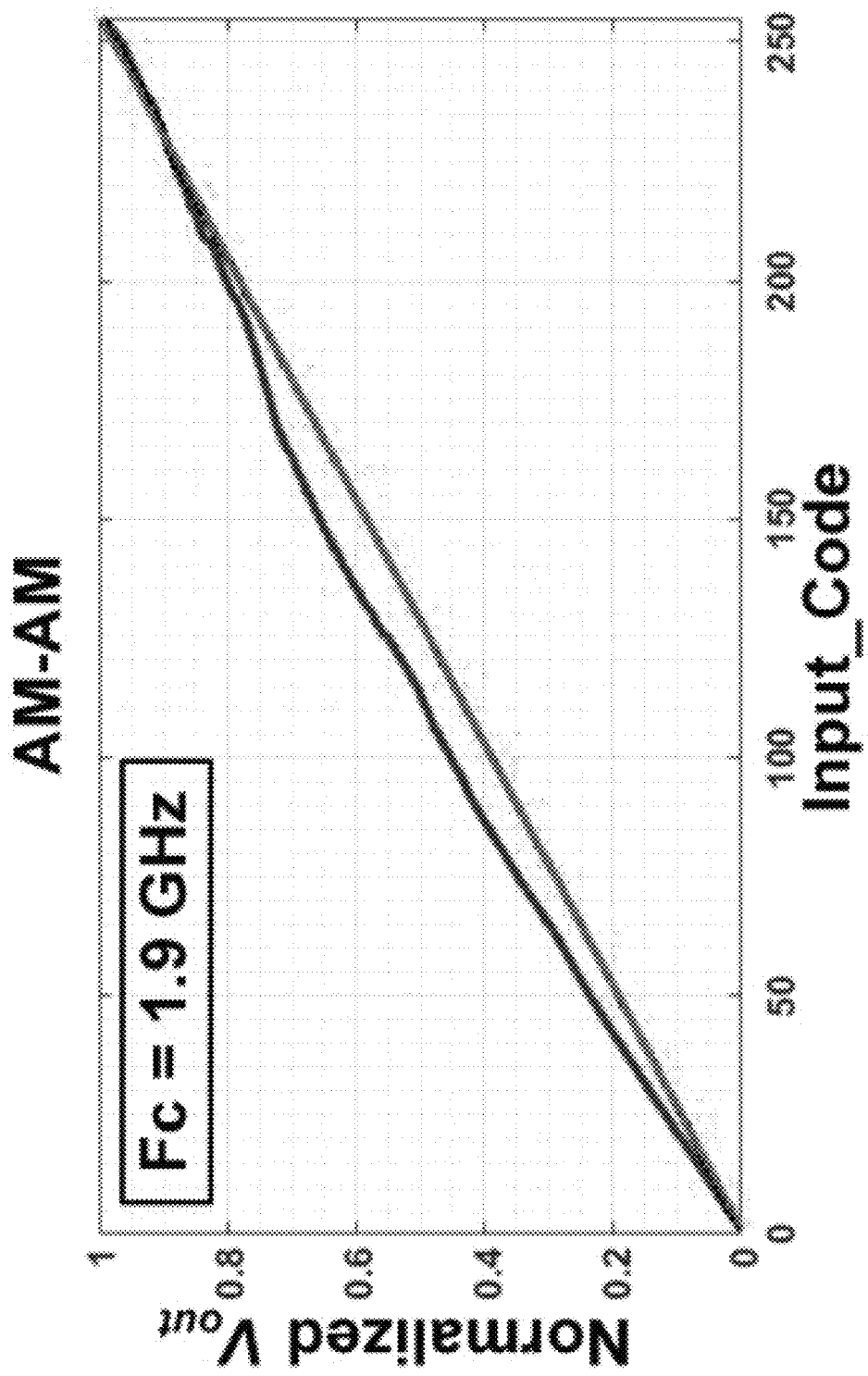
FIG. 42. Measured AM-AM characteristic curve at 1.9 GHz.
Figure 43:
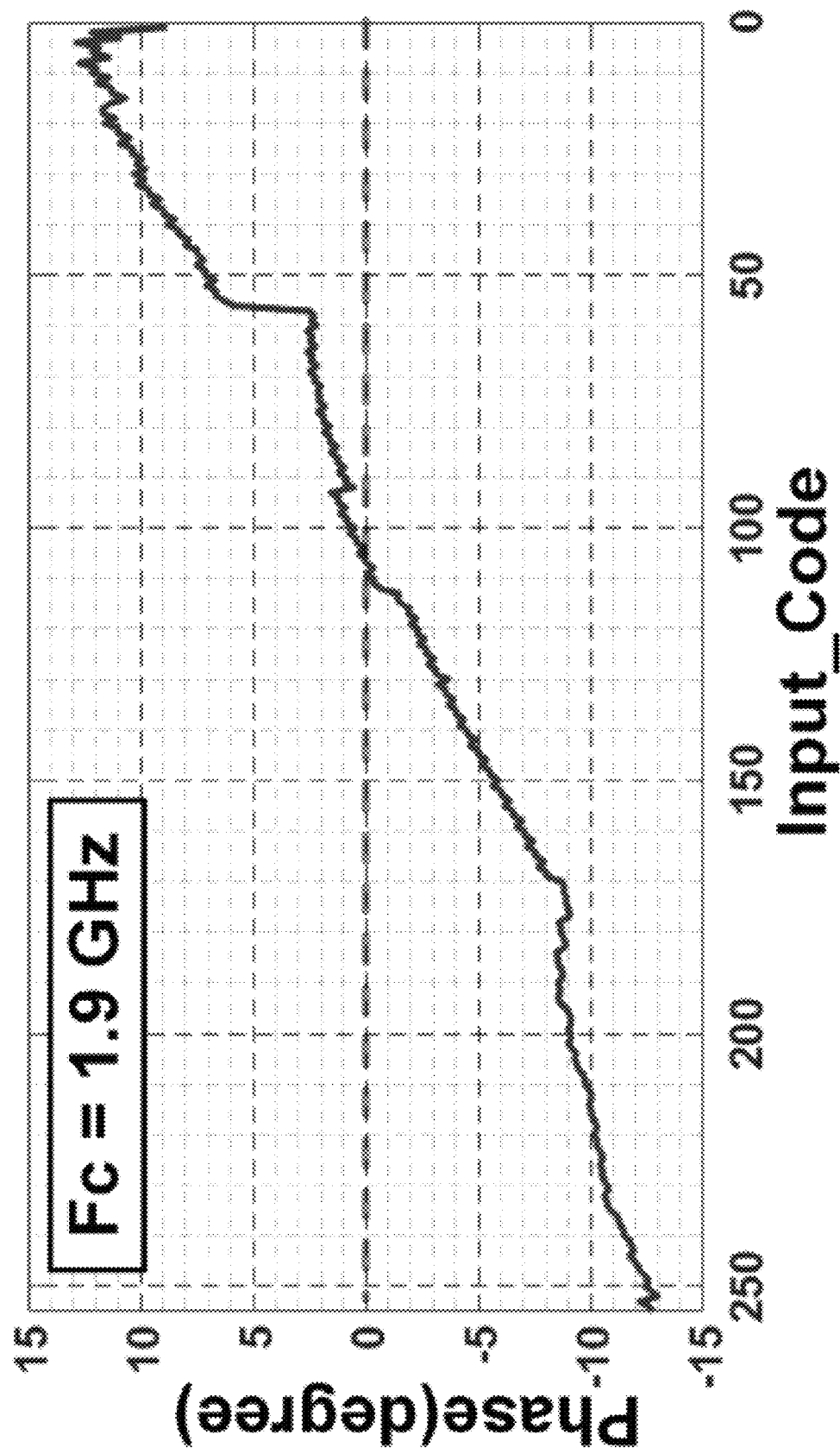
FIG. 43. Measured AM-PM characteristic curve at 1.9 GHz.

The AM-AM and AM-PM non-linearities at 1.9 GHz are shown in FIGS. 42 and 43. They were measured by sweeping the amplitude codes. Note that the input code in FIG. 43 is flipped compared to the AM-AM characteristic curve. There is a wiggle shown in the AM-PM curve because of the non-linearity from the different PBO region of the PA operation, which matches the hybrid operation. Note that the AM-PM non-linearity is relatively large compared to that in other work [32]. One potential reason is that the watt-level PA cell yields a larger footprint, which leads to larger mismatch. This issue can be mitigated by technology scaling and better layout techniques. The discontinuities in AM-PM happened when the PA switches to different PBO regions under the synthesized LUT, e.g., switching from 3VDD to 2VDD due to the hybrid class G operation. The AM-AM and AM-PM characteristic curves are used to create pre-distorted input digital patterns for the dynamic measurement. The chip has been tested under different voltage and temperature corners. When the temperature increases from 25° to 100°, the AM-PM variation is around 5°. The AM-PM non-linearities with 1-, 1.2-, and 1.4-V supplies become 21°, 25°, and 35°, respectively.

B. Phase-Interleaved Subharmonic Cancellation

Figure 44:
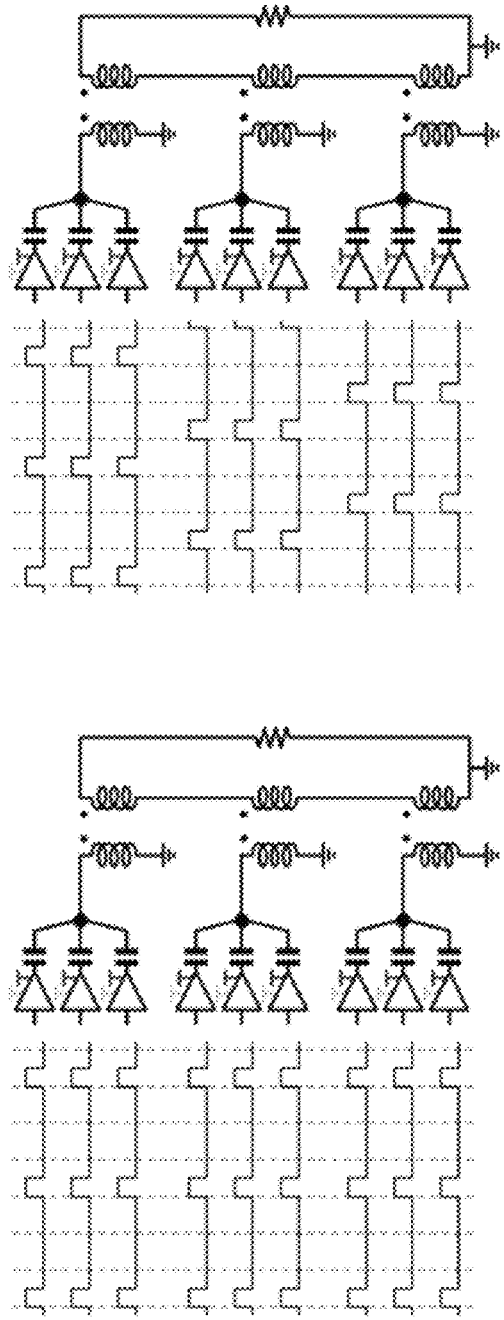
FIG. 44. Measured PA output spectrum at −13-dB PBO for in-phase and phase-interleaved subharmonic operation with all the PA cells toggle at Fc/3.
Figure 44:
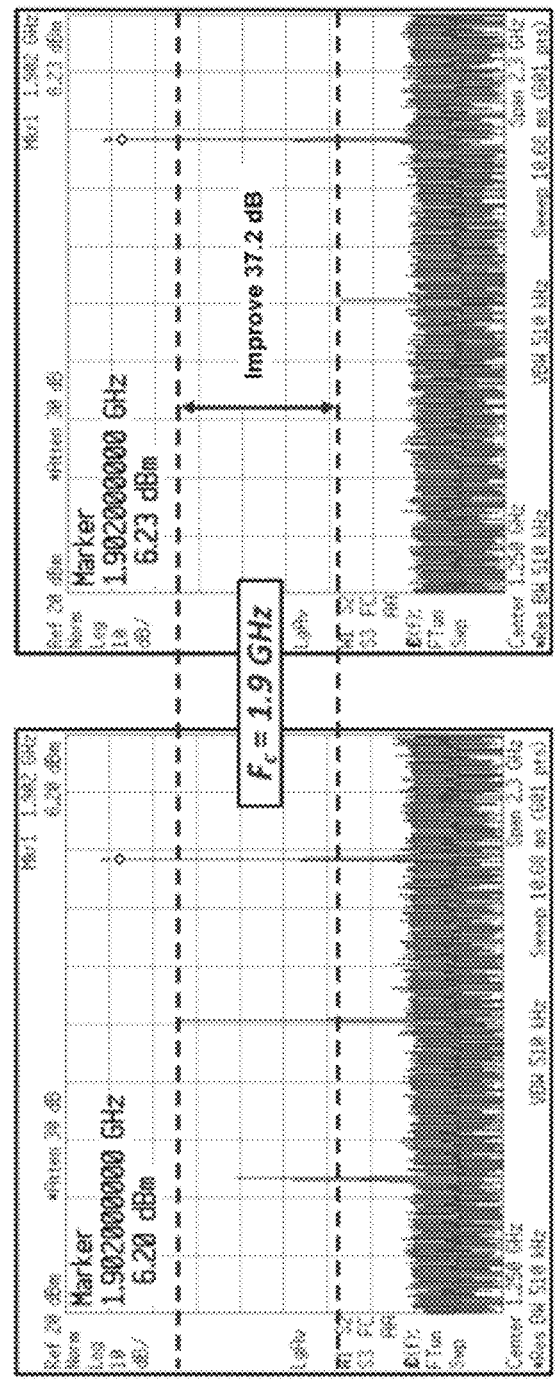

To validate the proposed phase-interleaved operation, we measured the worst case spur under multi-SHS with a hybrid class-G operation. In this case, all the PA cells toggle at the Fc/3 with the 2VDD supply. In FIG. 44, all the PA cells first toggle at Fc/3 with zero phase difference. Although the matching network provides a bandpass shape at the carrier frequency, the attenuation is not sufficient to suppress all the spurs. The output spectrum shows large unwanted tones located at Fc/3 and 2Fc/3.

Figure 45:
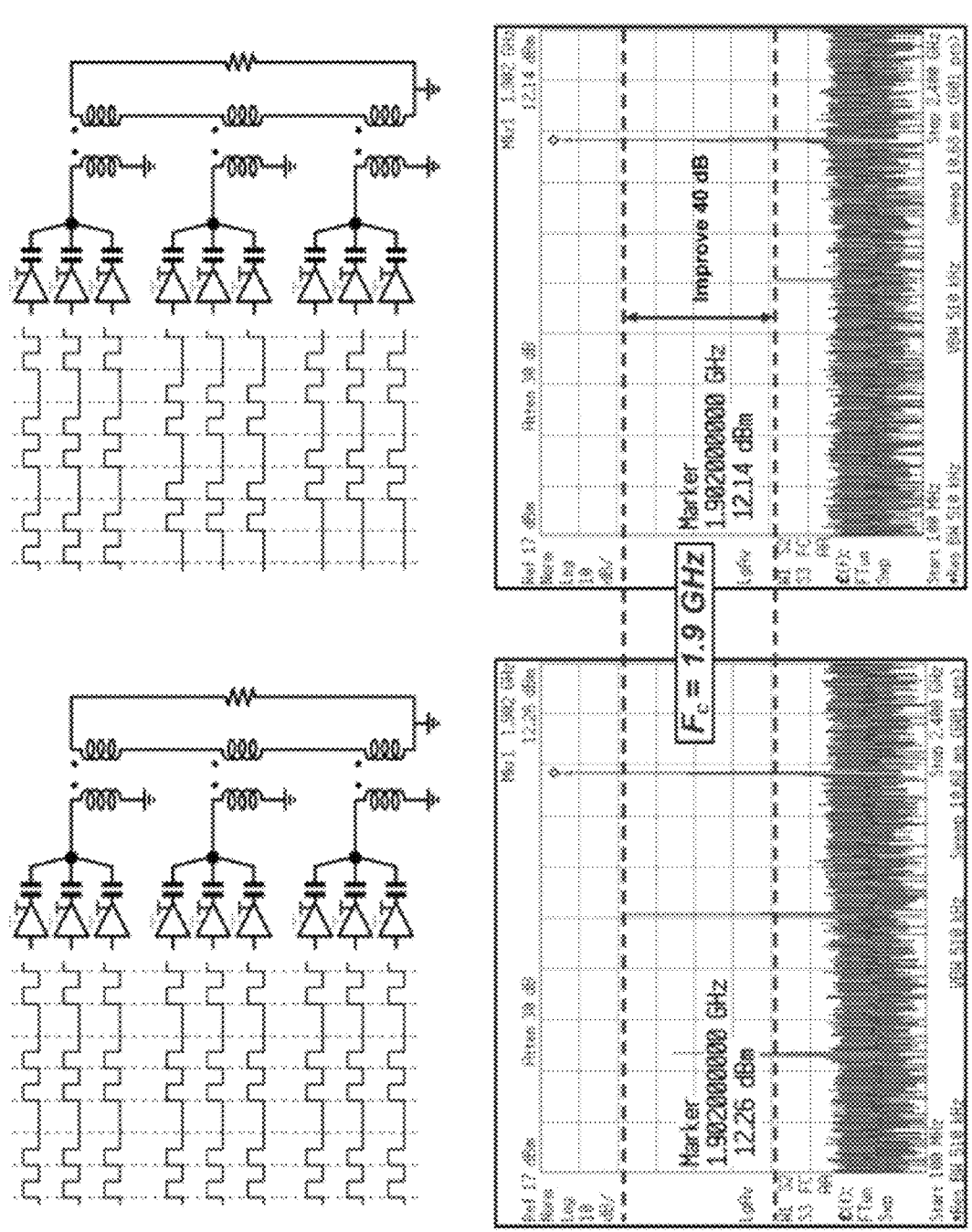
FIG. 45. Measured PA output spectrum at −7-dB PBO for in-phase and phase-interleaved subharmonic operation with all the PA cells toggle at 2Fc/3.

The effectiveness of performing subharmonic cancellation in the phase-interleaved scheme is shown in FIG. 44. In this case, the three interleaved PA channels toggle at Fc/3 with 120° apart. Only the Fc component is aligned in phase, while the phases of the unwanted Fc/3 and 2Fc/3 components are theoretically canceled. As we can see from the output spectrum, the output power at the carrier frequency remains the same. The worst case spur is reduced by 37.2 dB, limited by the matching property between the phase-interleaved paths. The difference between the desired tone and the largest unwanted subharmonic is around 50 dB, which satisfies the mask requirement of most communication standards. FIG. 45 shows all the PA cells toggle at 2Fc/3. Similar to the Fc/3 case, the worst case spur is reduced by 40 dB, achieving 58-dB SFDR. Due to the large output power, the EMI/EMC requirement may be violated. Antenna with frequency selectivity can be implemented to provide additional attenuation.

C. Dynamic Measurement

The dynamic performance of the PA is evaluated using a 5-MHz, 52 sub-carrier, 16-QAM OFDM signal with a 7.2-dB PAPR. As noted, the PA is first pre-distorted by AM-AM and AM-PM LUTs. The average drain efficiency achieves 31.2% under real-time digital pre-distortion (DPD) operation (i.e., transmitting the modulated signal under the complied LUT operation).

Figure 46:
FIG. 46. Measured EVM for real-time multi-SHS and hybrid class-G operation.
Figure 47:
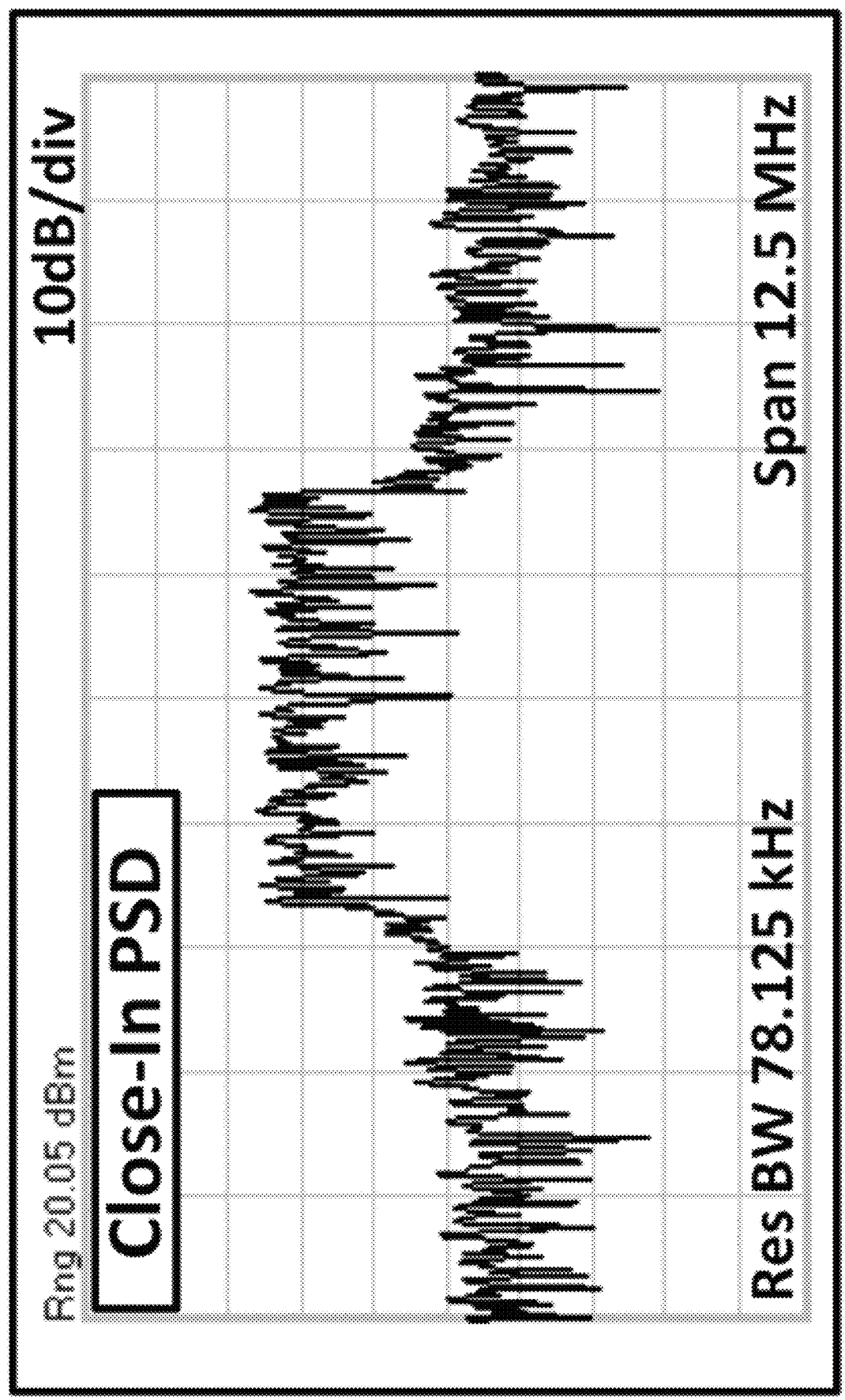
FIG. 47. Measured spectrum for real-time multi-SHS and hybrid class-G operation.

The PA in-band and out-of-band linearities have been characterized. It achieves 22.8-dBm average power with an EVM of −24.7 dB (see FIG. 46). FIG. 47 shows the measured close-in PSD characteristics. The ACPR is −26.5 dBc before calibration and −35-dBc after calibration. The poor linearity is mainly because of the memory effect when the PA generates large output power. The poor linearity can be improved by reducing the output power level or using advanced DPD and memory effect calibration [33]-[34][35] [36][37][38][39][40][41][42][43].

Figure 48:
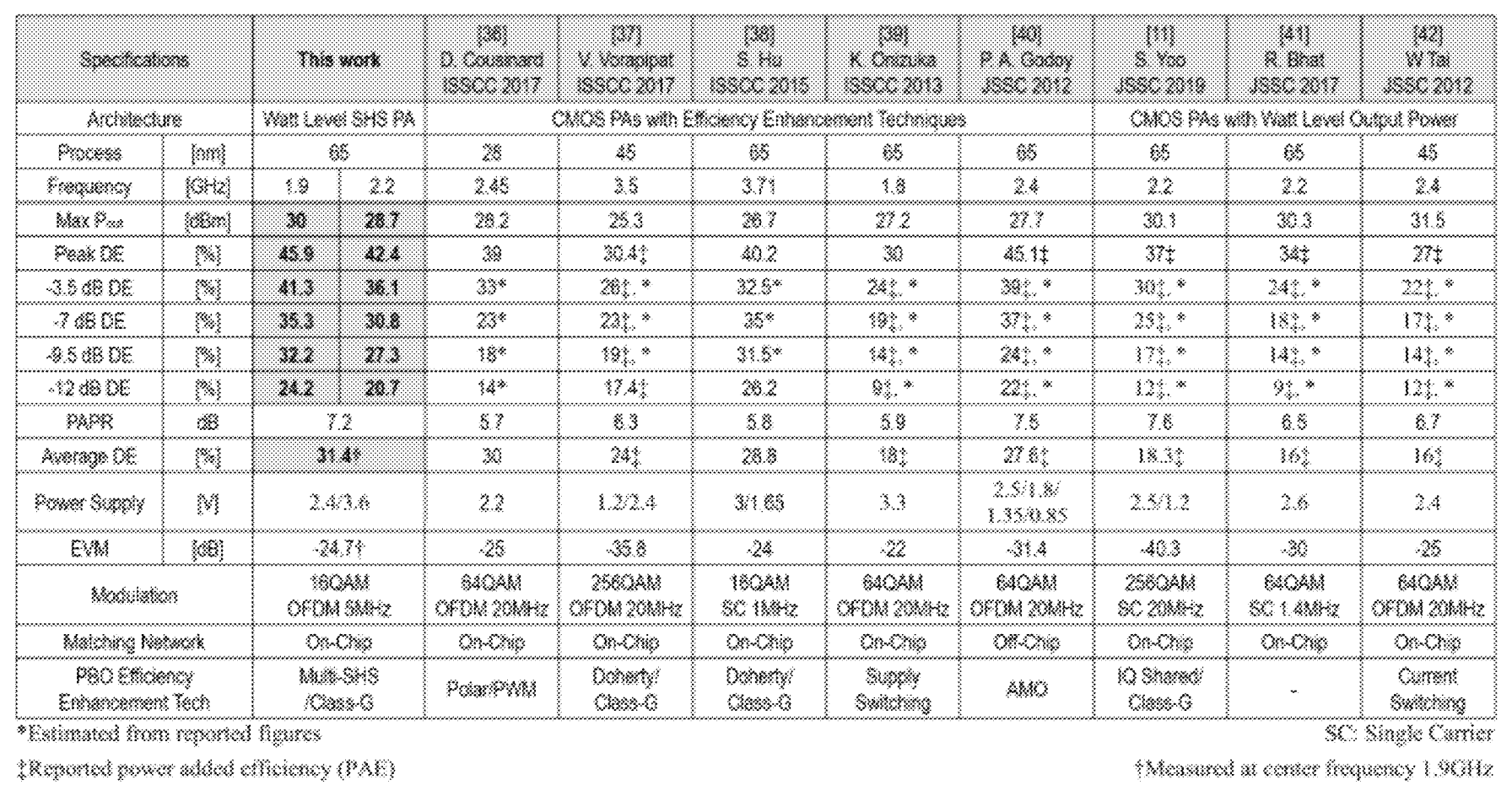

Table II (FIG. 48) summarizes the measured performance compared to other state-of-the-art CMOS PAs with different PBO efficiency-enhancement techniques [44], [45]-[46][47] [48][49][50][51]. The PA prototype delivers 30-dBm peak output power with a 45.9% peak DE at 1.9 GHz. Table I shows a comparison of the DE at 0-, −3.5-, −7.0-, −9.5-, and −12-dB PBO, where the PA prototype shows improved deep PBO efficiency. Compared to other CMOS watt-level PAs, the efficiency improvement is even more significant, where real-time multi-SHS with hybrid class-G operation in this work achieves 31.4% average DE.

Subsection II.5. Conclusion

In this section, a watt-level phase-interleaved multi-SHS digital PA is provided. A phase-interleaved structure is demonstrated for inherent subharmonic cancellation. To achieve watt-level output power, stacking PA drivers and power combining techniques are implemented. Multi-SHS is proposed to enhance PBO efficiency. Multi-SHS can be combined with hybrid class-G to further improve the average efficiency. The PA prototype enables watt-level peak output power with good PBO efficiency compared to the state-of-the-art CMOS PAs.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

REFERENCES

1. M. Kazimierczuk, RF Power Amplifiers, Hoboken, N.J., USA:Wiley, 2008.
2. S. C. Cripps, RF Power Amplifiers for Wireless Communications, Boston, Mass., USA:Artech House, 2006.
3. M. Hashemi et al., "An intrinsically linear wideband digital polar PA featuring AM-AM and AM-PM corrections through nonlinear sizing overdrive-voltage control and multiphase RF clocking", IEEE ISSCC Dig. Tech. Papers, pp. 300-301, February 2017.
4. D. Chowdhury, L. Ye, E. Alon, A. M. Niknejad, "An efficient mixed-signal 2.4-GHz polar power amplifier in 65-nm CMOS technology", IEEE J. Solid-State Circuits, vol. 46, no. 8, pp. 1796-1809, August 2011.
5. J. S. Walling et al., "A class-E PA with pulse-width and pulse-position modulation in 65 nm CMOS", IEEE J. Solid-State Circuits, vol. 44, no. 6, pp. 1668-1678, June 2009.
6. M. S. Alavi, R. B. Staszewski, L. C. N. de Vreede, J. R. Long, "A wideband \$2times13\$-bit all-digital I/Q RF-DAC", IEEE Trans. Microw. Theory Techn., vol. 62, no. 4, pp. 732-752, April 2014.
7. S. Su, M. S.-W. Chen, "A 16 b 12 GS/S single/dual-rate DAC with successive bandpass delta-sigma modulator achieving <−67 dBc IM3 within DC-to-6 GHz tunable passbands", IEEE ISSCC Dig. Tech. Papers, pp. 362-364, February 2018.
8. D. Kang, B. Park, D. Kim, J. Kim, Y. Cho, B. Kim, "Envelope-tracking CMOS power amplifier module for LTE applications", IEEE Trans. Microw. Theory Techn., vol. 61, no. 10, pp. 3763-3773, October 2013.
9. R. Wu, Y.-T. Liu, J. Lopez, C. Schecht, Y. Li, D. Y. C. Lie, "High-efficiency silicon-based envelope-tracking power amplifier design with envelope shaping for broadband wireless applications", IEEE J. Solid-State Circuits, vol. 48, no. 9, pp. 2030-2040, September 2013.
10. S. Hu, S. Kousai, H. Wang, "A broadband CMOS digital power amplifier with hybrid Class-G Doherty efficiency enhancement", IEEE ISSCC Dig. Tech. Papers, pp. 44-45, February 2015.
11. K. Onizuka, S. Saigusa, S. Otaka, "A +30.5 dBm CMOS Doherty power amplifier with reliability enhancement technique", Proc. IEEE Symp. VLSI Circuits, pp. 78-79, June 2012.
12. V. Vorapipat, C. Levy, P. Asbeck, "A Class-G voltage-mode Doherty power amplifier", IEEE ISSCC Dig. Tech. Papers, pp. 46-47, February 2017.
13. P. A. Godoy, S. Chung, T. W. Barton, D. J. Perreault, J. L. Dawson, "A 2.4-GHz 27-dBm asymmetric multilevel outphasing power amplifier in 65-nm CMOS", IEEE J. Solid-State Circuits, vol. 47, no. 10, pp. 2372-2384, October 2012.
14. K. Cho, R. Gharpurey, "A digitally intensive transmitter/PA using RF-PWM with carrier switching in 130 nm CMOS", IEEE J. Solid-State Circuits, vol. 51, no. 5, pp. 1188-1199, May 2016.
15. S. Moloudi, A. A. Abidi, "The outphasing RF power amplifier: A comprehensive analysis and a class-B CMOS realization", IEEE J. Solid-State Circuits, vol. 48, no. 6, pp. 1357-1369, June 2013.
16. S. Li, T. Chi, H. T. Nguyen, T.-Y. Huang, H. Wang, "A 28 GHz packaged Chireix transmitter with direct on-antenna outphasing load modulation achieving 56%/38% PA efficiency at peak/6 dB back-off output Powe", Proc. IEEE Radio Freq. Integr. Circuits Symp. (RFIC), pp. 68-71, June 2018.
17. L. Ye, J. Chen, L. Kong, E. Alon, A. M. Niknejad, "Design considerations for a direct digitally modulated WLAN transmitter with integrated phase path and dynamic impedance modulation", IEEE J. Solid-State Circuits, vol. 48, no. 12, pp. 3160-3177, December 2013.
18. K. Datta, H. Hashemi, "Watt-level mm-wave power amplification with dynamic load modulation in a SiGe HBT digital power amplifier", IEEE J. Solid-State Circuits, vol. 52, no. 2, pp. 371-388, February 2017.
19. A. Zhang, M. S.-W. Chen, "A sub-harmonic switching digital power amplifier with hybrid class-g operation for enhancing power back-off efficiency", Proc. IEEE Symp. VLSI Circuits, pp. 213-214, June 2018.
20. S.-M. Yoo, J. S. Walling, E. C. Woo, B. Jann, D. J. Allstot, "A switched-capacitor RF power amplifier", IEEE J. Solid-State Circuits, vol. 46, no. 12, pp. 2977-2987, December 2011.
21. S.-M. Yoo et al., "A class-G switched-capacitor RF power amplifier", IEEE J. Solid-State Circuits, vol. 48, no. 5, pp. 1212-1224, May 2013.
22. R. Bhat, H. Krishnaswamy, "A watt-level 2.4 GHz RF I/Q power DAC transmitter with integrated mixed-domain FIR filtering of quantization noise in 65 nm CMOS", Proc. IEEE Radio Freq. Integr. Circuits Symp., pp. 413-416, June 2014.
23. W. Yuan, J. S. Walling, "A multiphase switched capacitor power amplifier", IEEE J. Solid-State Circuits, vol. 52, no. 5, pp. 1320-1330, May 2017.
Show Context View Article Full Text: PDF (2601 KB) Google Scholar
24. S. J. Kim, W.-S. Choi, R. Pilawa-Podgurski, P. K. Hanumolu, "A 10-MHz 2-800-mA 0.5-1.5-V 90% Peak efficiency time-based buck converter with seamless transition between PWM/PFM modes", IEEE J. Solid-State Circuits, vol. 53, no. 3, pp. 814-824, March 2018.
25. B. Serneels, M. Steyaert, W. Dehaene, "A 5.5 V SOPA line driver in a standard 1.2 V\$0.13~mutext{m}\$ CMOS technology", Proc. IEEE 31st Eur. Solid-State Circuits Conf., pp. 303-306, September 2005.
26. D. Cousinard et al., "A 0.23 mm 2 digital power amplier with hybrid time/amplitude control achieving 22.5 dBm at 28% PAE for 802.11g", IEEE ISSCC Dig. Tech. Papers, pp. 228-229, February 2017.
27. A. Zhang, M. S.-W. Chen, "A subharmonic switching digital power amplifier for power back-off efficiency enhancement", IEEE J. Solid-State Circuits, vol. 54, no. 4, pp. 1017-1028, April 2019.
28. S.-M. Yoo, J. S. Walling, E. C. Woo, B. Jann, D. J. Allstot, "A switched-capacitor RF power amplifier", IEEE J. Solid State Circuits, vol. 46, no. 12, pp. 2977-2987, December 2011.
29. C.-R. Ho, M. S.-W. Chen, "A digital PLL with feedforward multi-tone spur cancellation scheme achieving <−73 dBc fractional spur and <−110 dBc reference spur in 65 nm CMOS", IEEE J. Solid-State Circuits, vol. 51, no. 12, pp. 3216-3230, December 2016.
30. D. Chowdhury, P. Reynaert, A. M. Niknejad, "Transformer-coupled power amplifier stability and power back-off analysis", IEEE Trans. Circuits Syst. II Exp. Briefs, vol. 55, no. 6, pp. 507-511, June 2008.
31. B. Serneels, M. Steyaert, W. Dehaene, "A 5.5 V SOPA line driver in a standard 1.2 V 0.13 mm CMOS technology", Proc. IEEE Eur. Solid-State Circuits Conf., pp. 303-306, September 2005.
32. B. Yang, E. Y. Chang, A. M. Niknejad, B. Nikolić, E. Alon, "A 65-nm CMOS \I/Q\$ RF power DAC with 24- to 42-dB third-harmonic cancellation and up to 18-dB mixed-signal filtering", IEEE J. Solid-State Circuits, vol. 53, no. 4, pp. 1127-1138, April 2018.
33. K. Onizuka, S. Saigusa, S. Otaka, "A +30.5 dBm CMOS Doherty power amplifier with reliability enhancement technique", Proc. IEEE Symp. VLSI Circuits, pp. 78-79, June 2012.
34. C. Lu et al., "A 24.7 dBm all-digital RF transmitter for multimode broadband applications in 40 nm CMOS", IEEE Int. Solid-State Circuits Conf. (ISSCC) Dig. Tech. Papers, pp. 332-333, February 2013.
35. D. H. Kwon, H. Li, Y. Chang, R. Tseng, Y. Chiu, "Digitally equalized CMOS transmitter front-end with integrated power amplifier", IEEE J. Solid-State Circuits, vol. 45, no. 8, pp. 1602-1614, August 2010.
36. C. Yu, L. Guan, E. Zhu, A. Zhu, "Band-limited Volterra series-based digital predistortion for wideband RF power amplifiers", IEEE Trans. Microw. Theory Techn., vol. 60, no. 12, pp. 4198-4208, December 2012.
37. V. Vorapipat, C. S. Levy, P. M. Asbeck, "Voltage mode Doherty power amplifier", IEEE J. Solid-State Circuits, vol. 52, no. 5, pp. 1295-1304, May 2017.
38. J. S. Park, Y. Wang, S. Pellerano, C. Hull, H. Wang, "A CMOS wideband current-mode digital polar power amplifier with built-in AM-PM distortion self-compensation", IEEE J. Solid-State Circuits, vol. 53, no. 2, pp. 340-356, February 2018.
39. D. Jung, J. Park, S. Li, T.-Y. Huang, H. Zhao, H. Wang, "A 1.2 V single supply hybrid current-/voltage-mode three-way digital Doherty PA with built-in large-signal phase compensation achieving less-than 5° AM-PM", Proc. IEEE Custom Integr. Circuits Conf. (CICC), pp. 1-4, April 2019.
40. Y. Yin, L. Xiong, Y. Zhu, B. Chen, H. Min, H. Xu, "A compact dual-band digital polar Doherty power amplifier using parallel-combining transformer", IEEE J. Solid-State Circuits, vol. 54, no. 6, pp. 1575-1585, June 2019.
41. J. S. Park, S. Hu, Y. Wang, H. Wang, "A highly linear dual-band mixed-mode polar power amplifier in CMOS with an ultra-compact output network", IEEE J. Solid-State Circuits, vol. 51, no. 8, pp. 1756-1770, August 2016.
42. Y. Yin et al., "A compact transformer-combined polar/quadrature reconfigurable digital power amplifier in 28-nm logic LP CMOS", IEEE J. Solid-State Circuits, vol. 54, no. 3, pp. 709-719, March 2019.
43. S. Hu, S. Kousai, J. S. Park, O. L. Chlieh, H. Wang, "Design of a transformer-based reconfigurable digital polar Doherty power amplifier fully integrated in bulk CMOS", IEEE J. Solid-State Circuits, vol. 50, no. 5, pp. 1094-1106, May 2015.
44. S.-W. Yoo, S.-C. Hung, S.-M. Yoo, "A watt-level quadrature class-G switched-capacitor power amplifier with linearization techniques", IEEE J. Solid-State Circuits, vol. 54, no. 5, pp. 1274-1287, May 2019.
45. D. Cousinard et al., "A 0.23 mm 2 digital power amplifier with hybrid time/amplitude control achieving 22.5 dBm at 28% PAE for 802.11g", IEEE Int. Solid-State Circuits Conf. (ISSCC) Dig. Tech. Papers, pp. 228-229, February 2017.
46. V. Vorapipat, C. Levy, P. Asbeck, "A class-G voltage-mode Doherty power amplifier", IEEE Int. Solid-State Circuits Conf. (ISSCC) Dig. Tech. Papers, pp. 46-47, February 2017.
47. S. Hu, S. Kousai, H. Wang, "A broadband CMOS digital power amplifier with hybrid Class-G Doherty efficiency enhancement", IEEE Int. Solid-State Circuits Conf. (ISSCC) Dig. Tech. Papers, pp. 44-45, February 2015.
48. K. Onizuka, S. Saigusa, S. Otaka, "A 1.8 GHz linear CMOS power amplifier with supply-path switching scheme for WCDMA/LTE applications", IEEE Int. Solid-State Circuits Conf. (ISSCC) Dig. Tech. Papers, pp. 90-91, February 2013.
49. P. Godoy, S. Chung, T. Barton, D. Perreault, J. Dawson, "A 2.4-GHz 27-dBm asymmetric multilevel outphasing power amplifier in 65-nm CMOS", IEEE J. Solid-State Circuits, vol. 47, no. 10, pp. 2372-2384, October 2012.
50. R. Bhat, J. Zhou, H. Krishnaswamy, "Wideband mixed-domain multi-tap finite-impulse response filtering of out-of-band noise floor in watt-class digital transmitters", IEEE J. Solid-State Circuits, vol. 52, no. 12, pp. 3405-3420, December 2017.
51. W. Tai et al., "A transformer-combined 31.5 dBm outphasing power amplifier in 45 nm LP CMOS with dynamic power control for back-off power efficiency enhancement", IEEE J. Solid-State Circuits, vol. 47, no. 7, pp. 1646-1658, July 2012.

What is claimed is:
1. A subharmonic switching digital power amplifier system comprising:
a power amplifier core that includes at least one power amplifier that receives an input signal and is operable in a power back-off region; and
a power supply providing at least one operating voltage to the power amplifier, wherein the power amplifier is toggled at a subharmonic component of a carrier frequency (Fc) to achieve at a power back-off mode wherein the power amplifier is operated in a voltage mode or a current mode driver.

2. The subharmonic switching digital power amplifier system of claim 1 wherein the subharmonic component has a frequency Fc/n where n is an integer.

3. The subharmonic switching digital power amplifier system of claim 1 wherein the subharmonic component has a frequency that is a fraction of the carrier frequency.

4. The subharmonic switching digital power amplifier system of claim 1 further comprising a matching network in electrical communication with the power amplifier, the matching network providing notch filtering of the subharmonic components.

5. The subharmonic switching digital power amplifier system of claim 1 wherein the power amplifier is operable to combine toggling at the subharmonic component of the carrier frequency (Fc) with supply power modulation, the power supply providing a plurality of operating voltages.

6. The subharmonic switching digital power amplifier system of claim 5 wherein the power supply is a dual power supply that provides a first voltage and a second voltage such that the power amplifier can be operated at either the first voltage or the second voltage.

7. The subharmonic switching digital power amplifier system of claim 1 wherein subharmonic switching is combined with at least one other efficiency enhancement techniques.

8. The subharmonic switching digital power amplifier system of claim 7 wherein the other efficiency enhancement techniques include a technique selected from the group consisting of Doherty power amplifier, load modulation and supply modulation class-G or envelope tracking to further improve power back-off efficiency.

9. The subharmonic switching digital power amplifier system of claim 1 wherein the at least one power amplifier is a CMOS power amplifier.

10. The subharmonic switching digital power amplifier system of claim 1 wherein the at least one power amplifier is a switched-capacitor RF power amplifier.

11. The subharmonic switching digital power amplifier system of claim 1 wherein the power amplifier core includes a plurality of power amplifiers.

12. The subharmonic switching digital power amplifier system of claim 11 wherein each power amplifier is toggled at a subharmonic component of a carrier frequency or the carrier frequency such that at least one power amplifier is toggled at the subharmonic component of the carrier frequency in the power backoff mode.

13. The subharmonic switching digital power amplifier system of claim 12 wherein the input signal is a digital signal.

14. The subharmonic switching digital power amplifier system of claim 10 further comprising a digital decoder block that generates control signals that include proper amplitude, phase, and supply-control codes according to a predetermined power back-off operation table, wherein the control signals are then properly retimed and phase-aligned for subharmonic switching operation.

15. The subharmonic switching digital power amplifier system of claim 14 wherein the subharmonic switching digital power amplifier system is a system-on-chip and a differential phase modulated (PM) signal is generated off-chip and passed through a CML-to-CMOS buffer.

16. The subharmonic switching digital power amplifier system of claim 12 further comprising a phase generator, wherein the phase generator creates a subharmonic PM signal and a delayed PM signal.

17. The subharmonic switching digital power amplifier system of claim 16 further comprising a phase detector and tunable delays are implemented to ensure that the subharmonic PM signal and the delayed PM signal are phase-aligned.

18. The subharmonic switching digital power amplifier system of claim 17 wherein a phase-control signal is retimed with the delayed PM signal to create a MUX control signal.

19. The subharmonic switching digital power amplifier system of claim 18 further comprising a high-speed MUX that selects a desired switching frequency based on the phase-control signal.

20. The subharmonic switching digital power amplifier system of claim 19 further comprising AND gates that combines a selected PM signal and a respective amplitude control code to provide an output that is connected to a segmented capacitor bank.

21. The subharmonic switching digital power amplifier system of claim 1 wherein a multiple subharmonic frequencies are used for creating corresponding multiple efficiency peaks at power back-off.

22. The subharmonic switching digital power amplifier system of claim 1 wherein the power amplifier core includes an array of power amplifiers with phases of digital input waveforms balanced in the power back-off region.

23. The subharmonic switching digital power amplifier system of claim 22 wherein phase interleaving is applied to cancel subharmonic components and thereby relax matching network requirements.

24. The subharmonic switching digital power amplifier system of claim 22 wherein each power amplifier is toggled at a subharmonic component of a carrier frequency or the carrier frequency wherein at least one power amplifier is toggled at the subharmonic component.

25. The subharmonic switching digital power amplifier system of claim 24 wherein the subharmonic component has a frequency Fc/n where n is an integer.

26. The subharmonic switching digital power amplifier system of claim 24 wherein the subharmonic component has a frequency that is a fraction of the carrier frequency.

27. The subharmonic switching digital power amplifier system of claim 1 wherein the power amplifier is a switching power amplifier selected from Class-D, current mode Class-D, Class-E, Class-E/F, and Class-G power amplifiers.

28. The subharmonic switching digital power amplifier system of claim 1 wherein the power amplifier can be implemented with a quadrature or out-phasing configuration to enhance average efficiency.

29. The subharmonic switching digital power amplifier system of claim 1 further comprising a plurality of power amplifiers and a power combiner to combine power from a plurality of power amplifiers while canceling subharmonic.

* * * * *